(12) United States Patent
Cooper-Roy et al.

(10) Patent No.: US 10,809,177 B2
(45) Date of Patent: Oct. 20, 2020

(54) CONTROLLING ALKALINE EARTH ATOMS FOR QUANTUM COMPUTING AND METROLOGY APPLICATIONS

(71) Applicant: California Institute of Technology, Pasadena, CA (US)

(72) Inventors: Alexandre Cooper-Roy, Downey, CA (US); Jacob P. Covey, Pasadena, CA (US); Ivaylo S. Madjarov, Pasadena, CA (US); Jason R. Williams, Pasadena, CA (US); Adam L. Shaw, Pasadena, CA (US); Vladimir Schkolnik, Pasadena, CA (US); Tai Hyun Yoon, Pasadena, CA (US); Manuel Endres, Pasadena, CA (US)

(73) Assignee: CALIFORNIA INSTITUTE OF TECHNOLOGY, Pasadena, CA (US)

( * ) Notice: Subject to any disclaimer, the term of this patent is extended or adjusted under 35 U.S.C. 154(b) by 0 days.

(21) Appl. No.: 16/601,099

(22) Filed: Oct. 14, 2019

(65) Prior Publication Data

US 2020/0116623 A1    Apr. 16, 2020

Related U.S. Application Data

(60) Provisional application No. 62/896,438, filed on Sep. 5, 2019, provisional application No. 62/889,371, filed on Aug. 20, 2019, provisional application No. 62/767,619, filed on Nov. 15, 2018, provisional application No. 62/745,198, filed on Oct. 12, 2018.

(51) Int. Cl.
*G01J 3/30* (2006.01)
*G01N 15/14* (2006.01)
*G01N 21/64* (2006.01)
*C09K 11/55* (2006.01)
*G06N 10/00* (2019.01)
*H03L 7/26* (2006.01)
*G04F 5/14* (2006.01)
*G02B 21/32* (2006.01)

(52) U.S. Cl.
CPC .......... *G01N 15/1434* (2013.01); *C09K 11/55* (2013.01); *G01N 21/6404* (2013.01); *G02B 21/32* (2013.01); *G04F 5/14* (2013.01); *G06N 10/00* (2019.01); *H03L 7/26* (2013.01)

(58) Field of Classification Search
CPC .......... G01N 15/1434; G01N 21/6404; C09K 11/55; G06N 10/00; H03L 7/26; G04F 5/14; G02B 21/32; G01J 3/30
See application file for complete search history.

(56) References Cited

U.S. PATENT DOCUMENTS

2019/0212766 A1*  7/2019  Monroe ................. B82Y 10/00

OTHER PUBLICATIONS

PCT International Search Report & Written Opinion dated Jun. 25, 2020 for PCT Application No. PCT/US2019/056101.

(Continued)

*Primary Examiner* — Abdullahi Nur
(74) *Attorney, Agent, or Firm* — Gates & Cooper LLP

(57) ABSTRACT

An apparatus for individually trapping atoms, individually imaging the atoms, and individually cooling the atoms to prevent loss of the atoms from the trap caused by the imaging. The apparatus can be implemented in various quantum computing, sensing, and metrology applications (e.g., in an atomic clock).

20 Claims, 30 Drawing Sheets

(56) References Cited

OTHER PUBLICATIONS

Parsons, M.F., et al., "Site-Resolved Imaging of Fermionic 6Li in an Optical Lattice", Physical Review Letters, May 2015, pp. 213002-1-213002-5, vol. 114, No. 21.
Fung, Y.H., et al., "Efficient collisional blockade loading of a single atom into a tight microtrap", New Journal of Physics, 2015, pp. 1-10, vol. 17, No. 9.
Baumgartner, A., "A new apparatus for trapping and manipulating single Strontium atoms", Department of Physics and Astronomy, University of Heidelberg, 2017, pp. 1-86.
Weiss, D.S., et al., "Quantum computing with neutral atoms", Physics Today, 2017, pp. 44-50, vol. 70, No. 7.
Cooper, A., et al., "Alkaline earth atoms in optical tweezers", Cornell University Library, 201 Olin Library Cornell University, Ithaca, NY, Oct. 2018, pp. 1-16.
Covey, J.P., et al., "2000-Thnes Repeated Imaging of Strontium Atoms in Clock-Magic Tweezer Arrays", Physical Review Letters, 2019, pp. 173201-1-173201-6, vol. 122.

\* cited by examiner

CONTROLLING ALKALINE EARTH ATOMS FOR QUANTUM COMPUTING AND METROLOGY APPLICATIONS

CROSS REFERENCE TO RELATED APPLICATIONS

This application claims the benefit under 35 U.S.C. Section 119(e) of commonly-assigned U.S. Provisional Patent Applications:

Ser. No. 62/745,198 filed on Oct. 12, 2018, entitled "Controlling Alkaline Earth Atoms In Tweezer Arrays For Quantum Computing Applications," by Manuel Endres, Alexandre Cooper-Roy, Jacob P. Covey, and Ivaylo S. Madjarov (CIT-8113-P);

Ser. No. 62/767,619 filed on Nov. 15, 2018, entitled "Controlling Alkaline Earth Atoms In Tweezer Arrays For Quantum Computing Applications," by Manuel Endres, Alexandre Cooper-Roy, Jacob P. Covey, and Ivaylo S. Madjarov (CIT-8113-P2);

Ser. No. 62/896,438 filed on Sep. 5, 2019, entitled "Controlling Alkaline Earth Atoms In Tweezer Arrays For Quantum Computing Applications," by Manuel Endres; Alexandre Cooper-Roy; Jacob P. Covey; Ivaylo S. Madjarov; Adam L. Shaw; Tai Hyun Yoon; Vladimir Schkolnik; Jason R. Williams (CIT-8113-P3);

Ser. No. 62/889,371 filed on Aug. 20, 2019, entitled "Controlling Alkaline-Earth Atoms In Tweezer Arrays For Quantum Metrology Applications," by Manuel Endres; Alexandre Cooper-Roy; Jacob P. Covey; Ivaylo S. Madjarov; Adam L. Shaw; Tai Hyun Yoon; Vladimir Schkolnik; Jason R. Williams (CIT-8333-P);

which applications are incorporated by reference herein.

STATEMENT REGARDING FEDERALLY SPONSORED RESEARCH AND DEVELOPMENT

This invention was made with government support under Grant No. PHY1733907 & PHY1753386 awarded by the National Science Foundation and under Grant No. FA9550-19-1-0044 awarded by the Air Force. The government has certain rights in the invention

BACKGROUND OF THE INVENTION

1. Field of the Invention

This invention relates to an apparatus for trapping, imaging, and manipulating atoms and methods of making and using the same.

2. Description of the Related Art (Note: This application references a number of different publications as indicated throughout the specification by one or more reference numbers within brackets, e.g., [x]. A list of these different publications ordered according to these reference numbers can be found below in the section entitled "References." Each of these publications is incorporated by reference herein.)

Optical tweezers and related optical micro-potential techniques (OTs) have matured into a powerful tool for quantum science experiments with individually controlled atoms, illustrated by a variety of recent results spanning quantum simulation with Rydberg atoms [1-3], entangling operations [4-7], bottom-up-assembly of Hubbard models [8, 9], and cavity QED implementations [10-12]. In these experiments, individual atoms are directly captured from laser-cooled clouds with tweezers or long-wavelength optical lattices [13-15]. Some of the more recent technical advances include, e.g., sideband cooling close to the motional ground state in tweezers [16,17], which has enabled experiments based on coherent collisions [7] and trapping in the vicinity of nanophotonic structures [10]. Further, the recently developed atom-by-atom assembly technique [18-23] provides means to generate defect-free arrays of currently up to ~60 atoms from initially stochastically loaded OTs [7, 8, 15, 24-26], which has led to the most recent Rydberg quantum simulation applications [1-3].

In terms of key characteristics, such as effective coherence times, scalability, and controllability, these experiments are now comparable with, and in many ways complementary to, other quantum science platforms with local control, e.g., quantum gas microscopes [27], ion traps [28, 29], or superconducting qubits [30]. An open question, however, is how distinct properties of non-alkali species can be harnessed for novel and improved implementations in combination with single-atom control via OTs. Of particular interest are alkaline earth(-like) atoms (AEAs), which offer important features, e.g., narrow and ultra-narrow optical transitions, which have already had a strong impact in various scientific fields, ranging from quantum metrology [31-33] and simulation [34-39] to novel approaches for atomic and molecular control [40, 41].

SUMMARY OF THE INVENTION

The present disclosure describes an apparatus for trapping, imaging, and cooling one or more atoms. The apparatus is embodied in many ways including, but not limited to, the following.

1. A laser emitting one or more first laser beams generating one or more trapping potentials; one or more atoms, wherein:

each of the trapping potentials trap a single one of the atoms, and each of the atoms have three energy levels including:
a first energy level;
a second energy level having an energy higher than the first energy level; and
a third energy level;

one or more second laser beams irradiating the one or more atoms so as to generate fluorescence from each of the atoms, wherein the second laser beams have a frequency and a polarization tuned to excite a first (e.g., optical) transition between the first energy level and the second energy level so that the fluorescence comprises spontaneous emission from the second energy level back to the first energy level.

a detector receiving the fluorescence so as to generate an image of each of the atoms from the fluorescence; and one or more third laser beams irradiating the one or more atoms so as to cool each of the atoms.

2. The apparatus of example 1,
a first objective focusing the first laser beams received from a laser source at one or more foci so as to generate each of the trapping potentials at each of the foci.

3. The apparatus of example 1, wherein:
the atoms comprise alkaline earth atoms or an alkaline earth like atom comprising two valence electrons in an s shell forming a spin singlet state,
the second energy level comprises 1 valence electron in an s shell 1 valence electron in a p shell, forming spin singlet state, and the third energy level comprises 1 valence electron in the s shell and 1 valence electron in the p shell, forming one of three spin triplet states.

In one example, in a ground state, the atoms each comprise two valence electrons in the first energy level comprising an s shell, forming a spin singlet state; in a first excited state, the atoms each comprise 1 valence electron in the first energy level comprising an s shell and 1 valence electron in the second energy level comprising a p shell, forming a spin singlet state, and in a second excited state, the atoms each comprise 1 valence electron in the first energy level comprising an s shell and 1 valence electron in the third energy level comprising a p shell, forming one of three spin triplet states.

4. The apparatus of examples 1-4, wherein the third laser beams have a wavelength tuned to induce a second (e.g, optical) transition between the first energy level and the third energy level, so as to laser cool the atoms by transfer the atoms into a lower energy motional state.

5. The apparatus of example 4, wherein the laser cooling comprises Sisyphus cooling or resolved sideband cooling.

6. The apparatus of example 4, wherein:
the third laser beam does not include or provide a magic trapping condition associated with the second (e.g., optical) transition, so that the trapping potential experienced by the atom in the first energy level is different from the trapping potential experienced by the atom in the third energy level, and
the atom is cooled using Sisyphus cooling.

7. The apparatus of example 6, wherein:
the trapping potential for the atom in the ground state (electron in the first energy level) is higher than the trapping potential for the atom in an excited state wherein an electron is in the third energy level,
the third laser beams are blue detuned (frequency greater than transition frequency of the non-trapped atom in free space), and
the cooling is repulsive Sisyphus cooling.

8. The apparatus of example 6, wherein:
the trapping potential for the atom in the ground state (electrons in the first energy level) is lower than the trapping potential for the atom in the excited state wherein an electron is in the third energy level,
the third laser beam is red detuned (the third laser beam has a frequency less than a transition frequency of the non-trapped atom in free space), and the cooling is attractive Sisyphus cooling.

9. The apparatus of example 4, wherein:
(1) the third laser beams are tuned to a magic trapping condition associated with the second (e.g., optical) transition, so that the trapping potential experienced by the atom in the ground state (electrons in the first level) is the same as the trapping potential experienced by the atom in the excited state wherein an electron is in the third energy level,
(2) the atoms further include a first set of motional energy levels indexed with an integer n for an electron in the first energy level and a second set of motional energy levels indexed with an integer m for an electron in the third energy level, the third laser beams exciting the atom from the nth state in the first energy level to the $m^{th}=(n-1)^{th}$ state in the third energy level, so that the atom decays by emitting spontaneous emission from the $m^{th}$ state to $(n-1)^{th}$ state in the first energy level,
(3) the step (2) is repeated (the third laser beams irradiating the atom) until the atom is in the $n=0^{th}$ motional state in the first energy level.

10. The apparatus of any of the preceding examples, further comprising an array of the first laser beams forming (e.g., optical) tweezers and/or array of the third laser beams (cooling beams) and/or array of the second laser beams (imaging beams), each of the tweezers trapping one of the atoms, each of the cooling beams cooling one of the atoms, and each of the imaging beams imaging one of the atoms.

11. The apparatus of any of the preceding examples, wherein the third laser beams include:
a laser beam propagating perpendicular to the first laser beam so as to cool the atom in a radial direction, and
a fifth laser beam propagating parallel to the first laser beam so as to cool the atom in a longitudinal direction.

12. The apparatus of any of the preceding examples, wherein:
each of the atoms have a fourth energy level higher than the first energy level and lower than the third energy level;
the first laser beam is tuned to have a wavelength that is magic for the first energy level and the fourth energy level but not for the third energy level, and
the cooling using the third laser beam is Sisyphus cooling.

13. The apparatus of example 12, wherein the fourth energy level is a clock state and transitions from the first energy level to the fourth energy level are used to create (e.g., optical) qubits in quantum computing configuration (ground state is first level, excited state is the clock state), and
the image using the fluorescence is used to read out the state of the qubit (and image/determine occupancy of trap).

14. The apparatus of any of the preceding examples, wherein:
each of the atoms have a fifth energy level higher than the first energy level and lower than the second energy level;
wherein electrons transfer to the fifth energy level after transition from the first energy level to the second energy level; and
the first laser beam has a frequency such that the atom comprising an electron in the fifth energy level experiences the trapping potential so that the atom can transfer an electron to the third energy level experiencing an anti trapping potential wherein the atom will transfer out of the (e.g., optical) trap or trapping potential.

15. The apparatus of any of the preceding examples, further comprising performing repeated imaging of the atom (at least 2000 imaging steps) showing long lifetimes of the atom under imaging conditions.

16. The apparatus of any of the preceding examples, comprising performing the imaging and cooling simultaneously or alternately, wherein the cooling ensures that atoms are not lost from the optical trap by the imaging process.

17. The apparatus of any of the preceding examples, further including the atoms each including a fourth energy level having an energy higher than the first energy level and an energy lower than the third energy level; and one or more fourth laser beams (e.g., clock laser beams outputted from a clock laser) tuned to excite a clock transition between the first energy level and the fourth energy level; a detector detecting the presence or absence of the fluorescence so as to generate a signal representing a presence or absence of each of the atoms in the ground state (electrons in first level) or in a clock state (an electron in the fourth level), imaging each atom individually; the detector detecting the signals at plurality of times:
(1) after the atoms are prepared in the ground state, so that absence of the fluorescence indicates the atom does not occupy the trap (first signal);

(2) after excitation from the first energy level to the second energy level using the clock laser beam red detuned from (having a frequency lower than) the clock transition, so that presence of the fluorescence indicates the atom is in an excited state wherein an electron is in the first energy level (second signal);

(3) after the atoms are prepared in the ground state after step (2), so that absence of the fluorescence indicates the atom does not occupy the trap (third signal);

(4) after excitation from the first level to the second level using the clock laser beam blue detuned from (having a frequency higher than) the clock transition, so that presence of the fluorescence indicates the atom is in the excited state wherein an electron is in the first energy level (fourth signal); and a computer/processor generating an error signal using the signals; and a modulator modulating the fourth laser beam with the error corrected frequencies so as to excite the clock transition between the first energy level and the fourth energy level using the fourth laser beams having the one or more error corrected frequencies.

18. The apparatus of example 17, comprising wherein generating the error signal comprises determining which of the traps are occupied; and for each of the occupied traps performing determining a first occupation number of the atom in the excited state wherein an electron is in the first energy level after excitation with the red detuned fourth laser beam, and determining a second occupation number of the atom in the excited state wherein an electron is in the first level after excitation with the blue detuned fourth laser beam, determining an error signal for each of the traps comprising a difference between the first occupation number and the second occupation number in each of the traps;

converting the error signals to one or more error corrected frequencies; and

19. The apparatus of example 18, wherein the computer averages the error signals from temporally and/or over each of the traps to obtain an average error signal used to generate the error corrected frequency comprising an average frequency.

20. The apparatus of embodiment 17, comprising the computer/processor generating an error signal using the signals, comprising:

determining which of the traps are occupied; and for each of the occupied traps:

assigning a first error if the signal after the red detuning is higher than the signal after the blue detuning, indicating the frequency of the fourth laser beam should be increased to resonantly excite the clock transition, assigning a second error if the signal after the red detuning is lower than the signal after the blue detuning, indicating the frequency of the fourth laser beam should be decreased to resonantly excite the clock transition, assigning a zero error if the signals after the red and blue detunings are the same, indicating the frequency of the fourth laser beam does not need to be corrected.

converting the error signals to one or more error corrected frequencies; and a modulator modulating the fourth laser beam with the error corrected frequencies so as to resonantly excite the clock transition between the first energy level and the fourth energy level using the fourth laser beams having the one or more error corrected frequencies.

21. The apparatus of examples 17-20, wherein an error signal is generated for each atom in the trap using imaging of each of the atoms, so that the frequency of the fourth laser beam exciting the clock transition is corrected for each atom.

22. The apparatus of examples 17-20, further comprising generating an average error signal comprising an average of the error signals for each atom, so that the frequency of the fourth laser beam exciting the clock transition is generated from the average error signal.

23. A spatially resolved sensor/diagnostic comprising the apparatus of examples 1-22.

The present disclosure further describes a method of trapping atoms. The method is embodied in many ways including, but not limited to, the following.

24. A method of trapping atoms, comprising:
   (a) trapping the atoms;
   (b) imaging the atoms; and
   (c) cooling the atoms, wherein the atoms are cooled to prevent loss of the atoms from the trap caused by the imaging.

25. The method of example 24, wherein the cooling counteracts a plurality of heating mechanisms.

26. The method of examples 24 or 25, wherein the imaging reads out occupancy of the atoms in the ground state without destroying (depopulating) a clock state (because the cooling does not affect the clock state (1-3 transition detuned from 1-4).

27. The apparatus or method of examples 1-26, wherein the (e.g., optical) trap comprises (e.g., optical) tweezers or an optical lattice or a laser trap.

The present disclosure further describes a computer implemented method. The method is embodied in many ways including, but not limited to, the following.

28. The method comprising numerically simulating the dynamics of a plurality of atoms whose evolution is described by the interaction between a laser field and the plurality atoms trapped in an array (trapped atoms), each of the atoms comprising at least two energy levels and wherein the interaction comprises a transition between the two energy levels excited by the laser field, comprising:

obtaining a noise spectrum of the laser field;

performing a numerical calculation of an error signal representing a detuning between a frequency of the laser field and a resonant frequency required to resonantly excite the transition, comprising solving Schrodinger's equation describing the trapped atoms interacting with the laser field; and calculating a response of the trapped atoms to the laser field as a function of time, wherein the response includes dynamics of the trapped atoms interacting with the laser field whose frequency is fluctuating in time.

29. The method of example 28, further comprising using the response to stabilize the frequency of coherent radiation (comprising the laser field) to the resonant frequency of the transition.

The present disclosure further describes an apparatus embodied in many ways including, but not limited to, the following.

30. An apparatus, comprising:

an array of physical systems (e.g., but not limited to, one or more impurities in a solid state material, atoms, electrons, or superconductors) each having a two level transition;

a source of coherent radiation exciting the transitions;

a detector measuring the excitation probability of each physical system in the array (wherein the excitation probability determines how well the coherent radiation is exciting or driving the transitions);

a computer converting the excitation probability to a detuning between a frequency of the coherent radiation and a resonance frequency of the transition;

a modulator providing feedback, comprising the detuning, to the coherent radiation so that the frequency of the coherent radiation is tuned to the resonance frequency for each of the physical systems in the array e.g., so that the oscillator is stabilized to transition.

31 A sensor comprising the apparatus of example 30.

32. The sensor of example 31 comprising a sensor of gravity.

33. A method of operating the apparatus or methods of examples 1-32, comprising varying an environment (e.g., but not limited to a magnetic field/environment, a polarization, a power, or a temperature) of the array of physical systems; and measuring the change in frequency of the laser so as to quantify the changing environment or the change in frequency against perturbation of the environment.

34. The method or apparatus of any of the preceding examples, wherein the laser beams comprise electromagnetic radiation having a variety of wavelengths.

In one example, we demonstrate single-shot imaging and narrow-line cooling of individual alkaline earth atoms in optical tweezers; specifically, strontium trapped in 515.2 nm light. Our approach enables high-fidelity detection of single atoms by imaging photons from the broad singlet transition while cooling on the narrow intercombination line, and we extend this technique to highly uniform two-dimensional tweezer arrays with 121 sites. Cooling during imaging is based on a previously unobserved narrow-line Sisyphus mechanism, which we predict to be applicable in a wide variety of experimental situations. Further, we demonstrate optically resolved sideband cooling of a single atom to near the motional ground state of a tweezer, which is tuned to a magic-trapping configuration achieved by elliptical polarization. Finally, we present calculations, in agreement with our experimental results, that predict a linear-polarization and polarization-independent magic crossing at 520(2) nm and 500.65(50) nm respectively. Our results pave the way for a wide range of novel experimental avenues based on individually controlled alkaline earth atoms in tweezers— from fundamental experiments in atomic physics to quantum computing, simulation, and metrology.

In another example, we demonstrate single-atom resolved imaging with a survival probability of 0.99932(8) and a fidelity of 0.99991(1), enabling us to perform repeated high-fidelity imaging of single atoms in tweezers thousands of times. We further observe lifetimes under laser cooling of more than seven minutes, an order of magnitude longer than in previous tweezer studies. Experiments are performed with strontium atoms in 813.4 tweezer arrays, which is at a magic wavelength for the clock transition. Tuning to this wavelength is enabled by off-magic Sisyphus cooling on the intercombination line, which lets us choose the tweezer wavelength almost arbitrarily. We find that a single not retro-reflected cooling beam in the radial direction is sufficient for mitigating recoil heating during imaging. Moreover, this cooling technique yields temperatures below 5 µK, as measured by release and recapture. Finally, we demonstrate clock-state resolved detection with average survival probability of 0.996(1) and average state detection fidelity of 0.981. Our work paves the way for atom-by-atom assembly of large defect-free arrays of alkaline-earth atoms, in which repeated interrogation of the clock transition is an imminent possibility.

Measuring time is central to all sciences. Currently, the most accurate and stable clocks are based on optical interrogation of either a single ion or an ensemble of neutral atoms confined in an optical lattice. In yet another example, we demonstrate a new optical clock system based on a trapped atomic array that is read out at the single particle level, merging many of the benefits of ion and lattice clocks as well as creating a bridge to recently developed techniques in quantum simulation and computing with neutral atoms. We use this approach for evaluation of single-site resolved frequency shifts and systematics, and for atom-by-atom statistical analysis and feedback control. The system also features strongly suppressed interaction shifts and short dead time, all in a comparatively simple experimental setup. This sets out a new pathway for advancing stationary and transportable clock systems and provides a novel starting point for entanglement-enhanced metrology and quantum clock networks as well as for single-atom based thermometry. The demonstrated techniques also enable applications in quantum computing and communication with individual neutral atoms requiring optical clock state control.

BRIEF DESCRIPTION OF THE DRAWINGS

Referring now to the drawings in which like reference numbers represent corresponding parts throughout.

where $p_s$ is the survival probability and N is the number of scattered photons, as a function of detuning of the cooling light. A narrow regime of cooling to the red detuned side is interpreted as sideband cooling, while a much broader regime to the blue detuned side is interpreted as Sisyphus cooling. Both regimes achieve the same optimal value of $\chi$. (d) $\chi$ as a function of estimated scattering rate for a fixed imaging time of 200 ms. Data shown is for a 1.4 mK trap under Sisyphus cooling. Below 60 kHz, $\chi$ approaches a constant minimum value, indicating that losses are dominated by depopulation (white region) and not heating. As the scattering rate increases beyond 60 kHz, cooling can no longer mitigate heating losses (red region). Inset: $\chi$ versus imaging time, taken at the scattering rate indicated by an arrow (~27 kHz). $\chi$ stays roughly constant even at very long times.

Figure 3:
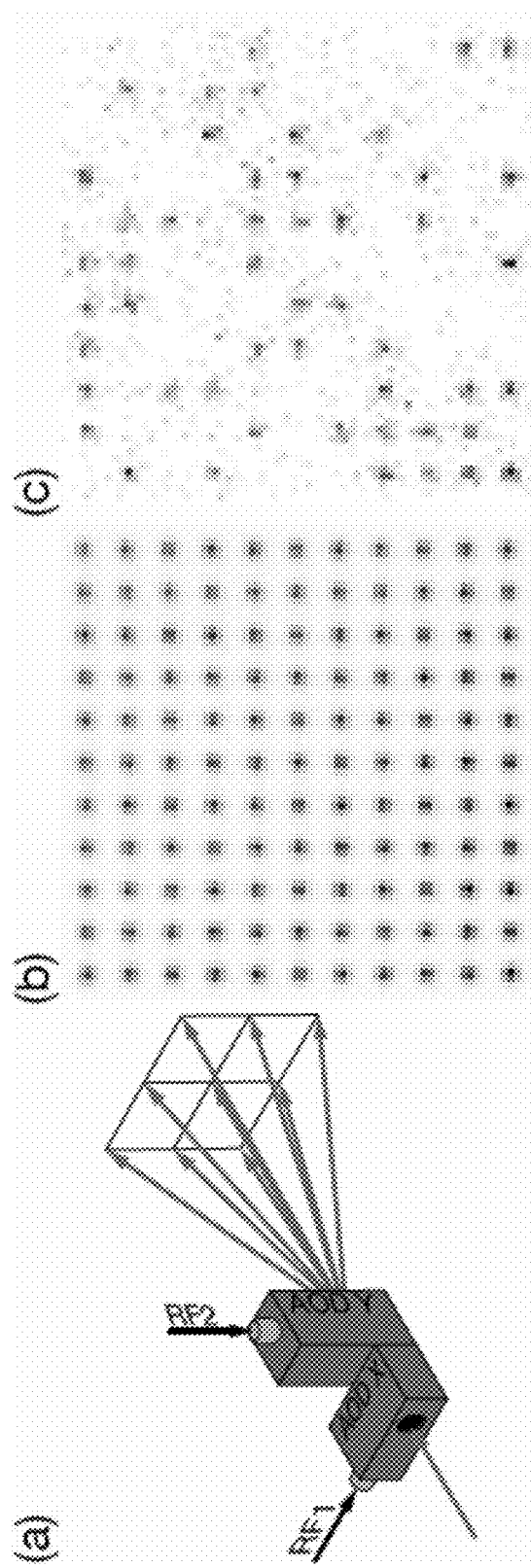
Figure 3:
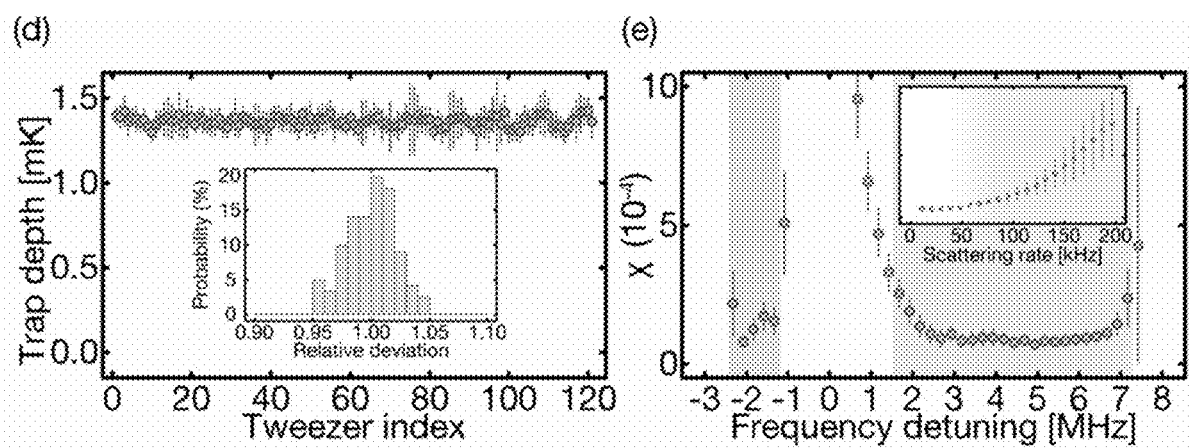

FIG. 3: Tweezer arrays. (a) We create a two-dimensional arrays of tweezers with two perpendicular acousto-optic deflectors (AODs). A 4f-telescope (not shown) maps the light between the two AODs. Each AOD is driven by a polychromatic RF waveform with tones uniformly spaced in frequency. (b) Average fluorescence image (of 6000 experimental runs) of single strontium atoms in a square array of 11×11 tweezers. The interatomic distance is ~9 μm. (c) Single-shot image of single strontium atoms in a square array of 11×11 tweezers. The filling fraction is close to 0.5. (d) Trap depth for all 121 tweezers, as measured by spectroscopy on the $^1S_0 \leftrightarrow ^3P_1|\phi_C\rangle$ transition. Inset: a histogram of trap depths across the array. The standard deviation of relative trap depths is 2%, demonstrating homogeneity. (e) The loss coefficient $\chi$ as a function of cooling frequency, averaged over an 11×11 linearly polarized array. Features are similar to those seen in a single magic tweezer, but pushed further away from the free-space resonance due to larger differential polarizability in linear light. Inset: $\chi$ versus blue scattering rate under Sisyphus cooling, averaged over the array.

Figure 4:
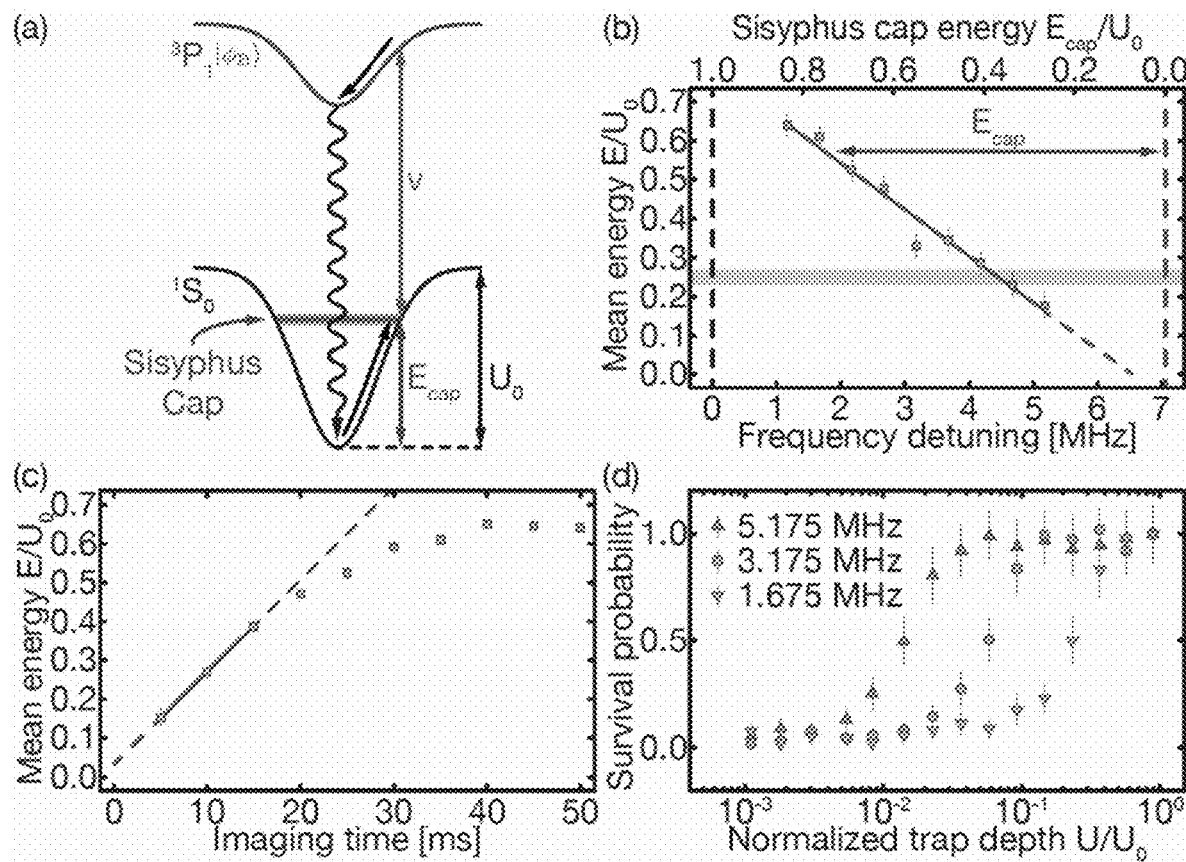

FIG. 4: Sisyphus cooling. (a) Diagram illustrating the mechanism of Sisyphus cooling on the $^1S_0 \leftrightarrow ^3P_1|\phi_B\rangle$ transition in the regime where the excited state is less trapped than the ground state. The red cooling beam at frequency ν is blue-detuned away from free-space resonance, effectively creating a resonance condition for ground state atoms with energy $E_{cap}$. During fluorescence imaging, atoms are heated up until their energy reaches the Sisyphus cap, at which point they are excited and preferentially decay back to the ground state with lower motional energy. (b) Mean equilibrium energy of the atom after fluorescence imaging, as a function of the Sisyphus detuning. The solid line is a linear fit to the experimental data. The shaded region represents the equilibrium energy after fluorescence imaging with sideband cooling instead of Sisyphus cooling. (c) Mean equilibrium energy of the atom versus imaging time for a Sisyphus detuning of 1.2 MHz. The energy initially increases linearly (solid line, t≤15 ms) and later saturates. (d) Survival probability versus normalized final trap depth after adiabatically ramping down the trap depth, for various Sisyphus cap energies (App. VI).

Figure 5:
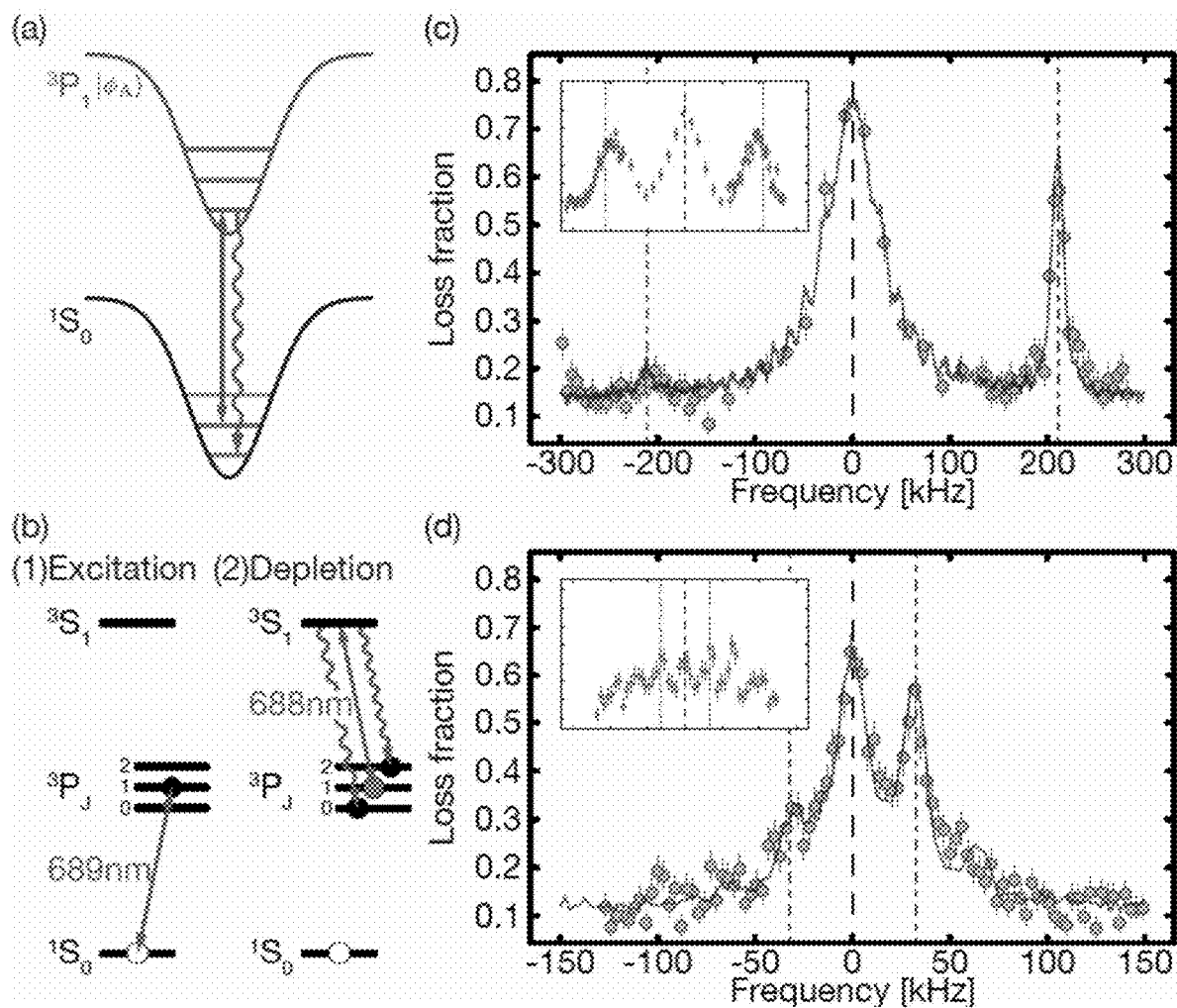

FIG. 5: Sideband cooling. (a) Diagram of the approach to resolved sideband cooling on the magic-tuned $^1S_0 \leftrightarrow ^3P_1|\phi_A\rangle$ transition. Optical excitation of the red sideband is spectrally resolved, and the subsequent decay conserves the motional quanta with high probability. (b) Measurement protocol for sideband spectra. Atoms in the $^1S_0$ ground state are excited (solid double arrow) to the $^3P_1$ excited state by an excitation pulse at 689 nm. Atoms in the $^3P_1$ excited state are then excited (solid double arrow) to the $^3S_1$ state by a depletion pulse at 688 nm, where they radiatively decay to the $^3P_0$ and $^3P_2$ metastable dark states. (c) Radial sideband spectrum before (inset) and after sideband cooling. Overlayed is a simulated spectrum with 0.80 ground state fraction (solid gray line). Bumps visible in the simulated spectrum are Fourier peaks due to the finite 74 μs excitation pulse. The first radial sidebands are separated from the carrier frequency by 211(4) kHz. The amplitude of the red sideband is highly suppressed after cooling, as is the width of the blue sideband—both indicating larger ground state fraction. (d) Axial sideband spectrum before (inset) and after the second stage of axial cooling. Overlayed is a simulated spectrum with 0.50 ground state fraction (solid gray line). The first axial sidebands are separated from the carrier frequency by 32.2 (8) kHz. Suppression of the red sideband and enhancement of the carrier both indicate larger ground state fraction.

Figure 6:
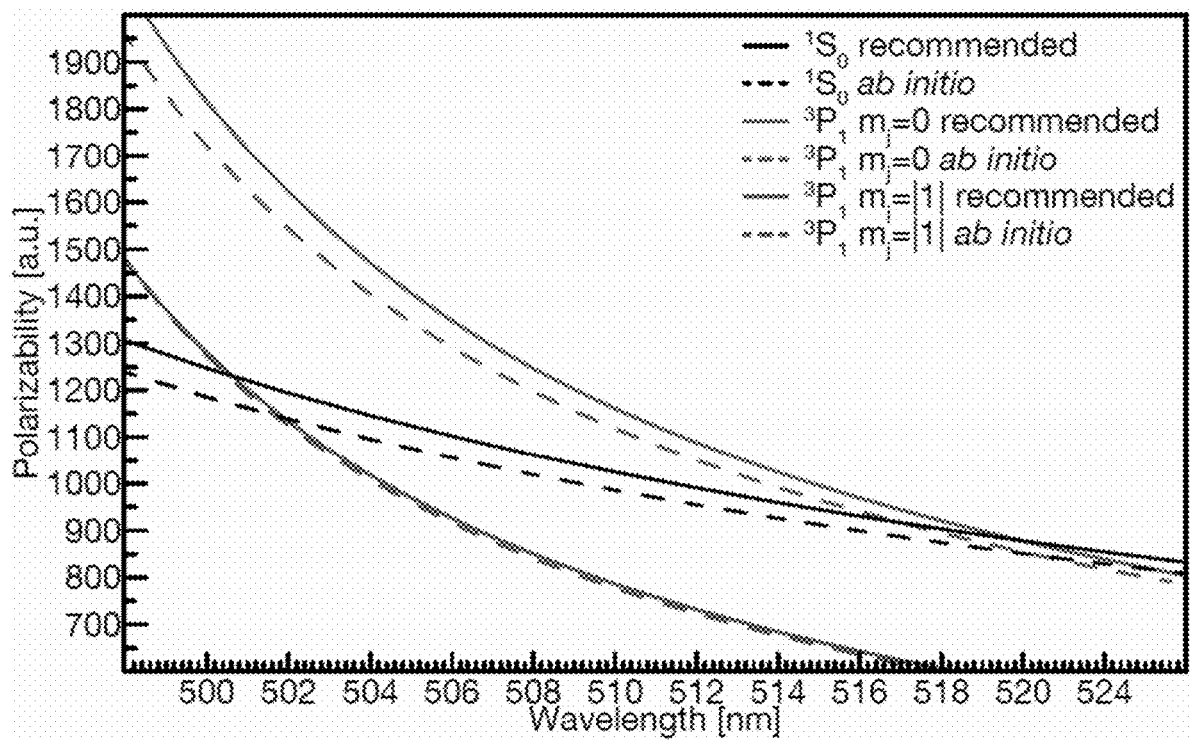

FIG. 6: Polarizabilities of the $5s^2\ ^1S_0$ and $5s5p\ ^3P_1$ states for Sr at linear trap polarization. Calculations with both ab initio (dashed lines) and recommended (solid lines) values predict the same magic wavelength at 520(2) nm for the $^1S_0 \leftrightarrow ^3P_1|m_j=0\rangle$ transition with $\alpha=880(25)$ a. u. Calculations with recommended values predict another magic wavelength at λ=500.65(50) nm for the $^1S_0 \leftrightarrow ^3P_1|m_j=\pm 1\rangle$ transition with $\alpha=1230(13)$ a. u. We note that this latter crossing is valid even for elliptical trap polarizations, as it pertains to an excited sublevel with polarization-insensitive polarizability.

Figure 7:
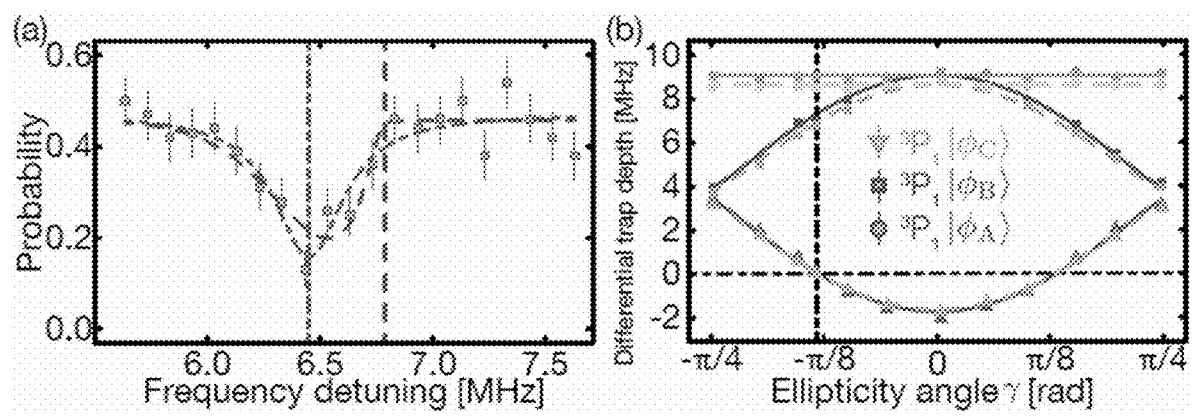

FIG. 7: Differential trap depth spectroscopy. (a) Spectroscopy signal measured on the $^1S_0 \leftrightarrow ^3P_1|\phi_B\rangle$ transition for the non-magic ellipticity angle γ=28°. The signal is fitted to a purely thermally broadened line shape (blue dashed curve) and to a purely power broadened line shape (red dash-dot curve). The vertical lines indicate the position of the edge frequency (blue dashed line) and center frequency (red dash-dot line). We expect the true rescaled differential trap depth to lie between these two values as a combination of power and thermal broadening determines the true lineshape. (b) Differential trap depth measured on the three $^1S_0 \leftrightarrow ^3P_1$ transitions for various ellipticity angles assuming a thermally broadened line shape (dark markers) and a power broadened line shape (light markers). The measured values are simultaneously fitted to the analytical solution of the eigenvalues of the Stark Hamiltonian with three free parameters. At the magic ellipticity angle |γ|=24° (black dash-dot line), the differential trap depth on the $^1S_0 \leftrightarrow ^3P_1|\phi_A\rangle$ transition vanishes.

Figure 8:
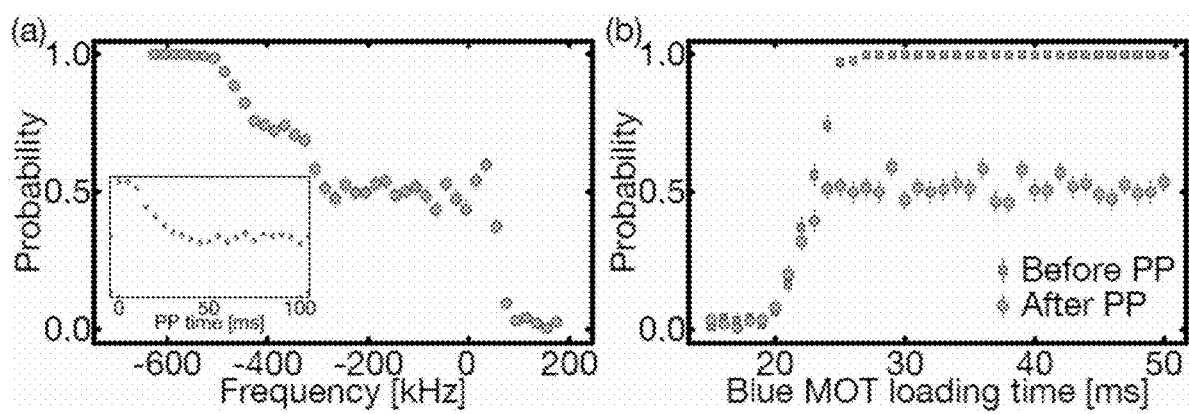

FIG. 8: Preparing single atoms via parity projection. (a) The probability of detecting an occupied tweezer after a parity projection (PP) pulse of 60 ms varies with the detuning of the addressing frequency. The highest step on the left corresponds to the situation when the PP pulse is detuned away from any atomic or molecular resonance, such that many atoms remain in the trap. The lowest step on the right corresponds to the heating on blue detuned motional sidebands, which expels atoms out of the trap. The plateau in the middle corresponds to the PP region where the occupation probability is 0.5. Inset: The probability of detecting an occupied tweezer monotonically decreases and saturates to 0.5 as the duration of the PP pulse increases. (b) As the blue MOT loading time increases, the initial number of atoms in the tweezer increases, such that the probability of detecting an occupied tweezer approaches 1.0 before PP (blue squares), but saturates to 0.5 after a PP pulse (red circles). The frequency detuning from free-space resonance here is −226 kHz.

Figure 9:
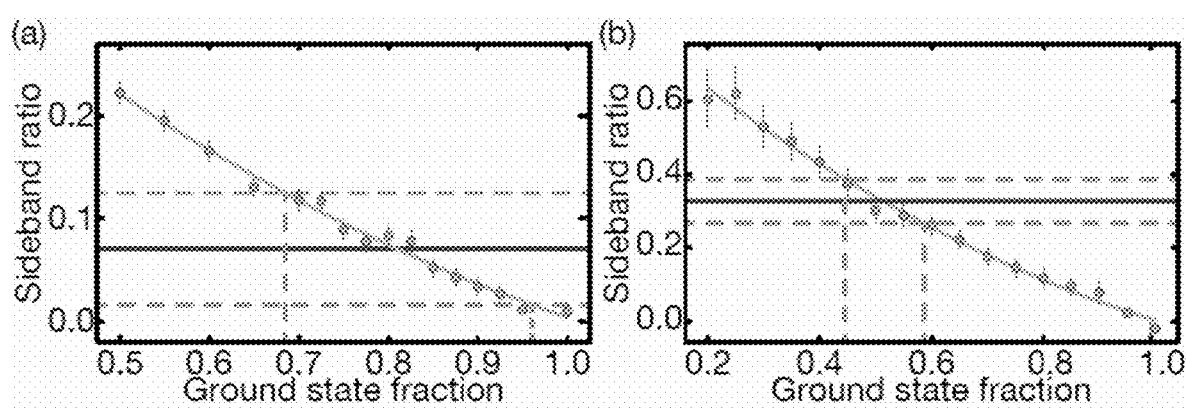

FIG. 9: Sideband thermometry. (a-b) Ratio of red to blue sideband amplitude as a function of ground state fraction, obtained via fitting simulated spectra for the (a) radial and (b) axial spectra. The dependence on ground state fraction is fitted to a quadratic function (red curve). The solid blue line is the fitted sideband ratio for our experimental data, with dashed lines representing a 1σ confidence interval. We quote a range of consistent ground state fractions where this confidence interval intersects the fitted quadratic function.

Figure 10:
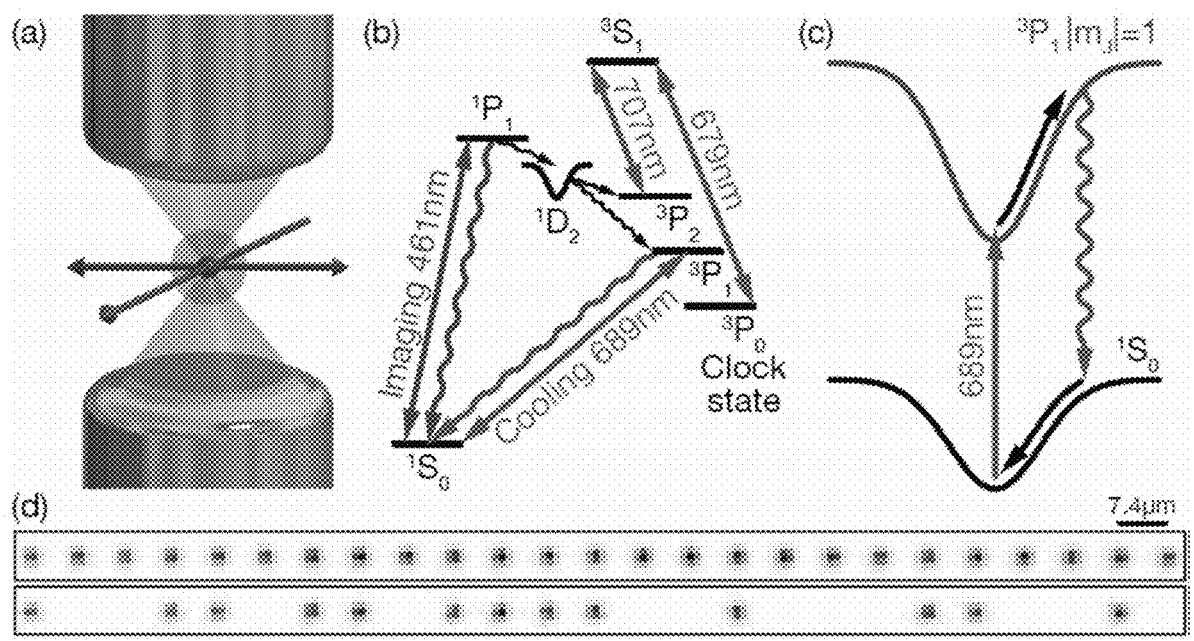

FIG. 10: Low-loss imaging scheme for $^{88}$Sr. (a) Our single atom imaging scheme requires only a single not retro-reflected cooling beam at 689 nm for narrow-line Sisyphus cooling (red single arrow) to compensate recoil heating from fluorescence generated by exciting atoms with a single retro-reflected 461 nm beam (blue double arrow). Microscope objectives with NA=0.5 are used to generate 813.4 nm tweezers and to collect the fluorescence light. (b) Previous studies found an imaging loss channel via the decay of $^1P_1$ to $^1D_2$ with a branching ratio of ~1:20000, where atoms left the tweezers since $^1D_2$ was strongly anti-trapped [21, 22]. Crucially, the $^1D_2$ state is now trapped in 813.4 nm and our results show that atoms are recovered into the $^3P_J$ manifold with very high probability. Two lasers (679 nm and 707 nm) repump atoms to $^3P_1$, which decays back into the ground state, thus closing the $^1D_2$ loss channel. (c) We use narrow-line attractive Sisyphus cooling on the $m_J=\pm 1$ states [23], originally proposed in Refs. [24, 25]. This mechanism is based on the excited state being more strongly trapped than the ground state (in contrast to repulsive Sisyphus cooling demonstrated herein by us [21]). Atoms at the bottom of the trap are excited and have to climb up a steeper potential than they would in the ground state, leading to an average reduction in energy after spontaneous emission. Cooling results from the trapping potential mismatch, and not from photon recoil, thus requiring only a single cooling beam. (d) Average image (top) and single-shot image (bottom) of atomic fluorescence from twenty-five uniformized tweezers with an imaging time of one second.

Figure 11:
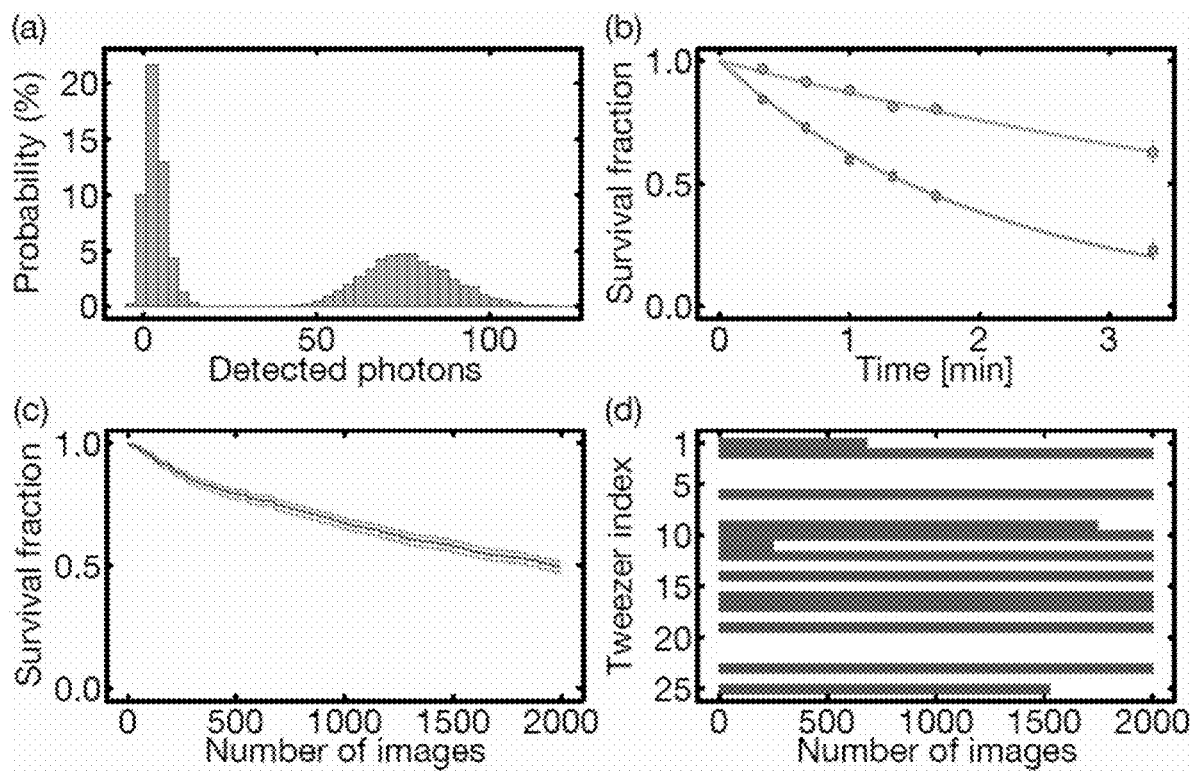

FIG. 11: Low-loss high-fidelity imaging. (a) Histogram of fluorescence counts from a single representative tweezer. We find a detection fidelity of 0.99991(1) and an average survival probability of 0.99932(8), demonstrating simultaneous high-fidelity and low-loss imaging. Results are for an imaging time of t=50 ms under simultaneous repumping and Sisyphus cooling. (b) The survival fraction as a function of hold time in minutes under these imaging conditions (blue squares and fitted line). Importantly, we find a lifetime of τ=126(3) s, while only needing t≲50 ms imaging time for reaching high detection fidelity, leading to small loss fractions consistent with exp(−t/τ). Moreover, we find a lifetime of 434(13) s under Sisyphus cooling alone (without 461 nm) demonstrating a vacuum-limited lifetime greater than seven minutes (red circles and fitted line). (c) Survival fraction versus image number for 2000 repeated images. The dark red line represents the mean over 40 realizations, with the lighter red lines showing the standard error of the mean.

Atoms are imaged with high fidelity for 50 ms followed by a 29 ms cooling block. (d) A representative realization of atom detection over the course of the 2000 images. Detected atoms are plotted in red versus the image number, where the rows represent the 25 tweezers. Note that we find no occurrences of atoms returning after they are lost.

Figure 12:
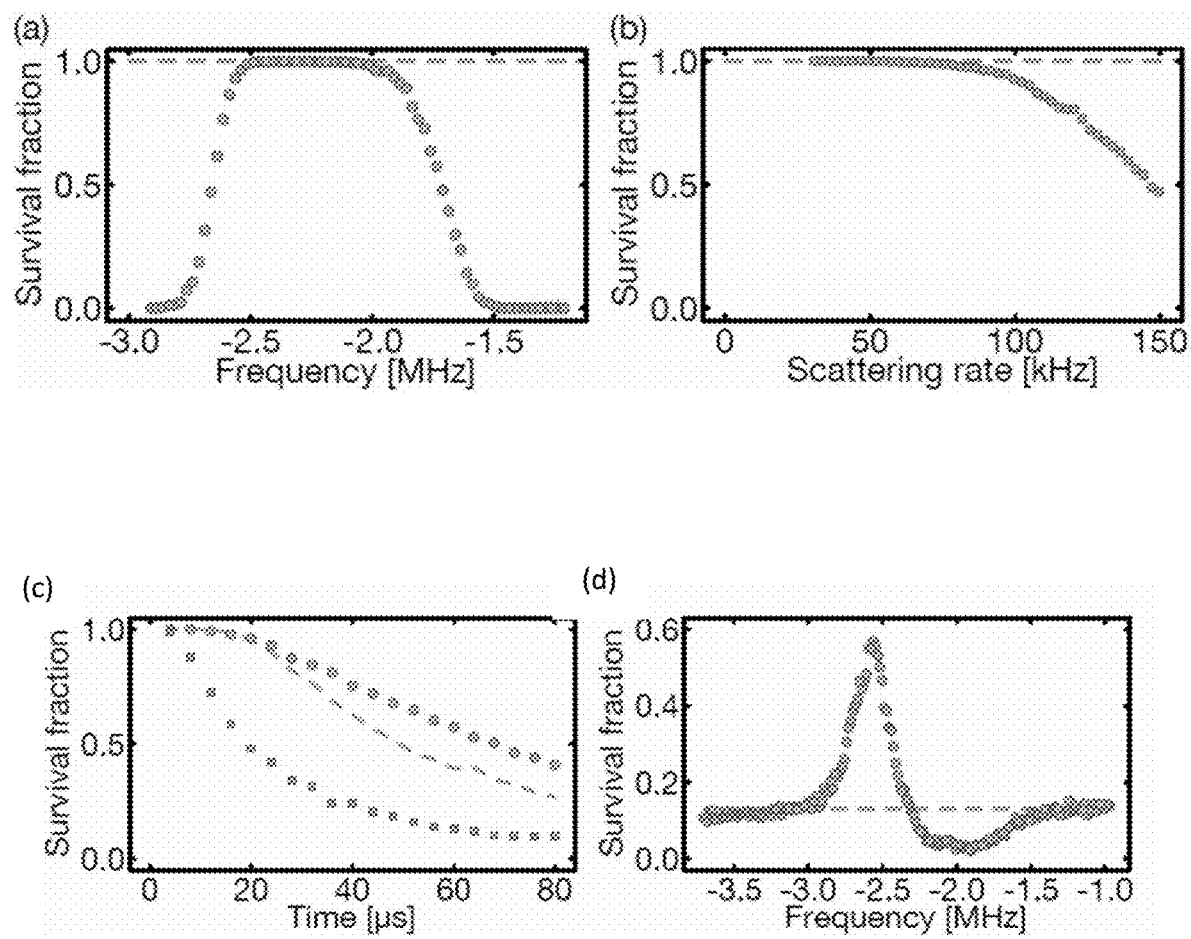

FIG. 12: Sisyphus cooling during imaging. FIG. 12(a): survival probability versus detuning with respect to free space resonance of the 689 nm cooling beam. FIG. 12(b): Survival of the fraction of atoms versus scattering rate from the 461 nm imaging beam under simultaneous repumping and Sisyphus cooling for an imaging time of 50 ms. Sisyphus cooling to low temperatures (c) The survival fraction in an array in a release-and-recapture measurement performed by diabatically turning off the traps for a variable time followed by a sudden switch-on [37]. We show data after imaging (blue squares) and after adding a dedicated cooling block with Sisyphus cooling alone (red circles). Results are compared with classical Monte-Carlo simulations for a three-dimensional thermal distribution at 5 μK (dashed line). Note that the release-and-recapture method is mostly sensitive to the energy distribution in the radial direction. (d) Survival fraction in an array after release-and-recapture for 60 μs off-time versus the red frequency during Sisyphus cooling for 25 ms with an intensity of $I/I_s \approx 200$. The dashed line represents the case without a dedicated cooling block. We find that atoms are cooled for appropriately chosen red detunings, and heated for detunings further to the blue. This is consistent with an understanding of Sisyphus cooling as an attractor in energy space [24, 25]. Data in (a) is at −2.6 MHz detuning.

Figure 13:
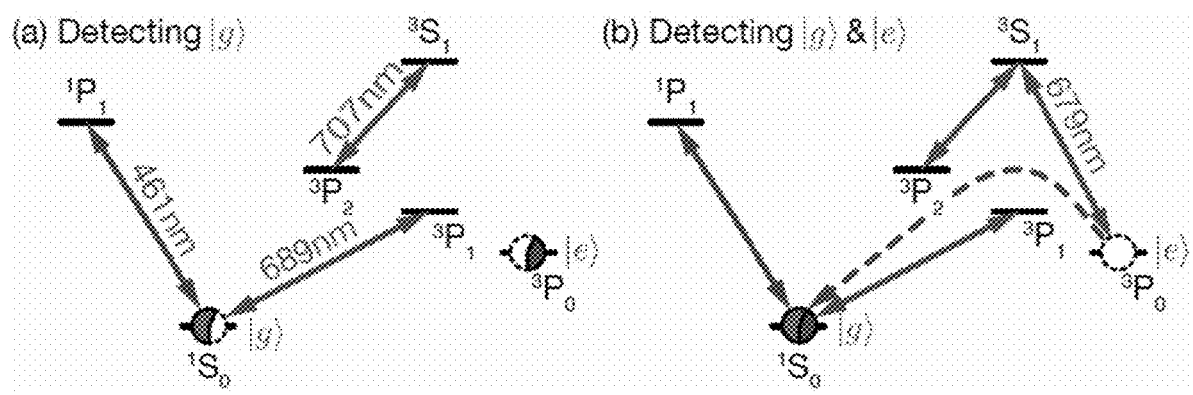

FIG. 13: Low-loss state-resolved detection. (a) A statistical mixture of optical clock qubit states is represented as a circle, where the green section at $^1S_0 \equiv |g\rangle$ represents the population in $|g\rangle$ and the purple section at $^3P_0 \equiv |e\rangle$ represents the population in $|e\rangle$. To measure the population in $|g\rangle$, we image without the 679 nm repumper during which $|e\rangle$ remains dark. The accuracy of measuring the population in $|g\rangle$ is limited both by off-resonant scattering of the tweezer light which pumps $|e\rangle$ back to $|g\rangle$, and by pathways that pump $|g\rangle$ to $|e\rangle$ such as the $^1D_2$ decay channel and the off-resonant scattering from $^3P_1$ during cooling. As a result, the average state detection fidelity is 0.981(1). (b) We perform a second image that includes the 679 nm repumper, which pumps $|e\rangle$ to $|g\rangle$ via the $^3S_1$ state and the 707 nm repumper, such that both states are detected. The pumping process is illustrated by the purple arrow. This image measures the population in $|g\rangle$ and $|e\rangle$, and informs whether the atom has been lost as a result of the first image. We find that the average survival probability of this double-imaging sequence is 0.996(1).

Figure 14:
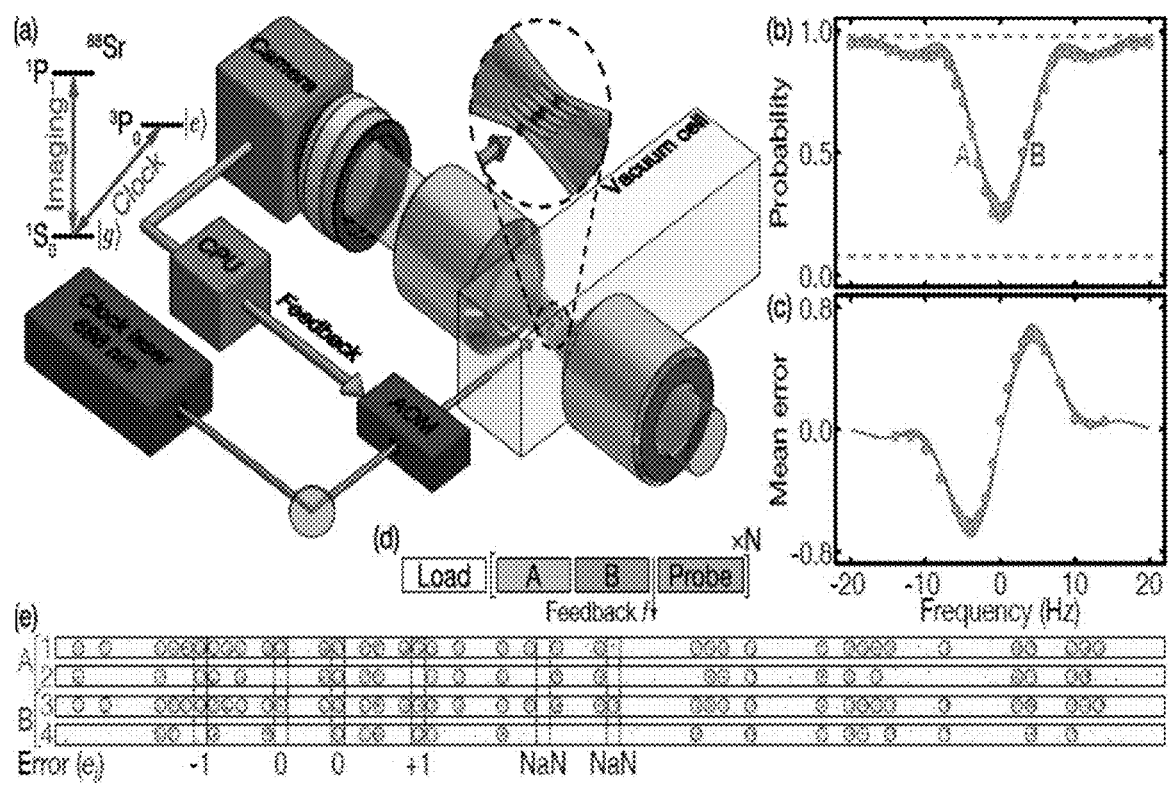

FIG. 14. Atomic array optical clock. (A) We interrogate ≈40 $^{88}$Sr atoms, trapped in an 81-site tweezer array, on the ultra-narrow clock transition at 698 nm and use high-resolution fluorescence imaging at 461 nm to detect population changes in the clock states (labeled $|g\rangle$ and $|e\rangle$) with single-atom resolution. This information is processed by a central processing unit (CPU) and a feedback signal is applied to the clock laser frequency using an acousto-optic modulator (AOM). (B) Tweezer-averaged probability to remain in $|g\rangle$ as a function of frequency offset measured with an in-loop probe sequence (circles). Dashed horizontal lines indicate state-resolved detection fidelities [32]. To generate an error signal, we interrogate twice: once below (A) and once above (B) resonance. (C) Tweezer-averaged error signal as a function of frequency offset (circles). The shaded area in B and C shows results from MC simulations.

(D) Simplified experimental sequence, consisting of tweezer loading and N-times-repeated AB feedback blocks followed by an optional probe block, with N=10 throughout. (E) To detect the clock state population in block A, we take a first image before interrogation to identify which tweezers are occupied and a second image after interrogation to detect which atoms remain in $|g\rangle$ (images 1 and 2). The same procedure is repeated for block B (images 3 and 4). We show fluorescence images with identified atoms (circles) [32] and examples of single tweezer error signals $e_j$.

Figure 15:
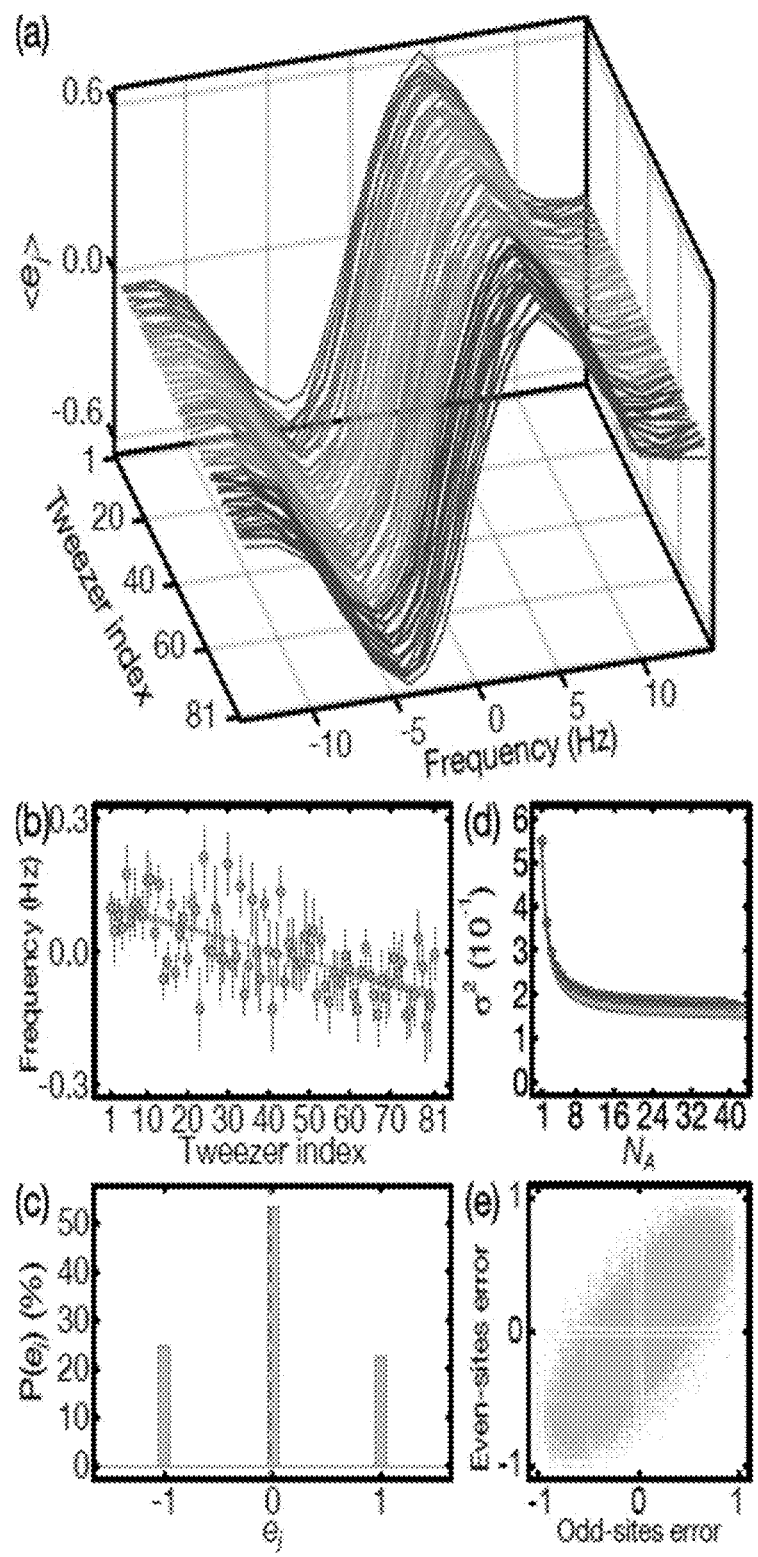

FIG. 15: Site-resolved error signal. (A) Repetition-averaged single-tweezer error signal $\langle e_j \rangle$ as a function of frequency offset measured with an in-loop sequence. (B) Fitted zero-crossings as a function of tweezer index for our usual interrogation trap depth of $U_1=245(31)E_r$, where $E_r=h\times 3.43$ kHz (circles). Solid lines correspond to theory predictions, with the shaded area resulting from systematic uncertainty in trap depth [32]. (C) Ternary probability distribution for $e_j$ for a selected tweezer. The vertical dashed line shows the mean. (D) Variance of the error signal as a function of atom number, calculated through post-selection. Solid line is a fit with a $1/N_A$ function plus an offset. Purple region is a MC simulation. (E) Plot of correlations between the error signals of even and odd sites.

Figure 16:
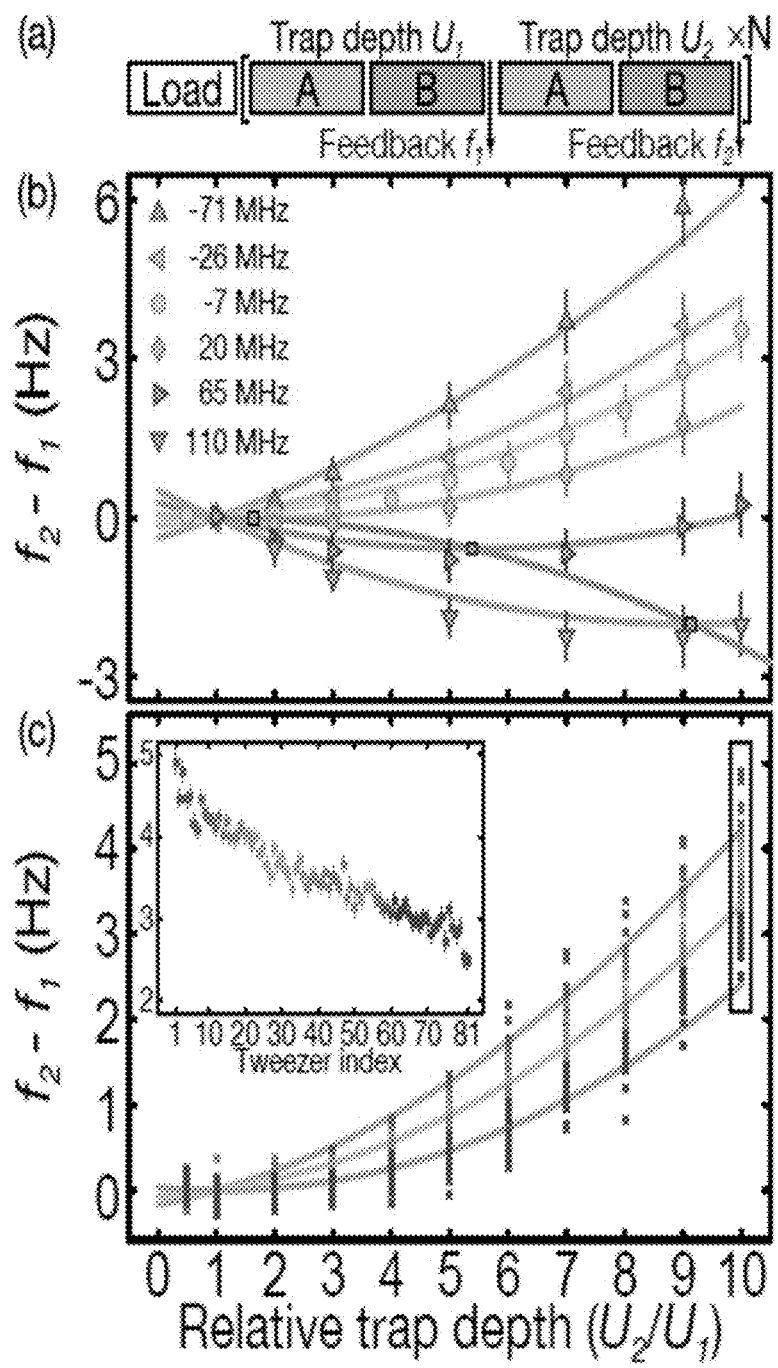

FIG. 16: Operational magic tuning and site-resolved systematics. (A) Illustration of interleaved self-comparison, where two independent AOM frequencies ($f_1$ and $f_2$) are updated in an alternating fashion. Respective interrogation blocks are set to two independent tweezer depths $U_1$ and $U_2$. (B) Average frequency difference $f_2-f_1$ as function of $U_2/U_1$, with $U_1$ fixed to our usual interrogation depth, for multiple frequency offsets of the trapping laser (see legend for color coding). We fit the data with a model for light shifts in optical tweezers (colored lines) with only a single free parameter (for all data simultaneously), accounting for an unknown frequency offset [32]. Operational magic intensities are found at the minima of these curves (gray squares and connecting line). The trap laser frequency is tuned such that the minimum coincides with our nominal depth. (C) Combining this technique with the single-tweezer resolved error $\langle e_j \rangle$, we can extract a frequency dependence with trap depth for each tweezer (colored squares). Solid lines show the expected dependence for the outermost and central tweezers. The data corresponds to the −7 MHz set in B. Inset: Local frequency shifts for $U_2/U_1=10$. The color coding of the inset defines the color coding of its containing sub-figure.

Figure 17:
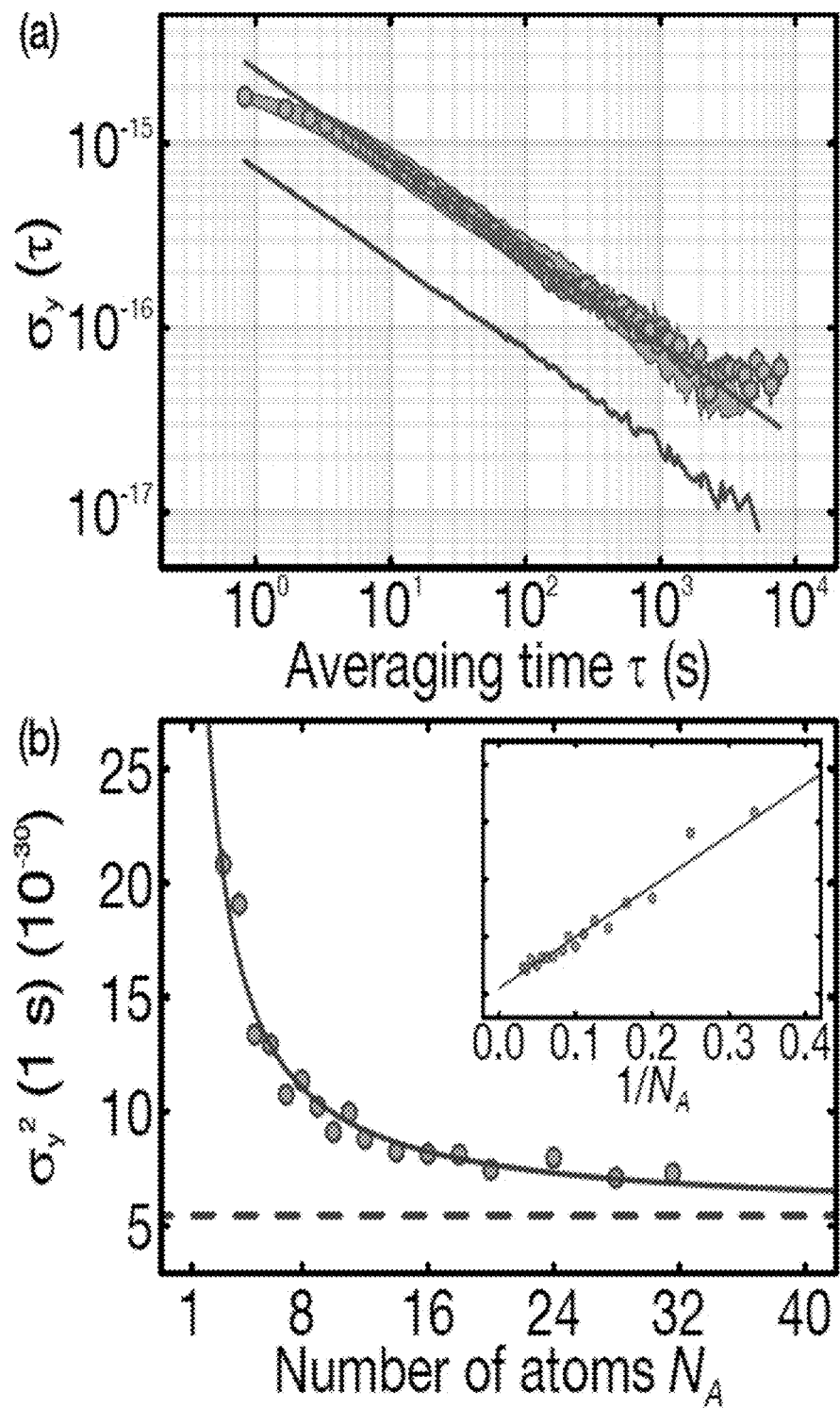

FIG. 17: Stability results. (A) Fractional Allan deviation $\sigma_y$ obtained via self-comparison as a function of integration time $\tau$ (circles). Fitting a $1/\sqrt{\tau}$ behavior past an initial lock onset time (red solid line), we find $2.5\times10^{-15}/\sqrt{\tau}$. The shaded area denotes MC results. The purple solid line shows the quantum projection noise limit obtained from MC by switching off all other noise sources. (B) Based on atom-by-atom feedback control, we perform a series of self-comparisons with fixed atom number $N_A$. Shown is the Allan variance $\sigma_y^2$ at one second (from a $1/\sqrt{\tau}$ fit) as a function of $N_A$. Inset: Allan variance $\sigma_y^2$ as a function of $1/N_A$. Solid lines show a fit with a functional form $\sigma_y^2 = \sigma_\infty^2 + \sigma_{N_A}^2$, where $\sigma_{N_A}$ scales as $1/\sqrt{N_A}$.

Figure 18:
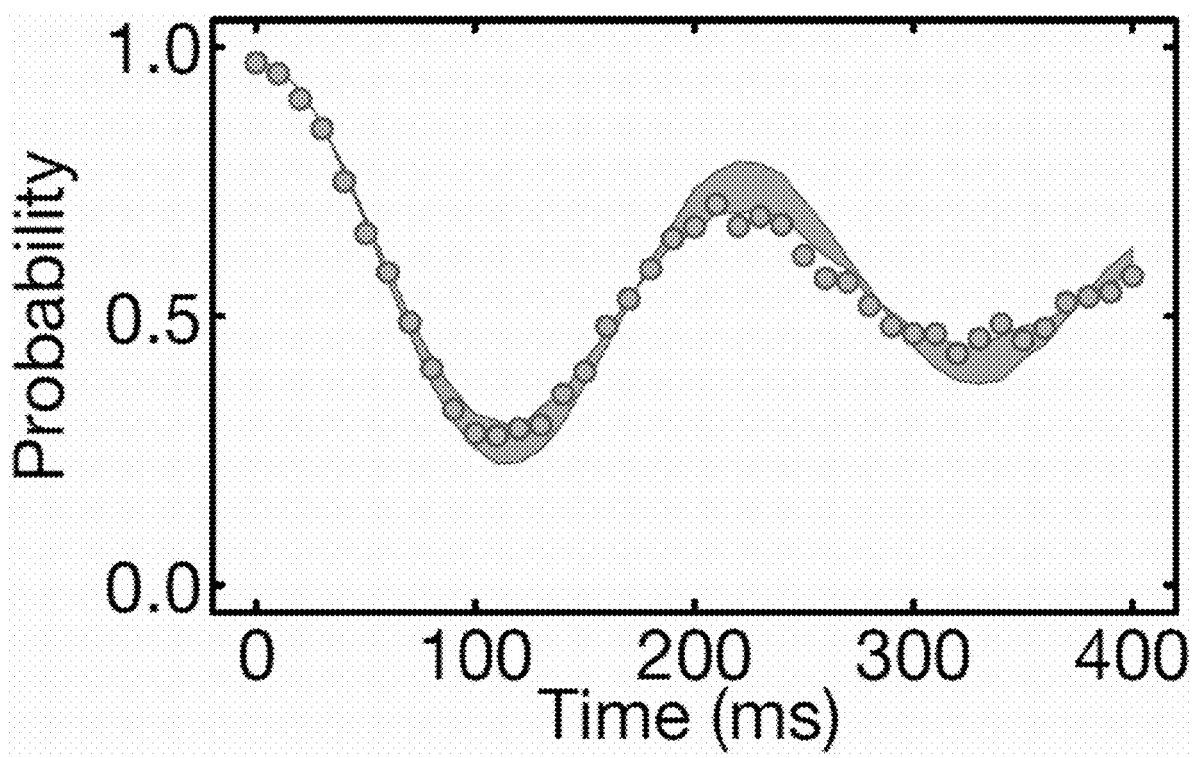

FIG. 18: Rabi oscillations on the clock transition. Rabi oscillations on the clock transition with π-pulse length of 110 ms. Each point is probed directly after stabilizing the clock laser with a feedback sequence as described in the main text. The shaded area denotes Monte Carlo results.

Figure 19:
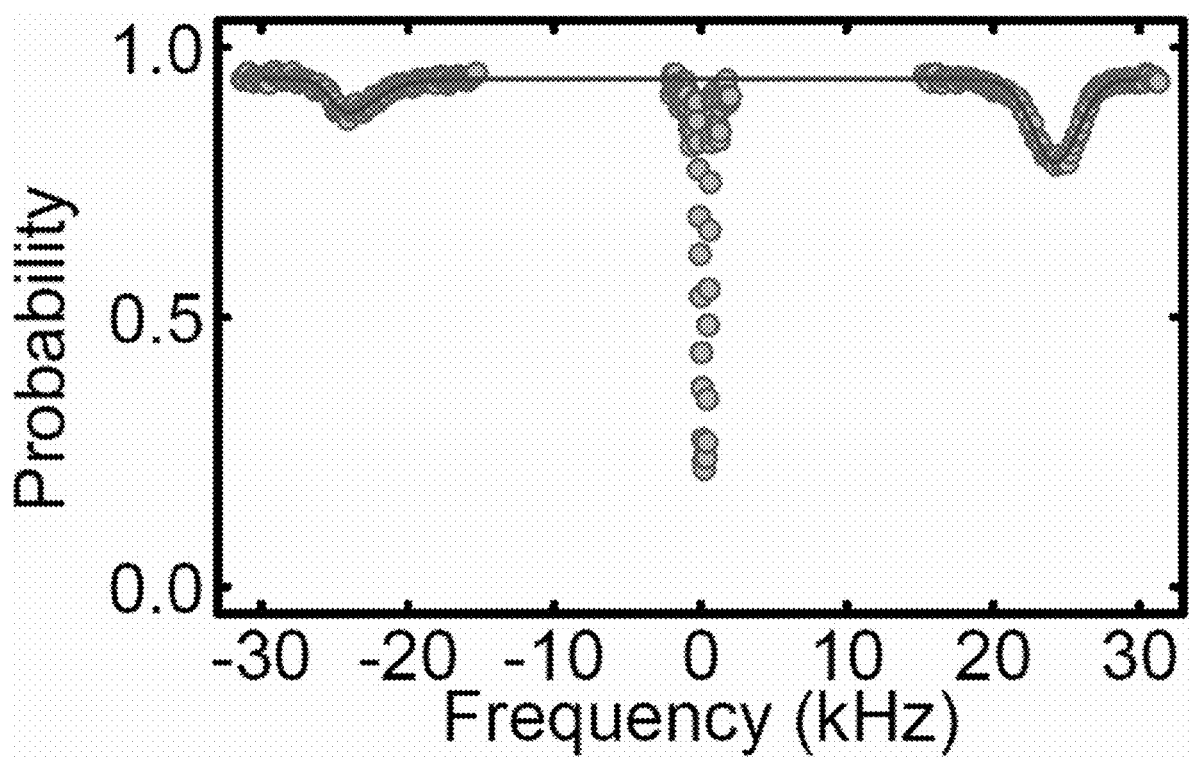

FIG. 19: Clock sideband thermometry. Array-averaged radial sideband spectrum of the optical clock transition, taken with a carrier Rabi frequency of ≈360 Hz. A narrow carrier stands in between two broader sidebands on the red and blue detuned sides. Sideband broadening is due mainly to small inhomogeneities in the array. A suppressed red sideband indicates significant motional ground state population. The solid line is a simultaneous fit to two skewed Gaussians. From the ratio of the area under the red sideband to that under the blue sideband, we obtain $\bar{n}\approx 0.66$. The carrier is probed for an interrogation time of 1.4 ms while the sidebands are probed for 3.3 ms.

Figure 20:
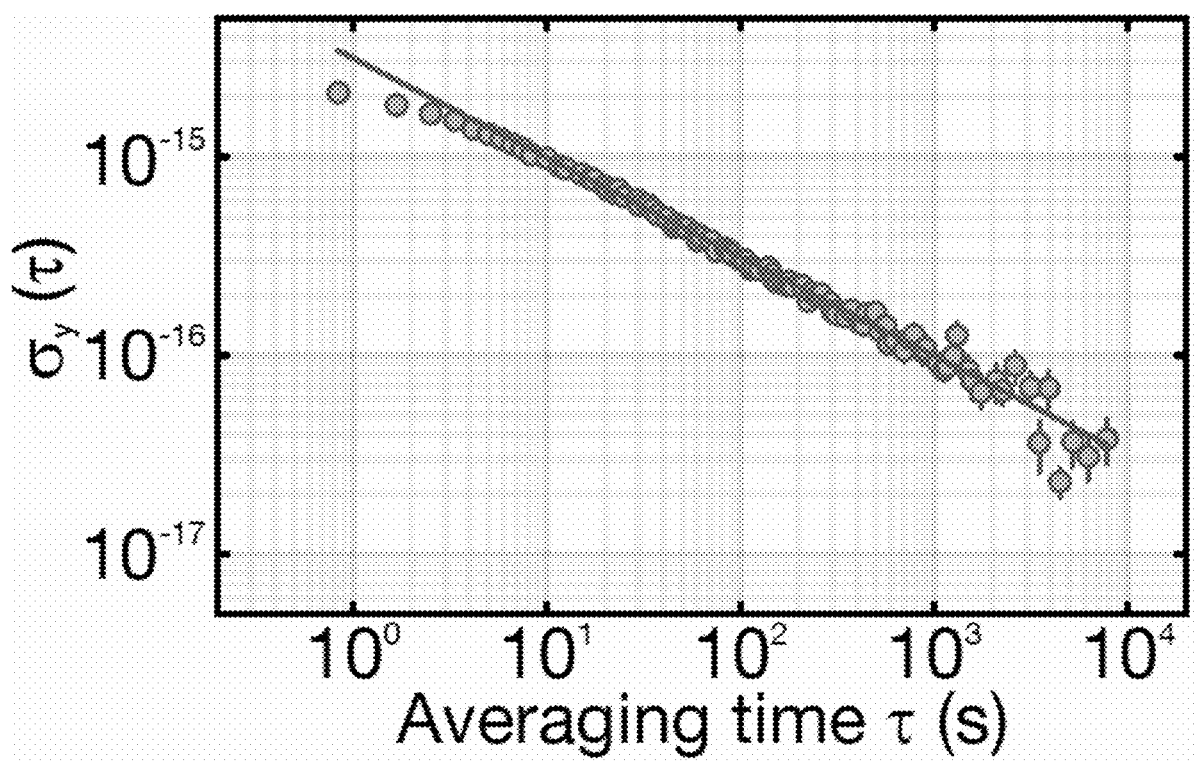

FIG. 20: Spatially-resolved clock comparison. The fractional Allan deviation from an asynchronous clock comparison between the left and right half of our array. Fitting a $1/\sqrt{\tau}$ behavior past an initial lock onset time, we find $3.1\times 10^{-15}/\sqrt{\tau}$, slightly higher than the result measured for a self-comparison of the full array (FIG. 4). Importantly, we see no upturn for times approaching $10^4$ s and below the $10^{-16}$ level, indicating that slowly-varying drifts of gradients across the array do not contribute to instability up to our sensitivity.

Figure 21:
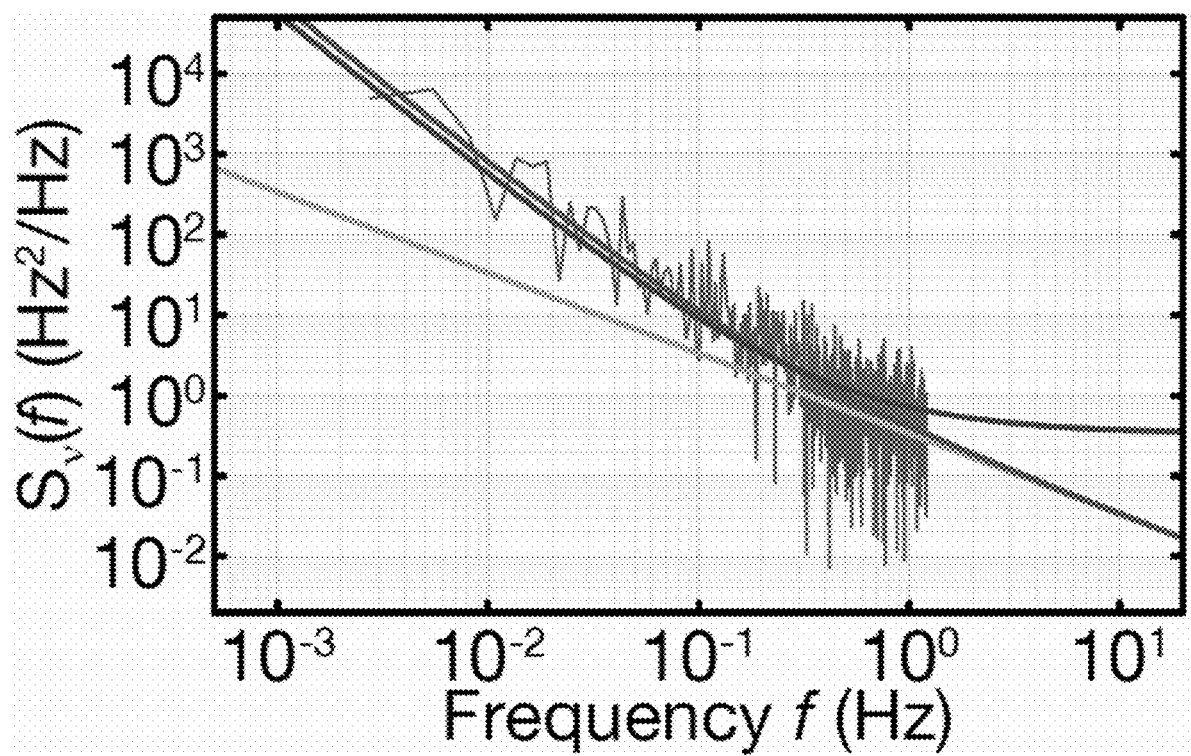

FIG. 21: Frequency noise spectrum of the clock laser. Power spectral density of the frequency noise of our clock laser measured from a beat signal with a reference laser over a 42-hour period (red trace). Our theoretical estimate of the thermal noise contribution is plotted in yellow. Plotted also are our best- (purple) and worst- (blue) case models for total frequency noise, as used in Monte Carlo simulations.

Figure 22:
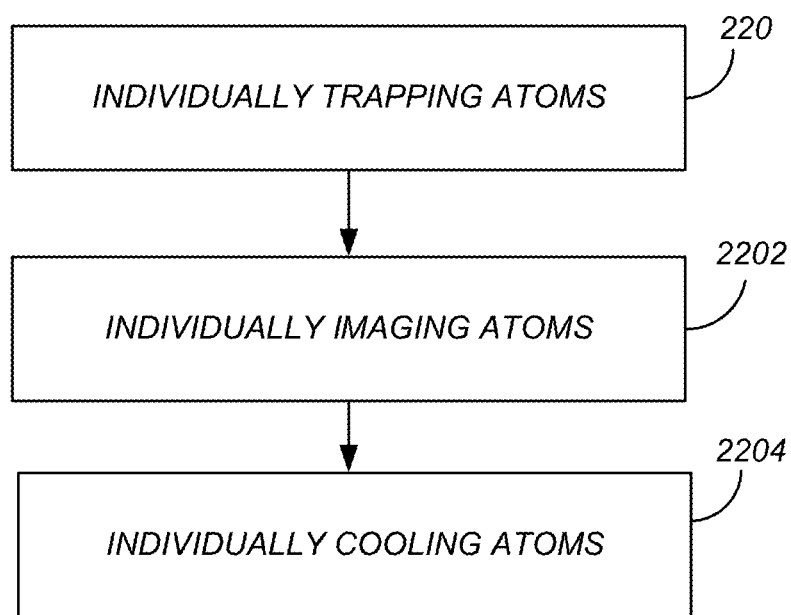

FIG. 22. Flowchart illustrating a method of trapping, imaging, and cooling atoms FIG. 23. Flowchart illustrating a method of making an apparatus according to a first example.

Figure 24:
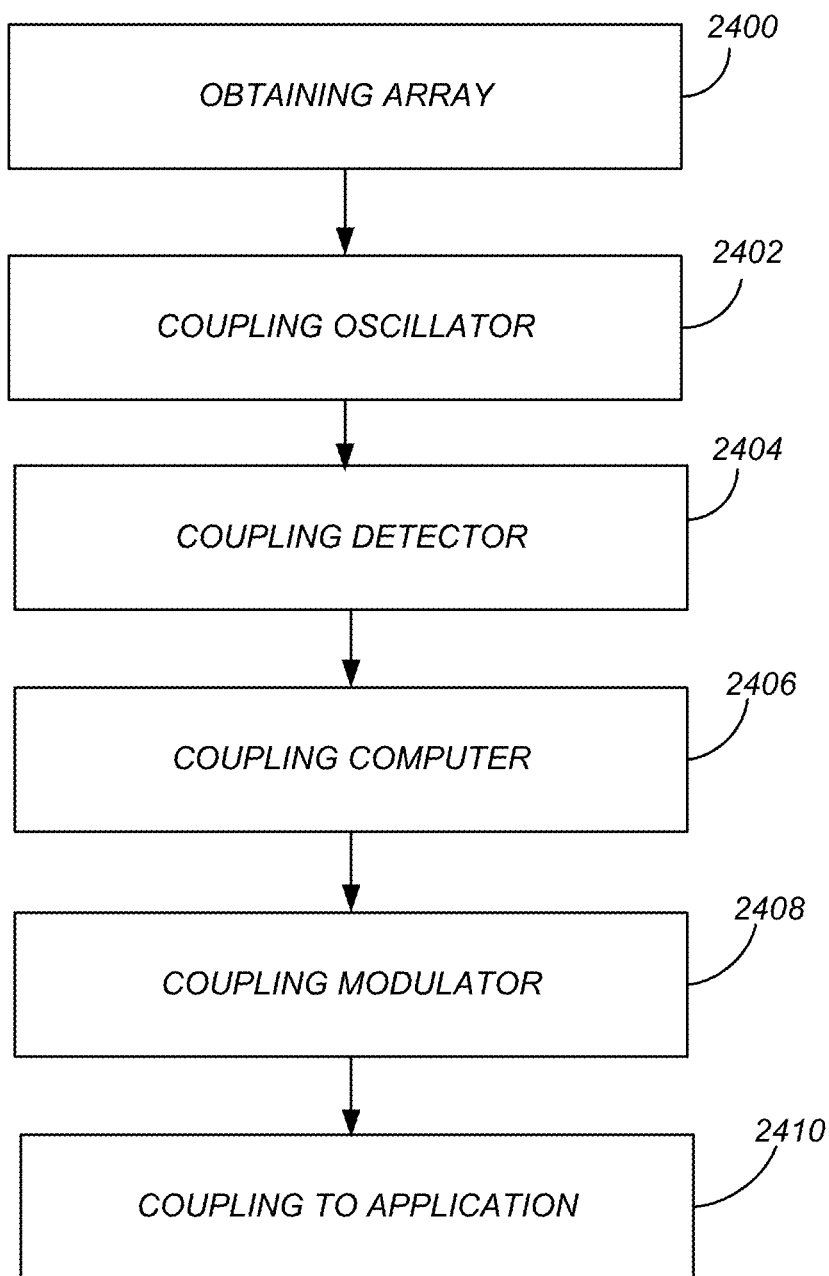

FIG. 24. Flowchart illustrating a method of making an apparatus according to a first example.

Figure 25:
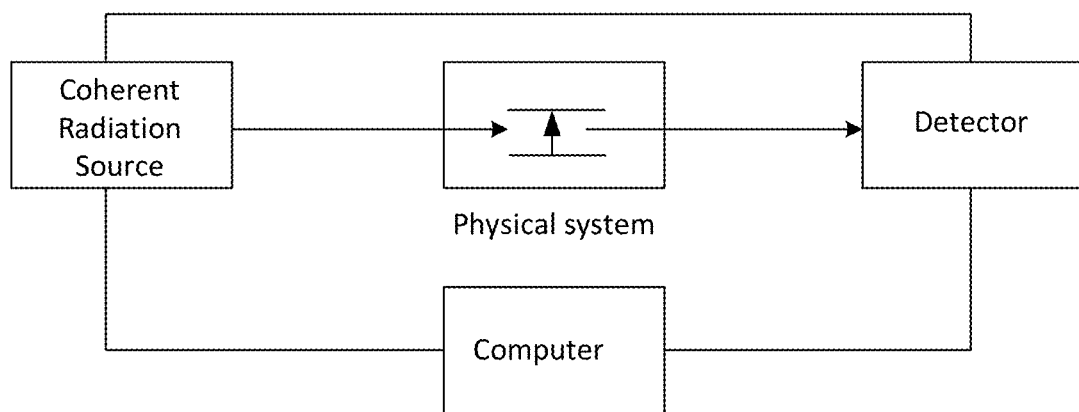

FIG. 25. Schematic illustrating an apparatus for locking an oscillator to a physical system.

Figure 26:
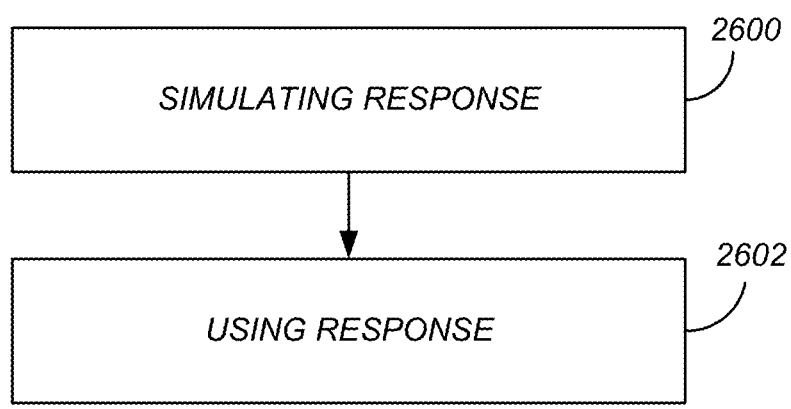

FIG. 26. Flowchart illustrating a method for simulating a response of a physical system.

Figure 27:
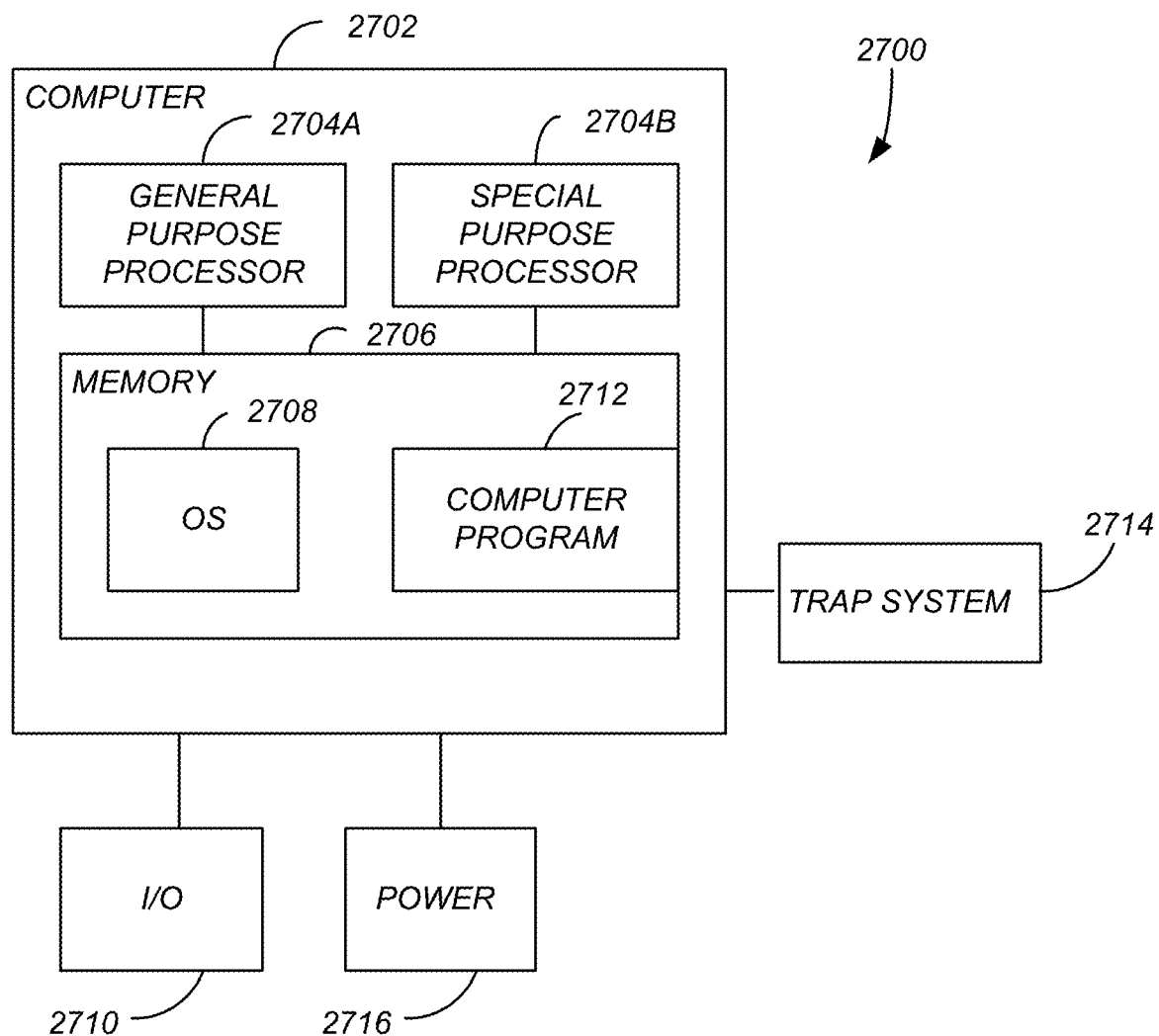

FIG. 27. Hardware environment for performing computing and control functionalities described herein

DETAILED DESCRIPTION OF THE INVENTION

In the following description of the preferred embodiment, reference is made to the accompanying drawings which form a part hereof, and in which is shown by way of illustration a specific embodiment in which the invention may be practiced. It is to be understood that other embodiments may be utilized and structural changes may be made without departing from the scope of the present invention.

Technical Description

Part A. Trapping, Imaging, and Cooling of Atoms.

Apparatus Structure

FIG. 1A illustrates an apparatus 100 for trapping, imaging, and cooling one or more atoms 102. The apparatus includes one or more lasers 104a, 104b, 104c (or sources of e.g., coherent electromagnetic radiation) emitting one or more first laser beams 106 comprising first electromagnetic radiation, one or more second laser beams 108 comprising second electromagnetic radiation, and one or more third laser beams 110 comprising third electromagnetic radiation.

The one or more first laser beams generate one or more trapping potentials 112 (or one or more traps 112a each comprising a trapping potential). The apparatus further includes one or more atoms 102, wherein each of the trapping potentials trap a single one of the atoms. The one or more second laser beams irradiate the one or more atoms so as to generate fluorescence 114 from each of the atoms. The apparatus comprises a detector 116 receiving the fluorescence so as to generate an image of each of the atoms from the fluorescence. The one or more third laser beams irradiate the one or more atoms so as to cool each of the atoms.

In one or more examples, Laser 104a includes a laser system comprising one or more lasers, optics, and diffractive elements. In one or more examples, the apparatus further includes a first objective 118 focusing the first laser beams at one or more foci so as to generate each of the trapping potentials at each of the foci.

FIG. 1B illustrates the atoms include a first energy level 122; a second energy level 122 having an energy higher than the first energy level; and a third energy level 126. In one or more examples, the atoms comprise alkaline earth atoms or an alkaline earth like atom comprising two valence electrons in an s shell forming a spin singlet state, the second energy level comprises 1 valence electron in an s shell 1 valence electron in a p shell, forming spin singlet state, and the third energy level comprises 1 valence electron in the s shell and 1 valence electron in the p shell, forming one of three spin triplet states. In one or more examples, in a ground state, the atoms each comprise two valence electrons in the first energy level comprising the s shell, forming a spin singlet state; in a first excited state, the atoms each comprise 1 valence electron in the first energy level comprising the s shell and 1 valence electron in the second energy level comprising a p shell, forming a spin singlet state; and in a second excited state, the atoms each comprise 1 valence electron in the first energy level comprising an s shell and 1 valence electron in the third energy level comprising a p shell, forming one of three spin triplet states.

In one or more examples, the second laser beams comprise the second electromagnetic radiation having a frequency and a polarization tuned to excite a first (e.g., optical) transition between the first energy level and the second energy level so that the fluorescence comprises spontaneous emission from the second energy level back to the first energy level.

In one or more examples, the third laser beams comprise the third electromagnetic radiation having a wavelength tuned to induce a second (e.g, optical) transition between the first energy level and the third energy level, so as to laser cool the atoms by transfer the atoms into a lower energy motional state.

Laser Cooling Examples

Examples of laser cooling include, but are not limited to Sisyphus cooling or sideband cooling. FIG. 1C illustrates an example wherein each of the atoms are cooled using Sisyphus cooling and the third laser beam does not include or provide a magic trapping condition associated with the second (e.g., optical) transition, so that the trapping potential experienced by the atom in a ground state (e.g., wherein electrons are in the first energy level) is different from the trapping potential experienced by the atom in an excited state (e.g. wherein at least one of the electrons is in the third energy level).

Examples of Sisyphus cooling include repulsive and attractive Sisyphus cooling. In a repulsive Sisyphus cooling example, the trapping potential for the atom in the ground state (electrons in the first energy level) is higher than the trapping potential for the atom in an excited state (e.g., wherein at least one of the electrons is in the third energy level), and the third laser beams are blue detuned so as to have a frequency greater than transition frequency for exciting the second transition of the atom in free space (non-trapped atom).

In an attractive Sisyphus cooling example, the trapping potential for the atom in the ground state (e.g., electrons in the first energy level) is lower than the trapping potential for the atom in the excited state (e.g, wherein at least one of the electrons is in the third energy level), and the third laser beam is red detuned so that the third laser beam has a frequency less than a transition frequency of for exciting the second transition of the atom in free space (non-trapped atom).

FIG. 1C further illustrates a laser cooling example comprising sideband cooling, wherein:

(1) the third laser beams are tuned to a magic trapping condition associated with the second (e.g., optical) transition, so that the trapping potential experienced by the atom in the ground state (wherein electrons are in the first level) is the same as the trapping potential experienced by the atom in the excited state (wherein at least one of the electrons from the first energy level is transferred into the third energy level), (2) the atoms further include a first set of motional energy levels indexed with an integer n for an electron in the first energy level and a second set of motional energy levels indexed with an integer m for an electron in the third energy level, the third laser beams exciting the atom from the nth state in the first energy level to the $m^{th}=(n-1)^{th}$ state in the third energy level, so that the atom decays by emitting spontaneous emission from the $m^{th}$ state to $(n-1)^{th}$ state in the first energy level, and (3) the step (2) is repeated (the third laser beams irradiating the atom) until the atom is in the $n=0^{th}$ motional state in the first energy level.

In one or more examples, the atoms are cooled in multiple directions. In one example, the third laser beams include a laser beam propagating perpendicular to the first laser beam so as to cool the atom in a radial direction, and a fifth laser beam propagating parallel to the first laser beam so as to cool the atom in a longitudinal direction.

Array Examples

FIG. 3 illustrates an example wherein the apparatus further comprises an array of the first laser beams forming (e.g., optical) tweezers and/or array of the third laser beams (cooling beams) and/or array of the second laser beams (imaging beams), each of the tweezers trapping one of the atoms, each of the cooling beams cooling the one of the atoms, and each of the imaging beams imaging the one of the atoms.

Operation Examples

In yet another example, each of the atoms have a fourth energy level higher than the first energy level and lower than the third energy level; the first laser beam is tuned to have a wavelength that is magic for the first energy level and the fourth energy level but not for the third energy level, and the cooling using the third laser beam is Sisyphus cooling or another form of laser cooling.

The fourth energy level is a clock state and transitions from the first energy level to the fourth energy level are used to create (e.g., optical) qubits in quantum computing configuration (ground state is first level, excited state is the clock state). The image using the fluorescence is used to read out the state of the qubit (and image/determine occupancy of trap).

In yet a further example, each of the atoms have a fifth energy level higher than the first energy level and lower than the second energy level. Electrons transfer to the fifth energy level after transition from the first energy level to the second energy level. The first laser beam has a frequency such that the atom comprising an electron in the fifth energy level experiences the trapping potential so that the atom can transfer an electron to the third energy level experiencing an anti-trapping potential wherein the atom will transfer out of the (e.g., optical) trap or trapping potential.

In one or more examples, the apparatus is used to perform repeated imaging of the atom (at least 2000 imaging steps) showing long lifetimes of the atom under imaging conditions. For example, the one or more second laser beams repeatedly generate the fluorescence used image the one or more atoms showing that each of the atoms remain in their respective trapping potentials after at least 2000 imaging steps. In one or more examples, the imaging and cooling is performed simultaneously or alternately, and the cooling ensures that atoms are not lost from the optical trap by the imaging process.

Further Examples

1. Example Tweezer Trapping of Strontium

Tweezer trapping makes use of the AC Stark shift [47], attracting atoms to the point of maximum intensity in a tightly focused light beam [14]. We create a single tweezer, with a beam waist of $w_0 \approx 500$ nm, in the center of an ultra-high vacuum cell using a high-resolution objective (FIG. 1a, App. III). Generating tweezer arrays is discussed in Sec. 3 and we restrict the discussion to a single tweezer here. To load the tweezer, we overlap it with a laser-cooled cloud of $^{88}$Sr atoms in a narrow-line magneto-optical trap (MOT) [48, 49]. Specifically, we load the tweezer for 12 ms with red MOT beams detuned to the red by a few hundred kilohertz from the frequency used in the final stage of the red MOT. At least one atom remains in the tweezer after the MOT cloud is dispersed with a probability greater than 99.95%, which corresponds to a mean number of at least 7 atoms, assuming a Poisson distribution for the loading statistics. Subsequently, we induce light-assisted collisions that efficiently remove pairs of atoms [14, 50]. As a consequence, the tweezer is filled with at most one atom with an observed occupation probability of ~50% (App. IV and Sec. 2).

For single-atom detection, we collect blue fluorescence photons while simultaneously applying narrow linewidth cooling to mitigate recoil heating (FIG. 1b,c). To this end, we implement a particular type of Sisyphus cooling mechanism [45, 46] that relies on the excited state of a narrow optical transition being less trapped than the ground state. In contrast, resolved sideband cooling requires 'magic' conditions, i.e., a situation where the ground and excited states experience the same trapping potential [32, 51, 52].

In our narrow transition to the $^3P_1$ manifold, we are able to realize both conditions simultaneously for different sublevels, allowing us to study Sisyphus and sideband cooling in a single experimental setting. Specifically, we tune the polarizabilities of the $^3P_1$ sublevels by varying the ellipticity angle $\gamma$ of the tweezer polarization (FIG. 1d, App. II). For one of these sublevels, we find a 'magic angle' [53, 54] that equalizes ground and excited state polarizability, enabling sideband cooling. The other two sublevels experience significantly weaker trapping for all polarizations, enabling Sisyphus cooling without the need for fine-tuning.

We compare our measurements of differential polarizability at 515.2 nm to theoretical models in App. I. We find good agreement for the ratio of differential polarizabilities at linear polarization. This quantity provides a new benchmark for theoretical models—sensitive to even small changes in several matrix elements. Our theoretical models further predict a magic crossing in linearly polarized light at a wavelength of 520(2) nm and a polarization-insensitive magic crossing at 500.65(50) nm.

2. Example: Imaging in a Single Tweezer

Figure 2:
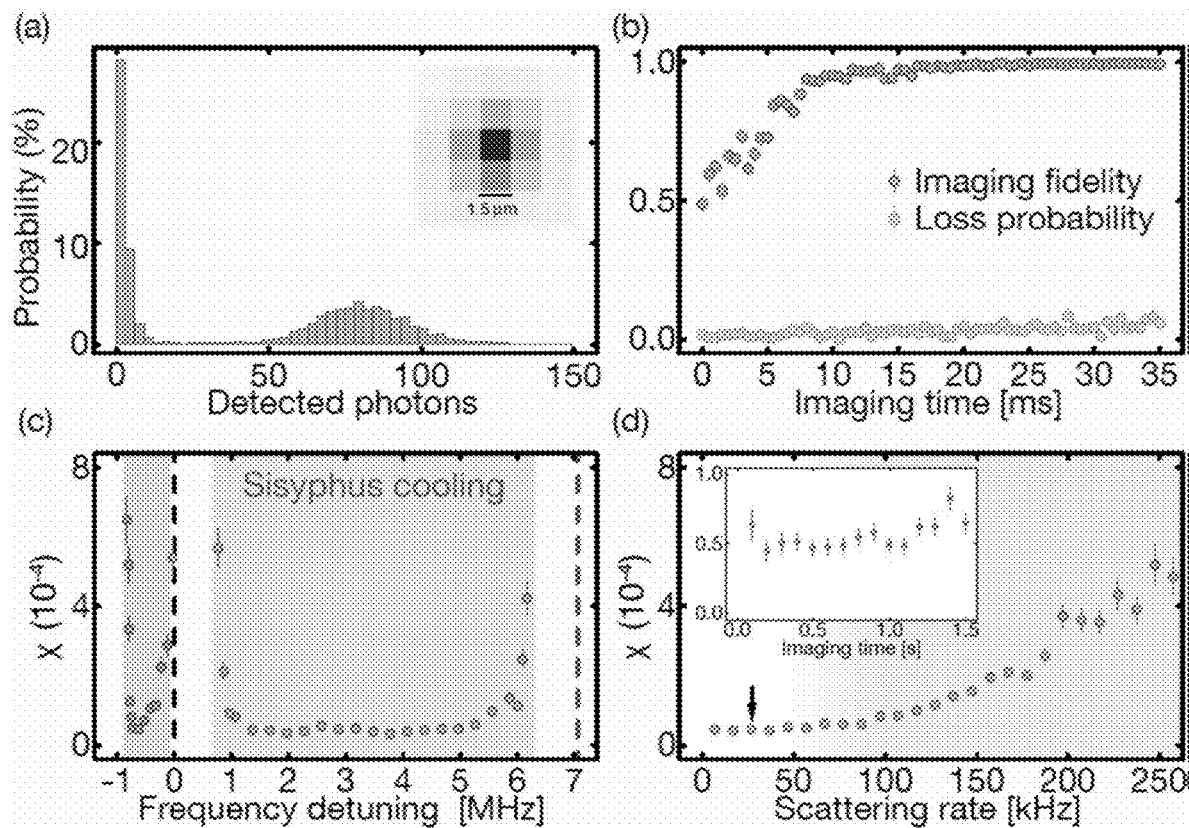
FIG. 2: Imaging in a single tweezer. (a) Histogram of detected photons acquired under typical imaging conditions, showing good discrimination between a zero-atom and single-atom peak. Results are for a single tweezer with magic polarization. Inset: averaged fluorescence image of a single atom (see Sec. 3 for details). (b) Imaging fidelity and loss probability as a function of imaging time. Fidelity, defined as the accuracy of image classification, reaches a maximum of F=99.3(9)% for sufficiently long imaging times. However, loss also increases with imaging time. Fidelity is ultimately limited by the estimated number of atoms lost before they can emit enough photons to be detected. (c) The loss coefficient $$\chi \equiv -\frac{\ln(p_s)}{N},$$

Under typical conditions, the observed fluorescence signal on an electron multiplying charge-coupled device (EM-CCD) camera enables single-shot single-atom resolved detection with high fidelity. Specifically, the histogram of photons detected in a 7×7 box of pixels separates into two resolved peaks of approximately equal area: a zero-atom background peak and a single-atom peak (FIG. 2a). These results are consistent with a single atom occupying the trap in ~50% of the repetitions (see also App. IV).

We compute a single-shot imaging fidelity F via the accuracy of image classification. Images are classified into positives (atom detected) and negatives (no atom detected) by choosing a threshold of detected photons. The accuracy of classification is defined as the fraction of correctly identified images. Via an estimate of false positives and false negatives, we compute this quantity to reach F=99.3(9)% in the limit of long imaging times (FIG. 2b, App. V). These values are quoted for a trap depth of 1.4 mK. We have briefly studied imaging in shallower traps and are able to achieve fidelities higher than 98% for traps at least as shallow as 300 μK.

Although we are able to correctly identify the presence or absence of an atom with high fidelity, we find that a small fraction of atoms is lost during the imaging process. In the histogram, loss manifests itself as a small, roughly flat distribution bridging the single- and no-atom peaks. This bridge stems from atoms that are lost before the end of the imaging period and, therefore, result in fewer scattered photons. We emphasize, however, that loss during imaging does not imply that an atom was not detected, as most atoms that are lost still emit enough photons to be above the classification threshold. Nonetheless, the imaging fidelity at long times is ultimately limited by atoms lost before they can emit enough photons to be detected (App. V).

To quantify loss, we take two consecutive images and define the survival probability $P_s$ of detected atoms as the probability of detecting an atom in the second image conditional on an atom being detected in the first. As loss grows with imaging time, there is a compromise between fidelity and survival fraction. As typical numbers, we quote F~99% at a survival probability of $p_s$~97% for an imaging time of ~20 ms (FIG. 2b).

Under optimized imaging conditions, we find that the experimentally observed survival probability $p_s$ is compatible with an exponential loss in scattered photons, $P_s \approx \exp(-\chi \cdot N)$, where N is an estimator for the number of scattered blue photons (FIG. 1c,d and App. V). For example, we observe that the loss coefficient $\chi$, defined as $$\chi \equiv -\frac{\ln(p_s)}{N},$$

is constant as a function of imaging time during which N grows (inset FIG. 2d). For optimized cooling parameters, we find that $\chi$ is roughly independent of scattering rate for blue scattering rates below ~60 kHz (FIG. 2d). Furthermore, in this limit of low blue scattering rates, we find approximately the same $\chi$ in a wide range of red cooling parameters (FIG. 2c).

These observations are compatible with a loss mechanism that depopulates the excited state $^1P_1$ via a weak decay channel $^1P_1 \rightarrow ^1D_2$ (FIG. 1b). In our trapping wavelength, $^1D_2$ is strongly anti-confined such that we expect atoms to be ejected faster than they can decay into the triplet manifold. Assuming that all decay into $^1D_2$ results in loss, $\chi^{-1}$ provides a lower bound for the branching ratio between decaying back into $^1S_0$ compared to decaying into $^1D_2$. We find $\chi^{-1}$ to be in the range from $17(3) \times 10^3$ to $24(4) \times 10^3$ depending on our assumption on the blue emission pattern (App. V). This lower bound is consistent with an ab initio prediction for the branching ratio of $20.5(9) \times 10^3$ (App. 1). Note in comparison the commonly quoted branching ratio of $50 \times 10^3$ [55]. We discuss strategies for mitigating this depopulation loss in Section 6.

We find the lowest loss coefficients $\chi$ in two distinct red cooling regimes, attributed to sideband and Sisyphus cooling (FIG. 2c). We cool atoms with the 689 nm light simultaneously while driving the blue transition. On the red detuned side of the 689 nm free-space resonance, we observe a narrow cooling feature, which we interpret as sideband cooling on the magic-tuned transition to $|\phi_A\rangle$. On the blue detuned side, where we excite a non-magic transition, there is a much broader feature, which we interpret as Sisyphus cooling (Section 4). For detunings away from the cooling features, the loss coefficient increases as heating losses become dominant. The cooling light is provided by three counterpropagating red MOT beams, although we have observed that a single non-counterpropagating beam achieves similar fidelity in the Sisyphus regime, compatible with the interpretation that cooling in this regime is not provided by photon recoil but rather by differential potential energy between ground and excited state.

3. Example Tweezer Arrays

We now generalize this imaging strategy to two-dimensional arrays of tweezers. At the same time, this serves as a proof-of-principle for larger-scale two-dimensional tweezer array generation with acousto-optic deflectors (AODs), which have previously been employed for one-dimensional arrays of up to 100 sites [19] and two-dimensional arrays of four [56] or 16 sites [57]. To this end, we generate a square array of 11×11=121 tweezers using two AODs oriented perpendicularly to one another (FIG. 3a-c), each driven by a polychromatic radiofrequency (RF) signal (App. III). Having shown effective cooling in a magic-tuned tweezer, we choose linear tweezer polarization here instead. This choice aides in maintaining polarization uniformity across the array and lets us explore how cooling features change with modified differential polarizabilities. We achieve homogeneous trap depths across the array with a peak-to-peak variation of <5% and a standard deviation of 2% (FIG. 3d). To obtain this level of uniformity, we start by coarsely uniformizing the trap depths by imaging the trapping light onto a CMOS camera and feeding back to the amplitudes of the RF tones. Fine uniformization is achieved by spectroscopy on the $^1S_0 \leftrightarrow ^3P_1|\phi_C\rangle$ transition, which offers a precise measure of trap depth due to its large differential polarizability and narrow linewidth. We ultimately use this signal as feedback to calibrate out imperfections in our imaging onto the CMOS, and to measure uniformity after the iteration is complete.

Our measured trap depth and radial trap frequency (see Sec. 5) are consistent with a nearly-diffraction-limited tweezer waist of ~500 nm. We additionally confirm this value by imaging the focal plane of the trap light with an ultra-high resolution objective. However, the observed size of our single-atom point spread function (FIG. 2a, FIG. 3b) is larger than the theoretical diffraction-limited value. We suspect thermal spatial broadening, pixilation effects, chromatic shifts between the green trap and blue fluorescence, and/or aberrations in the imaging system to be responsible for this. We leave this for further investigation as this does not directly impact the results presented here.

We observe cooling features across the linearly polarized array similar to those of a single tweezer with magic polarization (FIG. 3e). We again find a narrow red-detuned cooling feature, but further to the red than that in magic polarization. We expect this feature to be a combination of sideband cooling and Sisyphus cooling in the regime of a more strongly trapped excited state [45, 46]. The blue-detuned Sisyphus feature is also still present, albeit extending even further to the blue. These observations are consistent with how we expect excited state polarizabilities to shift with tweezer polarization ellipticity (FIG. 1d). For optimal cooling conditions, we again see that the loss coefficient $\chi$ reaches the same minimum value over a broad range of settings (FIG. 3e), although with a higher value than observed in a single magic tweezer. We leave this observation for further investigation and at this point only hypothesize that it may be partly due to an altered fluorescence radiation pattern because of the difference in tweezer polarization (App. V).

4 Example Sisyphus Cooling

We now investigate the mechanism behind the broad, blue-detuned cooling feature observed during fluorescence imaging. The feature spans a range of frequencies for which a local resonance condition of the non-magic $^1S_0 \leftrightarrow ^3P_1|\phi_B\rangle$ transition exists in the trap (FIG. 4a). As the red transition is much narrower than the differential trap depth ($\hbar\Gamma \ll |\Delta U|$), selective excitation of narrow equipotential manifolds in the trap is possible. By appropriate choice of detuning, an atom can lose energy by exciting on a manifold where the energy of the absorbed photon is smaller than the energy of the photon emitted after oscillating in the excited state potential. This is only effective when the atom spends time in the excited state that is at least commensurate with the trapping period, so the condition $\Gamma \lesssim \omega$ must also hold. Such a cooling scheme is reminiscent of Sisyphus cooling between ground hyperfine manifolds of alkali atoms [58]. Narrow linewidth versions of Sisyphus cooling have been discussed theoretically in Refs. [45,46], although with the excited state experiencing stronger trapping, which—as we detail below—leads to different behavior compared to the case studied here where the excited state experiences weaker trapping.

We measure the equilibrium energy reached during fluorescence imaging with simultaneous Sisyphus cooling and observe a linear dependence on the detuning (FIG. 4b). We confirm that an equilibrium is reached by also measuring the mean energy as a function of imaging time and finding that it saturates after an initial linear growth (FIG. 4c). These measurements are performed via adiabatic rampdown of the trap to probe the energy distribution [59] (FIG. 4d and App. VI). We quote a mean energy instead of temperature as it is a priori not clear whether the reached equilibrium state corresponds to a thermal distribution.

Our interpretation for the linear behavior of mean energy vs detuning is as follows: as atoms scatter blue photons, they heat up, eventually reaching an energy manifold that is resonant with the red cooling light. Here, Sisyphus cooling counteracts recoil heating. An equilibrium is reached as recoil heating pushes the energy up against a 'Sisyphus cap'. Detunings closer to the free-space resonance, resonant with equipotentials near the top of the trap, result in higher energy caps. Detunings further to the blue of free-space, resonant with equipotentials deep in the trap, result in lower energy caps. Consistent with this interpretation, the observed mean energies are slightly below the calculated cap energy, and follow the cap energy in a linear fashion.

We further observe that if the Sisyphus detuning is suddenly changed to a value further to the blue of what it was upon equilibration of the energy, rapid heating and atomic loss occurs even if blue fluorescence is turned off (not shown). These observations, which are supported by numerical simulation, paint a broader picture of the Sisyphus mechanism acting as a repeller in energy space. That is, atoms with an energy below that of the resonant manifold are pushed to lower energies while atoms with an energy higher than the resonant manifold are heated to even higher energies. We note that we drive a transition such that the excited state experiences weaker trapping than the ground state ($\alpha_e < \alpha_g$). Previous proposals of narrow-line Sisyphus cooling [45, 46] have mostly focused on the opposite regime ($\alpha_e > \alpha_g$), in which the Sisyphus mechanism acts as an attractor in energy space instead. The latter regime has been proposed as a mechanism for ground state cooling, while our regime is not as amenable to this because cooling stops after the atom has been cooled to some energy that is no longer resonant with the repeller; however, a dynamically swept detuning may achieve very low energies, which we leave for further investigation.

5 Example Sideband Cooling in a Single Tweezer

In this example, we show a proof-of-principle for resolved sideband cooling in a tweezer, hence demonstrating direct optical control of motional degrees of freedom of a tightly trapped single atom. Related work on Raman sideband cooling has been performed with alkali atoms [16, 17], and narrow-line resolved sideband cooling has been previously observed with alkaline-earth(-like) atoms [32, 42] and trapped ions [60, 61]. Here, we use the $^1S_0 \leftrightarrow {}^3P_1 |\phi_A\rangle$ transition in an elliptically polarized tweezer tuned to the magic angle. The vanishing differential polarizability of this transition simplifies sideband cooling and spectroscopy because sideband transition frequencies do not (up to effects of anharmonicity) depend on the motional state. However, we do not discount the possibility of high-fidelity sideband cooling in finite differential polarizability, and leave this for future studies.

Since the linewidth of the $^1S_0 \leftrightarrow {}^3P_1$ transition (7.4 kHz) is smaller than our trap frequencies, we can selectively drive red sideband transitions that reduce the motional quantum number (FIG. 5a). Specifically, for our trap depth of 1.4 mK (29 MHz), the radial (axial) trap frequency is $v_r=211(4)$ kHz ($v_a=32.2(8)$ kHz). Cooling hinges on the propensity for the atom to preserve its motional quantum number while decaying from the excited state, a condition that is achieved when the Lamb-Dicke parameter $\eta$ is small, i.e.

$$\eta \equiv k\sqrt{\frac{\hbar}{4\pi m v}} \ll 1.$$

For us, the radial direction has $\eta_r=0.15$ and the axial has $\eta_a=0.39$.

Before the start of the cooling sequence, the atom is imaged with Sisyphus cooling and has equilibrated at a mean energy where we expect negligible ground state population (Sec. 4). To cool close to the motional ground state, we perform sideband cooling by alternating 100 μs pulses of three beams, two orthogonal beams in the radial plane and one beam in the axial direction collimated through our objective. None of the beams are retro-reflected. We break cooling into two stages: the first stage targets the fifth red axial sideband, while the second stage targets the first red axial sideband. Both stages target the first red radial sideband. The first stage is repeated for 100 consecutive cycles, while the second is repeated for 50.

To extract information about the final motional state, we probe the sideband spectrum after cooling by performing excitation-depletion spectroscopy on the $^1S_0 \leftrightarrow {}^3P_1$ transition (FIG. 5b). We first excite the ground state atoms on the $^1S_0 \leftrightarrow {}^3P_1$ transition with an excitation pulse of 74 μs. We then pump atoms in $^3P_1$ to the $^3P_0$ and $^3P_2$ metastable dark states via the $^3S_1$ state with a depletion pulse of 10 μs at 688 nm. This excitation-depletion cycle is repeated 3 times to increase signal. Thus, population of $^3P_1$ is measured as apparent loss upon performing a second fluorescence image.

We observe that a sideband asymmetry appears after cooling (FIG. 5c,d), which did not exist before cooling (insets), directly demonstrating reduced motional energy. A similar level of asymmetry is observed in the orthogonal radial spectrum (not shown). To quantify the final motional state, we fit our data to simulation of the probe spectroscopy that includes the effect of finite decay (App. VII). We find our data to be compatible with a thermal ground state fraction in the interval of [0.69,0.96] in the radial direction and [0.45,0.59] in the axial. These values refer to the motional state right after sideband cooling, before the probe is applied.

We finally note that we observe a small loss probability during sideband cooling and hypothesize that this may be due to off-resonant excitation from the trapping light while the atom is in $^3P_1$. Such excitation could induce loss by populating states outside our imaging and cooling cycles. A longer wavelength trap would likely reduce these losses by being further detuned from higher-lying states.

6 Possible Modifications and Variations

We have demonstrated trapping, high-fidelity detection, and narrow-line cooling of individual AEAs in optical tweezers. Our imaging technique is based on fluorescence imaging while cooling with a novel narrow-linewidth Sisyphus scheme.

The robust operation of the Sisyphus mechanism away from finely tuned magic conditions opens the possibility for aiding single-atom imaging in a myriad of situations. Specifically, this presents a viable option for cooling during imaging of essentially any atomic species with sufficiently narrow optical lines, such as other AEAs or dipolar atoms [62, 63]. As a point of reference, we have demonstrated high-fidelity imaging in trap depths as low as 300 μK and anticipate extensions to even shallower depths with further optimization. We note that Sisyphus cooling can be achieved with a single beam as it relies on energy transfer from differential trapping instead of photon momentum. This is often an advantage in such imaging applications as stray light can be minimized.

Concerning strontium itself, Sisyphus cooling can enable imaging in various useful wavelengths. For example, quantum gas microscopes could be operated with 1064 nm light, where high-power lasers exist. Another intriguing possibility is trapping and imaging in 813.4 nm, which is a magic wavelength for the $^1S_0 \leftrightarrow ^3P_0$ clock transition. Importantly, for these wavelengths, we expect that the $^1D_2$ state will be trapped, such that imaging loss from depopulation can be further mitigated by repumping in the triplet and/or singlet manifold.

More broadly, the presented results open the door for a wide range of experimental possibilities enabled by combining OT-based single-atom control techniques with the intriguing features of AEAs. For example, the unique spectral properties of AEAs are currently exploited in optical lattice clocks [31]. Here, combining single-atom control with such high spectral resolution could be employed to explore systematic shifts introduced by dipole-dipole interactions [64] or to implement single-experiment interleaved clock operation [65]. Further, the combination of long-range interactions mediated by Rydberg states [66, 67] or cavity-modes [68] with OTs could be used to controllably introduce and detect entanglement in the clock transition—a possible pathway to quantum-enhanced clock operation.

We further note new avenues in quantum simulation and computing. Previously, a combination of high-precision spectral control, unique spin properties [35, 69] and orbital spin exchange interactions [36, 37] has been experimentally explored and proposed in a range of AEA quantum simulation applications, including the generation of spin orbit coupling in synthetic dimensions [38, 39] or work towards Kondo-like systems [34, 70, 71]. Related ideas appear in a whole array of quantum computing protocols for AEAs [72-75]. Specifically, such quantum computing architectures require dedicated single atom control techniques, which could be realized with OTs [76] instead of optical lattices as originally envisioned. In a modification of these protocols, Kondo-type models [34, 69, 71, 77] could be explored in a bottom-up manner similar to Hubbard models [8] either with OTs alone or by combining OTs with degenerate quantum gases to introduce impurities.

Further, our experiments will allow control of AEA Rydberg interactions [66, 78-83] at the single atom level, which could lead to an increase in effective coherence time (compared to alkalis) by using meta-stable intermediate states [66, 83]—an important aspect for further advances in Rydberg-based quantum simulation and computing.

Finally, we consider OT based strategies for basic atomic physics experiments. For example, we envision controlled ionization of an alkaline-earth atom trapped in a tweezer, providing a new pathway to optical trapping and control of ions [84]. Further, we note the possibility of generating cold molecules involving AEAs [85] in an atom-by-atom fashion using optical tweezers [86].

Appendix to Part A

I. Example Calculation of Polarizabilities, Magic Wavelengths, and Branching Ratio I.1 Overview The trapping potential experienced by an atom prepared in its internal state i is equal to the product of the state-dependent polarizability $\alpha_i(\lambda, \hat{\epsilon})$ and the intensity profile of the optical tweezer I(r,z) such that $$U_i(r,z) = -\alpha_i(\lambda,\hat{\epsilon})I(r,z)/2\epsilon_0 c, \quad (1)$$

where $\epsilon_0$ is the vacuum permittivity and c is the speed of light in vacuum [88]. The state-dependent polarizability, $\alpha_i(\lambda, \hat{\epsilon})$, depends on both the wavelength $\lambda$ and the polarization vector $\hat{\epsilon}$ of the trapping light [32, 88]. The polarizability of the $^1S_0$ ground state is independent of polarization, whereas the polarizabilities of the three sublevels of the $^3P_1$ excited state depend on the polarization due to vector and tensor components of the polarizability.

We calculate the polarizability of the $^1S_0$ and $^3P_1$ states (FIG. 6) using both ab initio and recommended values for the transition wavelengths and dipole matrix elements (see Table 1 for the computed and recommended values, as well as the breakdown of contributions to the polarizability). The recommended values combine theoretical calculations with experimental measurements to compute estimates of the electric-dipole matrix elements and polarizabilities. At linear trap polarization, we predict a magic wavelength on the $^1S_0 \leftrightarrow ^3P_1|m_j^x=0\rangle$ transition at 520(2) nm using both ab initio and recommended values. We predict another magic wavelength on the $^1S_0 \leftrightarrow ^3P_1|m_j^x=\pm 1\rangle$ transition at $\lambda=500.65(50)$ nm using recommended values.

The wavelength of our tweezers is 515.2 nm, such that for linear polarization the trapping potential in the $^3P_1|m_j^x=0\rangle$ ($|m_j^x=\pm 1\rangle$) excited state is larger (smaller) than the trapping potential in the $^1S_0$ ground state by 5% (30%). We achieve a magic trapping condition by tuning to elliptical polarization as detailed in App. II.

I.2 Example Calculating Polarizabilities and Magic Wavelengths for Sr

The frequency-dependent scalar polarizability, $\alpha(\omega)$, of an atom in a state i may be separated into a core polarizability $\alpha_{core}$ and a contribution from the valence electrons, $\alpha^v(\omega)$. The core polarizability is a sum of the polarizability of the ionic $Sr^{2+}$ core and a counter term that compensates for Pauli principle violating core-valence excitation from the core to the valence shells. The ionic core polarizability is small and a static value calculated in the random-phase approximation (RPA) gives sufficient accuracy [89].

The total polarizability for linear polarization is given by $$\alpha = \alpha_s + \alpha_t \frac{3m_j^2 - J_i(J_i+1)}{J_i(2J_i-1)}, \quad (2)$$

where $J_i$ is the total angular momentum quantum number of the state i, $m_j$ is the magnetic quantum number associated with the projection of the angular momentum along the polarization axis of the tweezer ($\hat{x}$), and $\alpha_s$ and $\alpha_t$ are the scalar and tensor polarizabilities, respectively. The total polarizability for the $J_i=1$ state is given by $$\alpha = \alpha_s - 2\alpha_t \quad (3)$$

for $m_j=0$ and $$\alpha = \alpha_s + \alpha_t \quad (4)$$

for $m_j=\pm 1$.

We calculate the valence polarizabilities using a hybrid approach that combines configuration iteration and a linearized coupled-cluster method [CI+all-order] [90]. The application of this method to the calculation of polarizabilities is described in Refs. [89, 91]. Briefly, the valence part of the polarizability for the state i with the total angular momentum $J_i$ and projection $m_j$ is determined by solving the inhomogeneous equation of perturbation theory in the valence space, which is approximated as [92]

$$(E_v - \mathcal{H}_{eff})|\Psi(v,m'_j)\rangle = D_{eff,q}|\Psi_0(v,J_i,m_j)\rangle. \quad (5)$$

The parts of the wave function $\Psi(v, m'_j)$ with angular momenta of $J'_i = J_i$, $J_i \pm 1$ are then used to determine the scalar and tensor polarizabilities. The $\mathcal{H}_{eff}$ includes the all-order corrections calculated using the linearized coupled-cluster method with single and double excitations. The effective dipole operator $D_{eff}$ includes RPA corrections. This approach automatically includes contributions from all possible states.

TABLE 1

Contibutions to the Sr scalar $\alpha_s$ and tensor $\alpha_t$ polarizabilities for the $5s^2$ $^1S_0$ and $5s5p$ $^3P_1$ states at 520 nm and 515.2 nm in a.u. Correspoding energy differences $\Delta E$ in cm$^{-1}$ and reduced electric-dipole matrix elements D in a.u. are also listed.

| | | | 520 nm | | 515.2 nm | |
|---|---|---|---|---|---|---|
| Contribution | $\Delta E$ | D | $\alpha_s$ | $\alpha_t$ | $\alpha_s$ | $\alpha_t$ |
| $5s^2$ $^1S_0$ polarizability | | | | | | |
| $5s5p$ $^3P_1$ | 14504 | 0.151 | −0.3 | | −0.3 | |
| $5s5p$ $^1P_1$ | 21698 | 5.248(2) | 865.7 | | 929.4 | |
| Other | | | 7.2 | | 7.3 | |
| Core | | | 5.3 | | 5.3 | |
| Total | | | 878.0 | | 941.8 | |
| $5s5p$ $^3P_1$ polarizability | | | | | | |
| $5s^2$ $^1S_0$ | −14504 | 0.151 | 0.1 | −0.1 | 0.1 | −0.1 |
| $5s4d$ $^3D_1$ | 3655 | 2.322(11) | −2.7 | −1.3 | −2.6 | −1.3 |
| $5s4d$ $^3D_2$ | 3714 | 4.019(20) | −8.2 | 0.8 | −8.1 | 0.8 |
| $5s4d$ $^1D_2$ | 5645 | 0.190 | 0.0 | 0.0 | 0.0 | 0.0 |
| $5s6s$ $^3S_1$ | 14534 | 3.425(17) | −52.4 | −26.2 | −50.2 | −25.1 |
| $5s6s$ $^1S_0$ | 16087 | 0.045 | 0.0 | 0.0 | 0.0 | 0.0 |
| $5s5d$ $^1D_2$ | 20223 | 0.061 | 0.1 | 0.0 | 0.1 | 0.0 |
| $5s5d$ $^3D_1$ | 20503 | 2.009(20) | 79.9 | 39.9 | 92.5 | 46.3 |
| $5s5d$ $^3D_2$ | 20518 | 3.673(37) | 263.9 | −26.4 | 305.2 | −30.5 |
| $5p^2$ $^3P_0$ | 20689 | 2.657(27) | 122.4 | −122.4 | 138.9 | −138.9 |
| $5p^2$ $^3P_1$ | 20896 | 2.362(24) | 85.1 | 42.6 | 94.9 | 47.5 |
| $5p^2$ $^3P_2$ | 21170 | 2.865(29) | 108.2 | −10.8 | 118.6 | −11.9 |
| $5p^2$ $^1D_2$ | 22457 | 0.228 | 0.4 | 0.0 | 0.4 | 0.0 |
| $5p^2$ $^1S_0$ | 22656 | 0.291 | 0.7 | −0.7 | 0.7 | −0.7 |
| $5s7s$ $^3S_1$ | 22920 | 0.921 | 6.1 | 3.0 | 6.4 | 3.2 |
| Other | | | 65.8 | 0.2 | 66.9 | 0.2 |
| Core | | | 5.6 | 0.0 | 5.6 | 0.0 |
| Total | | | 674.7 | −101.3 | 769.4 | −110.5 |

To improve accuracy, we extract several contributions to the valence polarizabilities using the sum-over-states formulas [93]:

$$\alpha_s(\omega) = \frac{2}{3(2J_i+1)} \sum_k \frac{\langle k\|D\|i\rangle^2 (E_k - E_i)}{(E_k - E_i)^2 - \omega^2}, \quad (6)$$

$$\alpha_t(\omega) = 4C \sum_k (-1)^{J_i+J_k} \begin{Bmatrix} J_i & 1 & J_k \\ 1 & J_i & 2 \end{Bmatrix} \times \frac{\langle k\|D\|i\rangle^2 (E_k - E_i)}{(E_k - E_i)^2 - \omega^2},$$

where C is given by $$C = \left( \frac{5J_i(2J_i-1)}{6(J_i+1)(2J_i+1)(2J_i+3)} \right)^{1/2}$$

We calculate two such contributions for the $^1S_0$ polarizability and 15 contributions for the $^3P_1$ polarizability with ab initio energies and matrix elements that exactly correspond to our calculations using the inhomogeneous Eq. (5) and determine the remainder contribution of all other states. Then we do the same calculation using the experimental energies and recommended values of matrix elements from Ref [91] where available. The recommended value for the $^1S_0 \leftrightarrow {}^1P_1$ matrix element is from the $^1P_1$ lifetime measurement [94]. We add the core and the remainder contribution from the other states (labeled as "Other" in Table 1) to these values to obtain the final results.

The results of this calculation for 520 nm and 515.2 nm are listed in Table 1 in atomic units (a.u.), as well as the energy difference $\Delta E = E_k - E_i$ in cm$^{-1}$ and the absolute values of the reduced electric-dipole matrix elements D in $\alpha_0|e|$ (a.u.), where $\alpha_0$ is the Bohr radius and e is the elementary charge. The core and remainder contributions are also listed[1]. We carry out the same calculations for the other wavelengths to determine the magic wavelengths for which $^1S_0$ and $^3P_1$ polarizabilities have the same values. The results of the ab initio calculation and the calculations corresponding to Table 1 (recommended) are illustrated in FIG. 6.

[1] We use the conventional system of atomic units, a.u., in which e, the electron mass $m_e$, and the reduced Planck constant $\hbar$ have the numerical value 1, and the electric constant $\epsilon_0$ has the numerical value $1/(4\pi)$. The atomic units for $\alpha$ can be converted to SI units via $\alpha/h$ [Hz/(V/m)$^2$]=2.48832×10$^{-8}\alpha$[a.u.], where the conversion coefficient is $4\pi\epsilon_0\alpha_0^3/h$ and the Planck constant h is factored out.

I.3 Example Calculating the Q Value

TABLE 2

Polarizabilities and Q values of the $5s^2$ $^1S_0$ and $5s5p$ $^3P_1$ states in a.u. at 515.2 nm for Sr. The recommended Q values are obtained using the polarizability values provided in Table 1. The Q values listed in the row labeled "Expt. energy" are obtained using the experimental energies and theoretical matrix elements.

| | | | | $\alpha(^3P_1)$ | | |
|---|---|---|---|---|---|---|
| Method | $\alpha(^1S_0)$ | $\alpha_s(^3P_1)$ | $\alpha_t(^3P_1)$ | $m_j = 0$ | $m_j = \pm 1$ | Q |
| Ab initio | 910 | 754 | −103 | 960 | 651 | −5.1 |
| Expt. energy | 951 | 776 | −113 | 1002 | 664 | −5.6 |
| Recm. | 942 | 769 | −111 | 990 | 659 | −5.8 |

We use the polarizability results to calculate the Q value, defined as the ratio of differential polarizabilities $$Q = \frac{\alpha(^1S_0) - \alpha(^3P_1 | m_j = \pm 1\rangle)}{\alpha(^1S_0) - \alpha(^3P_1 | m_j = 0\rangle)}. \quad (7)$$

Our results are summarized in Table 2. We note that varying the recommended matrix elements D within their estimated uncertainties $\Delta D$, i.e., using the D+$\Delta$D and D−$\Delta$D values of the matrix elements, gives Q=−4 and Q=−10 values despite only 2% changes in the $^3P_1$ polarizabilities. Therefore, Q is an excellent new benchmark of the theoretical methodologies, since it is extremely sensitive to even small changes in several matrix elements. We note that only the uncertainties in the values of 5 matrix elements, $5s5d$ $^3D_{1,2}$ and $5p^2$ $^3P_{0,1,2}$, contribute significantly to the uncertainty of the Q value. We compare the theoretical Q-value to experimental measurements in App. 2C.

I.4 Example Calculating the Branching Ratio

We obtain $\langle {}^1D_2\|D\|{}^1P_1\rangle$=1.956 a.u. in the CI+all-order approximation with RPA corrections to the effective dipole operator. Including other small corrections described in Ref [89] yields the final value $\langle {}^1D_2\|D\|{}^1P_1\rangle=1.92(4)$ a.u. The E1 transition rate A is determined using $$A = \frac{2.02613 \times 10^{18}}{(2J_a+1)\lambda^3} S(E1), \tag{8}$$

where the transition wavelength $\lambda$ is in Å and the line strength S is in atomic units. Using $\langle {}^1S_0\|D\|{}^1P_1\rangle=5.248(2)$ a.u. we obtain $$A({}^1P_1 \to {}^1D_2) = 9.25(40) \times 10^3 s^{-1} \tag{9}$$

$$A({}^1P_1 \to {}^1S_0) = 1.9003(15) \times 10^8 s^{-1}. \tag{10}$$

The resulting ratio is $$\frac{A({}^1P_1 \to {}^1S_0)}{A({}^1P_1 \to {}^1D_2)} \approx 20500(900). \tag{11}$$

II Example Experimental Tuning and Measurement of Polarizabilities

II.1 Polarizability Tuning with Elliptical Polarization

The dependence of polarizability (and hence trap depth) on trap polarization can be derived analytically by solving for the eigenvalues of the AC Stark Hamiltonian [88, 95]. We begin by writing the optical trapping field in a particular point in space as $$\vec{E}(t) = \vec{E}^{(+)} e^{-i\omega t} + \vec{E}^{(-)} e^{+i\omega t}, \tag{12}$$

where $\vec{E}^{(+)} = E_0 \hat{\epsilon}$, $\vec{E}^{(-)}$ is the complex conjugate of $\vec{E}^{(+)}$, and $\hat{\epsilon}$ is the complex unit polarization vector. We parameterize the ellipticity of $\hat{\epsilon}$ by the ellipticity angle $\gamma$ [54, 96], writing $$\hat{\epsilon}(\gamma) = \cos(\gamma)\hat{x} + i\sin(\gamma)\hat{y}. \tag{13}$$

Here, we use a Cartesian coordinate system defined by the unit vectors $\{\hat{x}, \hat{y}, \hat{z}\}$, with $\hat{z}$ oriented along the $\vec{k}$ vector of the optical tweezer. We neglect axial components and spatial variation of the polarization caused by non-paraxial effects near the focal plane [17]. Linear polarization is given by $\gamma=0$ and circular by $\gamma=\pi/4$.

The trapping field acts as a perturbation to the bare atomic Hamiltonian, causing energy shifts (often referred to as AC Stark shifts or light shifts) and mixing of electronic levels. Using second-order time-dependent perturbation theory, and after organizing terms into a scalar, vector, and tensor contribution, we can write the perturbation on a particular sublevel manifold as a time-independent AC Stark Hamiltonian [88, 95]:

$$\mathcal{H} = -\alpha_s E_0^2 + \mu_B g_J \vec{B}_{eff}(\alpha_v) \cdot \vec{J} - \frac{3\alpha_t}{J(2J-1)}\left(\frac{1}{2}\{\vec{E}^{(+)} \cdot \vec{J}, \vec{E}^{(-)} \cdot \vec{J}\} - \frac{1}{3}J(J+1)E_0^2\right), \tag{14}$$

where $\{\cdot,\cdot\}$ is the anticommutator, $\alpha_s$, $\alpha_v$, and $\alpha_t$ are the scalar, vector, and tensor polarizabilities, $g_J$ is the Landé g-factor, $\vec{B}_{eff}$ is an effective magnetic field (discussed below), and $\vec{J}$ is a vector whose components are the angular momentum operators. Here, we constrain ourselves to the ${}^3P_1$ sublevel manifold that has J=1. Hence, in our case $\mathcal{H}$ is a 3×3 matrix.

We define the effective magnetic field in Eq. (14) as $$\vec{B}_{eff}(\alpha_v) = -\frac{\alpha_v}{\mu_B g_J J} i(\vec{E}^{(-)} \times \vec{E}^{(+)}) \tag{15}$$

$$= \frac{\alpha_v E_0^2}{\mu_B g_J J} \sin(2\gamma)\vec{e}_z. \tag{16}$$

This term, which is nonzero when the polarization has any ellipticity, induces a perturbation identical to that of a magnetic field perpendicular to the plane of ellipticity (in our case, along ẑ). Writing the Stark Hamiltonian in this way makes it easy to add the contribution of some external real magnetic field $\vec{B}_0$ by replacing $\vec{B}_{eff}(\alpha_v)$ with $\vec{B}_{tot} = \vec{B}_{eff}(\alpha_v) + \vec{B}_0$.

In the absence of external magnetic field ($\vec{B}_0 = 0$), the eigenvalues of the Stark Hamiltonian are given by $$h\nu_C(\gamma) = -(\alpha_s + \alpha_t) \cdot E_0^2 \tag{17}$$

$$h\nu_B(\gamma) = -(\alpha_s - (\alpha_t - f(\alpha_v, \alpha_t; \gamma))/2) \cdot E_0^2 \tag{18}$$

$$h\nu_A(\gamma) = -(\alpha_s - (\alpha_t + f(\alpha_v, \alpha_t; \gamma))/2) \cdot E_0^2, \tag{19}$$

where $$f(\alpha_v, \alpha_t; \gamma) = \sqrt{9\alpha_t^2 \cos^2(2\gamma) + 4\alpha_v^2 \sin^2(2\gamma)}, \tag{20}$$

is a mixing factor that depends on the vector polarizability, tensor polarizability, and ellipticity angle. Analytical formulas for the corresponding eigenvectors are possible for a quantization axis along $\hat{z}$, and are given, in unnormalized form, by $$|\phi_C(\gamma)\rangle = |m_j^z = 0\rangle \tag{21}$$

$$|\phi_B(\gamma)\rangle = g_-(\gamma)|m_j^z = +1\rangle + |m_j^z = -1\rangle \tag{22}$$

$$|\phi_A(\gamma)\rangle = -g_+(\gamma)|m_j^z = +1\rangle + |m_j^z = -1\rangle, \tag{23}$$

where $$g_\pm(\gamma) = \frac{f(\alpha_v, \alpha_t; \gamma) \pm 2\alpha_v \sin(2\gamma)}{3\alpha_t \cos(2\gamma)}. \tag{24}$$

The $|\phi_C(\gamma)\rangle = |m_j^z = 0\rangle$ eigenstate is independent of the ellipticity angle as is its corresponding eigenvalue, whereas the $|\phi_B(\gamma)\rangle$ and $|\phi_A(\gamma)\rangle$ eigenstates depend on the polarization ellipticity due to mixing of the bare $|m_j^z = \pm 1\rangle$ sublevels by the optical field.

For the special case of linear polarization ($\gamma=0$), we have $f(\alpha_v, \alpha_t; 0) = 3\alpha_t$, such that the eigenvalues are given by $$h\nu_C(0) = -(\alpha_s + \alpha_t) \cdot E_0^2 \tag{25}$$

$$h\nu_B(0) = -(\alpha_s + \alpha_t) \cdot E_0^2 \tag{26}$$

$$h\nu_A(0) = -(\alpha_s - 2\alpha_t) \cdot E_0^2. \tag{27}$$

The unnormalized eigenvectors for a quantization axis chosen along the propagation axis of the tweezer ($\hat{z}$) are given by $$|\phi_C(0)\rangle = |m_j^z = 0\rangle \quad (28)$$

$$|\phi_B(0)\rangle = |m_j^z = +1\rangle + |m_j^z = -1\rangle \quad (29)$$

$$|\phi_A(0)\rangle = -|m_j^z = +1\rangle + |m_j^z = -1\rangle. \quad (30)$$

A more common choice of quantization axis (used in App. I) is along the tweezer polarization ($\hat{x}$). For this choice, it is also more convenient to choose a different basis in the subspace of the degenerate $|\phi_B\rangle$ and $|\phi_C\rangle$ states, such that we can equivalently write (up to degeneracy)

$$|\phi_C(0)\rangle = |m_j^x = \pm 1\rangle \quad (31)$$

$$|\phi_B(0)\rangle = |m_j^x = \mp 1\rangle \quad (32)$$

$$|\phi_A(0)\rangle = |m_j^x = 0\rangle. \quad (33)$$

In the presence of an external longitudinal magnetic field, $\vec{B}_0 = B_z \hat{z}$, an analytical form for the eigenvalues and eigenvectors of the Stark Hamiltonian can be obtained by replacing the vector polarizability by $$\alpha_v \to \left(\alpha_v + \frac{g_j \mu_B B_z}{E_0^2 \sin(2\gamma)}\right). \quad (34)$$

This would be observed as an asymmetry in the energy spectra between left and right-handed ellipticities. We measure this asymmetry in our spectra and find it to be consistent with a longitudinal magnetic field on the order of ~15 mG. It is also possible to diagonalize the Stark Hamiltonian in the presence of transverse magnetic fields (i.e. in $\hat{x}$ or $\hat{y}$), although the resulting formulas are cumbersome. A transverse field would cause splitting of the otherwise degenerate $|\phi_B\rangle$ and $|\phi_C\rangle$ eigenstates at linear polarization ($\gamma=0$). Within our precision, we do not observe such a splitting and conclude that external transverse fields are sufficiently well-nullified.

II.2 Example Measuring the Differential Trap Depth

We measure the differential trap depth as a function of the ellipticity $\gamma$ by performing excitation-depletion spectroscopy (FIG. 4b) on the $^1S_0 \leftrightarrow {}^3P_1$ transitions and fitting the spectroscopy signal to a thermally broadened and power broadened spectral line (FIG. 7a). Specifically, we assume the spectroscopy signal measured after n repetitions of the excitation-depletion cycle to be expressed by $S_n(\nu) = S_0 \cdot (1 - p_t(\nu))^n$, where $S_0$ is the baseline signal measured in the absence of excitation-depletion pulses and $p_t(\nu)$ is the probability of pumping the atom from the ground state into a metastable dark state following a single excitation-depletion cycle. We further assume the transition probability to be proportional to the thermal energy distribution in the $^1S_0$ ground state, i.e., $p_t(\nu) \propto f(E(\nu))\Theta(E(\nu))$, where $$f(E) = \frac{1}{2} \frac{1}{(k_B T)^3} E^2 e^{-E/k_B T}$$

is the Boltzmann energy distribution for a three-dimensional harmonic oscillator and $\Theta(E)$ is the Heaviside function, which restricts the evaluation of the function to positive energy values.

The resonance condition for an atom at energy E can be written as $$E\left(1 - \frac{\alpha_e}{\alpha_g}\right) = \Delta U - h\Delta\nu.$$

Here, $\alpha_e$ and $\alpha_g$ are the polarizabilities of the excited and ground state, respectively. The differential trap depth is $\Delta U$ and the detuning from free space resonance is $\Delta\nu$. Importantly, when the detuning matches the differential trap depth, E is zero. Hence the edge of the thermal distribution yields the differential trap depth. Using this approach, we fit the spectroscopy signal to the thermally broadened spectral line and extract the differential trap depth (FIG. 7). To account for possible estimation errors associated with power broadening, we further fit the spectroscopy signal to a purely power broadened spectral line, $\tilde{S}_n(\nu) \propto g(\nu)$, where $g(\nu)$ is a normalized Lorentzian function. The mean of the Lorentzian fit provides a bound on the differential trap depth extracted from the cut-off edge that we use as a systematic error bar in FIG. 1d. (Even in the limit of extreme power broadening we expect the true value between the edge frequency and the center frequency of the Lorentzian fit.) Were the saturation parameter precisely known from independent measurements, the signal could be fit to a composite lineshape using $\tilde{S}_n(\nu) \propto S_n(\nu) * g(\nu)$.

II.3 Example Comparing Polarizabilities Between Measured and Computed Values We use the analytical form of the light shifts from Eq. (17-19) to simultaneously fit our experimental measurements of the differential trap depth (FIG. 7b) using the three free parameters $\{\alpha_s, \alpha_v, \alpha_t\}$. Without any assumptions on $E_0^2$ or $\alpha_g$, we can estimate the Q value defined in Eq. (7) from $$Q = \frac{\Delta\nu_C(0)}{\Delta\nu_A(0)} \quad (35)$$

$$= \frac{(\alpha_g - \alpha_C(0))E_0^2}{(\alpha_g - \alpha_A(0))E_0^2} \quad (36)$$

$$= \frac{\alpha(^1S_0) - \alpha(^3P_1 \mid m_j^x = \pm 1\rangle)}{\alpha(^1S_0) - \alpha(^3P_1 \mid m_j^x = 0\rangle)}, \quad (37)$$

where $\alpha_C(0) = \alpha_s + \alpha_t$ and $\alpha_A(0) = \alpha_s - 2\alpha_t$. The measured $Q = -5.1(3)$ value is consistent with the $Q \in [-5.8, -5.1]$ values estimated from our calculation of the polarizabilities (Table 2).

In addition, without any assumptions on $E_0^2$ or $\alpha_g$, we can extract the quantity $|\alpha_v|/|\alpha_t| = 0.10(4)$ from $\Delta\nu_{BA}(\gamma)/\Delta\nu_{BA}(0)$, where $\Delta\nu_{BA}(\gamma) = \Delta\nu_B(\gamma) - \Delta\nu_A(\gamma) = f(|\alpha_v|, |\alpha_t|; \gamma)E_0^2/h$.

III Example Experimental System

Our scientific apparatus has two ultra-high vacuum regions: the first region is a high flux atomic beam oven and Zeeman slower for strontium (AOSense, Inc.) with integrated transverse cooling in a two-dimensional magneto-optical trap (MOT); the second region is a large stainless steel chamber connected to a glass cell (Japan Cell) in which experiments are carried out. We observe vacuum lifetimes of up to 60 s in a magnetic trap loaded by optically pumping atoms to the metastable $^3P_2$ state.

We utilize four laser systems: a blue laser system, a red laser system, a repumping laser system, and a green trapping laser system. The blue laser system (Toptica Photonics, TA-SHG Pro System) is a 922 nm diode laser amplified by a tapered amplifier (TA) and frequency doubled in a bow-tie second harmonic generation (SHG) cavity. The red laser system is a 689 nm diode laser (Toptica Photonics, DL pro) locked to a high finesse optical cavity (Stable Laser Systems) and amplified with a home-built TA with a maximum output power of 500 mW. The green trapping laser system has a 10 W fiber laser (Azur Light Systems) at 515.2 nm operated in free space without any additional fibers. The repumping laser system has three diode lasers stabilized by a wavemeter (HighFinesse, WS/7) that are used to drive the $5s5p\ ^3P_{0,1,2} \leftrightarrow 5s6s\ ^3S_1$ transitions.

We further divide the red laser beam into three red MOT beams and three red cooling beams. The vertical and horizontal MOT beams are angled at 65° with respect to the vertical axis of the glass cell to pass aside two microscope objectives mounted vertically, whereas the transverse MOT beams are aligned with the strong axis of the magnetic field gradient. The red cooling beams are oriented along the radial (R1, R2) and axial (A) directions. The two orthogonal radial cooling beams are angled at 45° with respect to the transverse axis of the glass cell. The axial cooling beam is focused at the back aperture of the bottom objective to make it collimated at the output of the objective.

We cool atoms in a 3D MOT operating first on the $^1S_0 \leftrightarrow ^1P_1$ broad dipole-allowed blue transition ($\lambda$=460.9 nm, $\Gamma/2\pi$=30.2 MHz) and then on the $^1S_0 \leftrightarrow ^3P_1$ narrow spin-forbidden red transition ($\lambda$=689.5 nm, $\Gamma/2\pi$=7.4 kHz). We create a blue MOT of $50 \times 10^6$ atoms at a temperature of a few mK that we then transfer to a red MOT of roughly $10^6$ atoms at a temperature of 1.5 μK. To load atoms in magic tweezers, we hold the red MOT for 25 ms at a frequency of 220 kHz detuned to the red from the free space resonance and then load atoms into the tweezers for 12 ms at a frequency of 500 kHz detuned to the red from the free space resonance. The two pairs of three counter-propagating blue and red MOT beams are overlapped with dichroic mirrors.

We calibrate the free-space resonance frequency of the 7.4 kHz $^1S_0 \leftrightarrow ^3P_1$ transition by performing excitation-depletion spectroscopy on the red MOT (see FIG. 4b). We use an excitation-depletion cycle composed of a 689 nm excitation pulse of 40 μs and a 688 nm depletion pulse of 10 μs. We repeat this cycle up to five times to increase the depletion fraction, without significantly disturbing the resonance feature. By scanning the frequency of the excitation pulse in the low saturation regime, we determine the free space resonance with statistical error at the kHz level. We also use this technique to cancel stray magnetic fields by minimizing the Zeeman splitting observed in this feature.

We create two-dimensional arrays of optical tweezers using two acousto-optic deflectors (AA Opto-Electronic, DTSX-400-515) driven by polychromatic RF waveforms produced by two independent channels of an arbitrary waveform generator (Spectrum Instrumentation Corp., M4i6622-x8). We use a series of one-to-one telescopes (f=300 mm) to image the first AOD onto the second AOD and then the second AOD onto the back aperture of the bottom microscope objective. We stabilize the intensity of a single tweezer by monitoring the optical power after the first AOD and feeding back the output signal of a servo controller (New Focus, LB1005) into a voltage-variable attenuator (VVA) modulating the amplitude of the RF signal driving the first AOD. We use the same VVA to vary the trap depth of the tweezer.

We image atoms by scattering photons on the $^1S_0 \leftrightarrow ^1P_1$ transition with a transverse imaging beam oriented in the radial plane of the tweezer. The imaging beam is not retro-reflected to avoid standing waves or polarization gradients. We collect photons scattered by the atoms using two microscope objectives. The bottom objective, which is also used for focusing tweezers, images the scattered photons on a single-photon sensitive EMCCD camera (ANDOR, iXon 888), while the top objective collects additional photons that are retro-reflected back through the bottom objective to increase the photon collection efficiency.

We perform Sisyphus cooling and resolved sideband cooling using a combination of the four possible beam paths of the red laser: red MOT beams, radial cooling beams (R1, R2) and axial cooling beams (A). Although cooling can be achieved using several different beam geometries, we typically use the red MOT beams which allow us to cool in 3D and provide essentially all polarization components; however, retro-reflected cooling beams are not required for either Sisyphus cooling or sideband cooling. In particular, effective Sisyphus cooling is possible with only a single beam.

IV. Example Parity Projection

We prepare single atoms in tweezers using parity projection (PP). The initial number of atoms, N, loaded into the tweezer from the red MOT is assumed to follow a Poissonian distribution. This is projected onto a binary distribution by inducing pairwise loss between atoms in such a way that even values of N are projected to N=0 and odd values of N are projected to N=1. This approach to PP, which is ubiquitous in experiments with alkali atoms such as quantum gas microscopes [97, 98] and tweezers [14, 50], is induced by photo-association (PA) via diatomic molecular resonances [50]. Such molecular resonances have been identified for strontium in the electronically excited molecular potential which asymptotically corresponds to the $^3P_1$ state [41, 85]. The first vibrational bound state in this potential has a binding energy of −400 kHz with respect to the bare atomic resonance [41, 85].

We induce parity projection with a 60 ms excitation pulse on the $^1S_0 \leftrightarrow ^3P_1$ transition, detuned from the free-space resonance by −226 kHz (FIG. 8a). The probability of detecting an occupied tweezer before PP is greater than 99.95% for standard loading parameters, suggesting that numerous atoms are loaded into the trap on average. The occupation probability decreases and stabilizes to 0.5 for a long PP pulse (FIG. 8a, inset), characteristic of pairwise loss. Reliable single-atom preparation is further evidenced by the observation that the post-PP occupation probability of 0.5 is robust to the initial number of loaded atoms (FIG. 8b), which we can vary by loading our MOT for variable amounts of time, resulting in variable cloud densities.

A quantitative understanding of the location and width of the PA feature is outside the scope of this work, but the resonance appears to lie between the binding energy of the molecular state at −400 kHz and the red radial motional sideband of the atom in the trap at −211 kHz. We note that the internuclear separation of the molecular bound state in free space is 27 nm [41] and may be reduced in the tweezer due to strong harmonic confinement. The Franck-Condon overlap between the bare atomic $^1S_0$ state and the bound molecular state in $^3P_1$ depends strongly on the internuclear separation between the atoms in the tweezer. This separation decreases as the atoms are cooled, so PA rates are possibly enhanced by cooling, thus skewing this feature closer to the red radial motional sideband.

V. Example Fluorescence Imaging

V.1 Example Imaging Fidelity

We define imaging fidelity as the fraction of correctly identified images (a measure also known as classification accuracy). An image is identified as either positive or negative by counting the number of photons detected in a certain region of interest and comparing this number to a fixed classification threshold. We calculate fidelity by estimating the fraction of false positive and false negative identifications. These quantities are dependent on the choice of classification threshold, and different imaging conditions generally have different optimal choices of threshold. For our quoted imaging fidelities in FIG. 2b, we choose a fixed threshold for all times that is optimal for long times.

False positives are readily estimated by measuring the number of false positives in a region of the image near the region onto which the atom is imaged. We confirm that this nearby region produces the same number of false positives as the atomic region by also measuring the atomic region's false positives when atom loading is turned off.

False negatives occur when an atom does not scatter enough photons to be detected. This may happen because of two distinct reasons: (1) the imaging time was too short, or (2) the atom was lost before it could scatter enough photons. False negatives due to (1) are estimated by fitting the single-atom histogram peak to a gaussian and computing the area of this fit that is below the classification threshold. These types of false negatives tend to zero as imaging time is increased.

Estimating type (2) false negatives requires knowledge about the loss mechanisms in play. We show in the main text that we can reach regimes where losses are dominated by depopulation, such that the probability of loss is given by $p_s(N) = e^{-\chi \cdot N}$. Having measured $\chi$, we estimate type (2) false negatives by integrating $\chi \cdot p_s(N)$ (properly normalized as a probability distribution) from zero up to the N which corresponds to our classification threshold. These false negatives depend only on the location of the threshold and are independent of imaging time for sufficiently long times. Therefore, in the regime of long imaging times such that type (1) false negatives are negligible, optimal imaging fidelity is achieved for a choice of threshold which is a balance between minimizing false positives (requiring higher threshold) and minimizing type (2) false negatives (requiring lower threshold). If imaging were lossless, unity fidelity could be reached by imaging for a long time and setting the threshold sufficiently high.

Finally, we note that imaging fidelity may be increased in post-processing by weighing the photons detected on each pixel by the relative weight of that pixel in the averaged point spread function. We use this technique in all our quoted fidelities.

V.2 Example Collection Efficiency and Radiation Pattern

We estimate the number of scattered photons by counting photons detected on our camera and estimating the collection efficiency of our imaging system. This estimate takes into account the 0.84 sr solid angle of our NA=0.5 objective, the measured transmission through all optical elements (0.47), the quoted quantum efficiency of our camera (0.76 at 461 nm), and a calibration of the camera gain (390) via characterization of dark images [99]. We measure the number of detected photons by multiplying the number of photo-electron counts by a conversion factor proportional to the gain.

A large systematic error remains from the radiation pattern of the fluorescing atom. A naive guess is that it is a dipole pattern $(f(\theta) = \sin^2(\theta))$ oriented along the polarization of the imaging beam. In this case, the collection efficiency varies by up to a factor of 7.3 between a polarization in the radial plane (best case) and one along the tweezer axis (worst case).

We observe a dependence of the collection efficiency on imaging polarization that is consistent with a dipole pattern, insofar as collection is maximal when polarization is in the radial plane and minimal when it is axial. We find that radial polarization not only maximizes detected photons, but also minimizes loss per detected photon, confirming that it truly increases collection efficiency and not just the scattering rate.

However, a complete analysis of the radiation pattern would require accounting for the projection of the imaging beam polarization onto the coordinate frame defined by the tweezer polarization and estimating the scattering rates to each of the three non-degenerate states of $^1P_1$, each of which have different radiation patterns. We forgo such an analysis and instead assume that the radiation pattern is in between spherically symmetric and a dipole pattern along the radial plane. We argue that this is a reasonable assumption because our imaging polarization is in the radial plane and we have confirmed that this does produce the best collection efficiency. The collection efficiency of a radial dipole pattern is 1.4 times higher than that of a spherically symmetric pattern. This factor is the dominant source of error for $\chi^{-1}$.

VI Example Sisyphus Cooling

We measure the energy distribution of the atom after Sisyphus cooling using the adiabatic rampdown approach [59, 100]. Specifically, we measure the probability of an atom to remain in the tweezer after adiabatically ramping down the tweezer depth from its nominal value $U_0$ to some target value $U \leq U_0$. The cumulative energy distribution of the atom before the ramp down, $F(E/U_0)$, is obtained from the survival probability of the atom in the trap, $p_s(U/U_0)$, after converting the trap depth $U/U_0$ to the initial energy of the atom $E/U_0$ using the conservation of action argument [59]. The mean energy of the atom is computed by integrating the cumulative energy distribution.

VII Example Sideband Thermometry

Unlike Raman sideband transitions which can be coherently driven without decay [16, 17], sideband transitions via direct excitation to $^3P_1$ have inherent decay. This complicates analysis because probing the sideband spectrum is unavoidably perturbative. Since probing on the red sideband cools while probing on the blue sideband heats, the measured spectrum exhibits exaggerated asymmetry, and a naive analysis would underestimate the temperature.

We therefore fit our measured sideband spectra to numerical simulation in order to extract a ground state fraction. We simulate a driven 1D quantum harmonic oscillator, with decay implemented via quantum jumps [101]. The Hilbert space is defined as a product space of 20 motional states and 2 electronic states ($|g\rangle$ and $|e\rangle$). The non-Hermitian effective Hamiltonian is given by $$\mathcal{H}_{eff} = \mathcal{H}_o + \mathcal{H}_I + \mathcal{H}_\Gamma \qquad (38)$$

$$\mathcal{H}_o = \hbar\omega(\alpha^\dagger\alpha + \tfrac{1}{2}) \qquad (39)$$

$$\mathcal{H}_I = \hbar\delta|e\rangle\mathcal{H}e| + \tfrac{1}{2}\hbar\Omega(e^{i\eta(\alpha+\alpha^\dagger)}|e\rangle\mathcal{H}g| + h.c.) \qquad (40)$$

$$\mathcal{H}_\Gamma = -i\tfrac{1}{2}\hbar\Gamma, \qquad (41)$$

where ω is the angular trap frequency, δ is the detuning, Ω is the Rabi frequency, η is the Lamb-Dicke parameter, and Γ=2π×7.4 kHz is the decay rate of the $^3P_1$ state.

The simulation proceeds in Δt=1 μs timesteps. At each timestep, the evolution operator $$e^{-\tfrac{1}{\hbar}H_{eff}\Delta t}$$

is applied to the state $|\psi\rangle$. $|\psi\rangle$ is then normalized and the probability of a quantum jump is computed as $p_{QJ} = p_e \Gamma \Delta t$, where $p_e = |\mathcal{H}e|\psi\rangle|^2$ is the excited state population. A quantum jump applies the operator $e^{i\vec{k}\cdot\vec{x}}|g\rangle\mathcal{H}e|$ to $|\psi\rangle$, where $\vec{k}$ is the wavevector corresponding to 689 nm light in a direction sampled from a dipole pattern. Although the quantum jump operator is defined in 3 real dimensions, only its projection onto the relevant dimension is used.

We run this simulation up to the same amount of time (74 μs) used for the probe in experiment. In experiment, we use 3 such probe cycles, where at the end of each we use the 688 nm transition to project the electronic state to either the ground state or one of two $^3P_J$ metastable states. In simulation, this is implemented by running the probe cycle up to 3 times, where at the end of each cycle the quantum state is projected to the excited state with probability $\alpha \cdot p_e$, where α=0.7 is a projection fidelity factor which we find is necessary for a good fit to our data. If the state is projected to the excited state, the simulation ends (representing loss, as measured in experiment). If the state is projected to the ground state instead, the simulation either completes one more cycle or ends if 3 cycles have already been completed. As there is also some baseline loss in our data, we implement this in post-simulation by projecting ground state populations to the excited state with probability given by our measured baseline loss.

We compare the excited state population computed in simulation with the loss fraction measured in experiment. As quantum jump is a stochastic method, we average over 2000 trials to obtain the final density matrix for each δ in our spectrum. The SI used in simulation is chosen to fit the width of the carrier peak observed in experiment, and co is chosen to fit the sideband frequency.

We simulate spectra for various ground state fractions. Ground state fraction is initialized by sampling the initial quantum state $|\psi(t=0)\rangle$ from a thermal distribution of motional eigenstates. For each ground state fraction, we fit the amplitude of the red and blue sidebands and compute the ratio. We compare this to the ratio obtained by performing the same fit on our experimentally measured spectra, and find a range of ground state fractions for which our data is compatible with simulation (FIG. 9).

Measuring time is central to all sciences. Currently, the most accurate and stable clocks are based on optical interrogation of either a single ion or an ensemble of neutral atoms confined in an optical lattice. Here we demonstrate a new optical clock system based on a trapped atomic array that is read out at the single particle level, merging many of the benefits of ion and lattice clocks as well as creating a bridge to recently developed techniques in quantum simulation and computing with neutral atoms. We use this approach for evaluation of single-site resolved frequency shifts and systematics, and for atom-by-atom statistical analysis and feedback control. The system also features strongly suppressed interaction shifts and short dead time, all in a comparatively simple experimental setup. This sets out a new pathway for advancing stationary and transportable clock systems and provides a novel starting point for entanglement-enhanced metrology and quantum clock networks as well as for single-atom based thermometry. The demonstrated techniques also enable applications in quantum computing and communication with individual neutral atoms requiring optical clock state control.

REFERENCES FOR PART A (TRAPPING EMBODIMENT)

The following references are incorporated by reference herein

[1] Henning Labuhn, Daniel Barredo, Sylvain Ravets, Sylvain de L'es'eleuc, Tommaso Macr'Λ, Thierry Lahaye, and Antoine Browaeys, "Tunable two-dimensional arrays of single Rydberg atoms for realizing quantum Ising models," Nature 534, 667-670 (2016).

[2] Hannes Berrien, Sylvain Schwartz, Alexander Keesling, Harry Levine, Ahmed Omran, Hannes Pichler, Soon-won Choi, Alexander S. Zibrov, Manuel Endres, Markus Greiner, Vladan Vuleti'c, and Mikhail D. Lukin, "Probing many-body dynamics on a 51-atom quantum simulator," Nature 551, 579-584 (2017).

[3] Vincent Lienhard, Sylvain de L'es'eleuc, Daniel Barredo, Thierry Lahaye, Antoine Browaeys, Michael Schuler, Louis-Paul Henry, and Andreas M. Lauchli, "Observing the space- and time-dependent growth of correlations in dynamically tuned synthetic Ising antiferromagnets," (2017), arXiv:1711.01185.

[4] Antoine Browaeys, Daniel Barredo, and Thierry Lahaye, "Experimental investigations of dipoledipole interactions between a few Rydberg atoms," J. Phys. B At. Mol. Opt. Phys. 49, 152001 (2016).

[5] M Saffman, "Quantum computing with atomic qubits and Rydberg interactions: progress and challenges," J. Phys. B At. Mol. Opt. Phys. 49, 202001 (2016).

[6] Harry Levine, Alexander Keesling, Ahmed Omran, Hannes Berrien, Sylvain Schwartz, Alexander S. Zi-brov, Manuel Endres, Markus Greiner, Vladan Vuleti'c, and Mikhail D. Lukin, "High-fidelity control and entanglement of Rydberg atom qubits," (2018), arXiv: 1806.04682.

[7] A. M. Kaufman, B. J. Lester, M. Foss-Feig, M. L. Wall, a. M. Rey, and C. a. Regal, "Entangling two trans-portable neutral atoms via local spin exchange," Nature 527, 208-211 (2015).

[8] A M Kaufman, B J Lester, C M Reynolds, M L Wall, M Foss-Feig, K R a Hazzard, a M Rey, and C a Regal, "Two-particle quantum interference in tunnel-coupled optical tweezers," Science 345, 306-309 (2014).

[9] S. Murmann, F. Deuretzbacher, G. Zu¨rn, J. Bjerlin, S. M. Reimann, L. Santos, T. Lompe, and S. Jochim, "Antiferromagnetic Heisenberg Spin Chain of a Few Cold Atoms in a One-Dimensional Trap," Phys. Rev. Lett. 115, 215301 (2015).

[10] J. D. Thompson, T. G. Tiecke, N. P. de Leon, J. Feist, A. V. Akimov, M. Gullans, A. S. Zibrov, V. Vuletic, and M. D. Lukin, "Coupling a Single Trapped Atom to a Nanoscale Optical Cavity," Science 340, 1202-1205 (2013).

[11] A. Goban, C.-L. Hung, S.-P. Yu, J. D. Hood, J. A. Muniz, J. H. Lee, M. J. Martin, A. C. McClung, K. S. Choi, D. E. Chang, O. Painter, and H. J. Kimble, "Atom-light inter-actions in photonic crystals," Nat. Commun. 5 (2014), 10.1038/ncomms4808.

[12] R Miller, T E Northup, K M Birnbaum, A Boca, A D Boozer, and H J Kimble, "Trapped atoms in cavity QED: coupling quantized light and matter," J. Phys. B At. Mol. Opt. Phys. 38, S551-S565 (2005).

[13] D. Frese, B. Ueberholz, S. Kuhr, W. Alt, D. Schrader, V. Gomer, and D. Meschede, "Single Atoms in an Op-tical Dipole Trap: Towards a Deterministic Source of Cold Atoms," Phys. Rev. Lett. 85, 3777-3780 (2000).

[14] Nicolas Schlosser, Georges Reymond, Igor Protsenko, and Philippe Grangier, "Sub-poissonian loading of single atoms in a microscopic dipole trap," Nature 411, 1024-1027 (2001).

[15] Karl D. Nelson, Xiao Li, and David S. Weiss, "Imaging single atoms in a three-dimensional array," Nat. Phys. 3, 556-560 (2007).

[16] A. M. Kaufman, B. J. Lester, and C. A. Regal, "Cooling a Single Atom in an Optical Tweezer to Its Quantum Ground State," Phys. Rev. X 2, 041014 (2012).

[17] J. D. Thompson, T. G. Tiecke, A. S. Zibrov, V. Vuleti'c, and M. D. Lukin, "Coherence and Raman sideband cooling of a single atom in an optical tweezer," Phys. Rev. Lett. 110, 133001 (2013), arXiv:1209.3028.

[18] D. Barredo, S. de Leseleuc, V. Lienhard, T. Lahaye, and A. Browaeys, "An atom-by-atom assembler of defect-free arbitrary two-dimensional atomic arrays," Science 354, 1021-1023 (2016).

[19] M. Endres, H. Bernien, A. Keesling, H. Levine, E. R. Anschuetz, A. Krajenbrink, C. Senko, V. Vuletic, M. Greiner, and M. D. Lukin, "Atom-by-atom assem-bly of defect-free one-dimensional cold atom arrays," Science 354, 1024-1027 (2016).

[20] Hyosub Kim, YeJe Park, Kyungtae Kim, H.-S. Sim, and Jaewook Ahn, "Detailed Balance of Thermalization Dy-namics in Rydberg-Atom Quantum Simulators," Phys. Rev. Lett. 120, 180502 (2018).

[21] Carsten Robens, Jonathan Zopes, Wolfgang Alt, Ste-fan Brakhane, Dieter Meschede, and Andrea Alberti, "Low-Entropy States of Neutral Atoms in Polarization-Synthe-sized Optical Lattices," Phys. Rev. Lett. 118, 065302 (2017).

[22] Daniel Barredo, Vincent Lienhard, Sylvain de L'es'eleuc, Thierry Lahaye, and Antoine Browaeys, "Synthetic three-dimensional atomic structures assembled atom by atom," Nature 561, 79-82 (2018).

[23] Aishwarya Kumar, Tsung-Yao Wu, Felipe Giraldo, and David S. Weiss, "Sorting ultracold atoms in a three-dimensional optical lattice in a realization of Maxwell's demon," Nature 561, 83-87 (2018).

[24] Malte Schlosser, Sascha Tichelmann, Jens Kruse, and Gerhard Birkl, "Scalable architecture for quantum in-formation processing with atoms in optical micro-struc-tures," Quantum Inf. Process. 10, 907-924 (2011).

[25] M. J. Piotrowicz, M. Lichtman, K. Maller, G. Li, S. Zhang, L. Isenhower, and M. Saffman, "Two-dimensional lattice of blue-detuned atom traps using a projected Gaussian beam array," Phys. Rev. A 88, 013420 (2013).

[26] F. Nogrette, H. Labuhn, S. Ravets, D. Barredo, L. B'eguin, A. Vernier, T. Lahaye, and A. Browaeys, "Single-Atom Trapping in Holographic 2D Arrays of Microtraps with Arbitrary Geometries," Phys. Rev. X 4, 021034 (2014).

[27] Stefan Kuhr, "Quantum-gas microscopes: a new tool for cold-atom quantum simulators," Natl. Sci. Rev. 3, 170-172 (2016).

[28] R. Blatt and C. F. Roos, "Quantum simulations with trapped ions," Nat. Phys. 8, 277-284 (2012).

[29] C. Monroe and J. Kim, "Scaling the Ion Trap Quantum Processor," Science 339, 1164-1169 (2013).

[30] M. H. Devoret and R. J. Schoelkopf, "Superconducting Circuits for Quantum Information: An Outlook," Science 339, 1169-1174 (2013).

[31] Andrew D. Ludlow, Martin M. Boyd, Jun Ye, E. Peik, and P. O. Schmidt, "Optical atomic clocks," Rev. Mod. Phys. 87, 637-701 (2015).

[32] Tetsuya Ido and Hidetoshi Katori, "Recoil-Free Spec-troscopy of Neutral Sr Atoms in the Lamb-Dicke Regime," Phys. Rev. Lett. 91, 053001 (2003).

[33] Hidetoshi Katori, "Optical lattice clocks and quantum metrology," Nat. Photonics 5, 203-210 (2011).

[34] A. V. Gorshkov, M. Hermele, V. Gurarie, C. Xu, P. S. Julienne, J. Ye, P. Zoller, E. Demler, M. D. Lukin, and A. M. Rey, "Two-orbital SU(N) magnetism with ultracold alkaline-earth atoms," Nat. Phys. 6, 289-295 (2010).

[35] Guido Pagano, Marco Mancini, Giacomo Cappellini, Pietro Lombardi, Florian Scha¨fer, Hui Hu, Xia-Ji Liu, Jacopo Catani, Carlo Sias, Massimo Inguscio, and Leon-ardo Fallani, "A one-dimensional liquid of fermions with tunable spin," Nat. Phys. 10, 198-201 (2014).

[36] F. Scazza, C. Hofrichter, M. H¨ofer, P. C. De Groot, I. Bloch, and S. F¨olling, "Observation of two-orbital spin-exchange interactions with ultracold SU(N)-symmetric fermions," Nat. Phys. 10, 779-784 (2014).

[37] G. Cappellini, M. Mancini, G. Pagano, P. Lombardi, L. Livi, M. Siciliani de Cumis, P. Cancio, M. Pizzocaro, D. Calonico, F. Levi, C. Sias, J. Catani, M. Inguscio, and L. Fallani, "Direct Observation of Coherent Interor-bital Spin-Exchange Dynamics," Phys. Rev. Lett. 113, 120402 (2014).

[38] M. Mancini, G. Pagano, G. Cappellini, L. Livi, M. Rider, J. Catani, C. Sias, P. Zoller, M. Inguscio, M. Dalmonte, and L. Fallani, "Observation of chiral edge states with neutral fermions in synthetic Hall rib-bons," Science 349, 1510-1513 (2015).

[39] S. Kolkowitz, S. L. Bromley, T. Bothwell, M. L. Wall, G. E. Marti, A. P. Koller, X. Zhang, A. M. Rey, and J. Ye, "Spinorbit-coupled fermions in an optical lattice clock," Nature 542, 66-70 (2017).

[40] Simon Stellmer, Florian Schreck, and Thomas C. Kil-lian, "Degenerate quantum gases of strontium," Annu. Rev. Cold Atoms Mol. 1, 1-80 (2014), arXiv:1307.0601.

[41] T. Zelevinsky, M. M. Boyd, A. D. Ludlow, T. Ido, J. Ye, R. Ciury lo, P. Naidon, and P. S. Julienne, "Narrow Line Photoassociation in an Optical Lattice," Phys. Rev. Lett. 96, 203201 (2006).

[42] Ryuta Yamamoto, Jun Kobayashi, Takuma Kuno, Ko-hei Kato, and Yoshiro Takahashi, "An ytterbium quantum gas microscope with narrow-line laser cooling," New J. Phys. 18, 023016 (2016).

[43] Martin Miranda, Ryotaro Inoue, Yuki Okuyama, Aki-masa Nakamoto, and Mikio Kozuma, "Site-resolved imaging of ytterbium atoms in a two-dimensional optical lattice," Phys. Rev. A 91, 063414 (2015).

[44] G. Edward Marti, Ross B. Hutson, Akihisa Goban, Sara L. Campbell, Nicola Poli, and Jun Ye, "Imaging Optical Frequencies with 100 µHz Precision and 1.1 µm Resolu-tion," Phys. Rev. Lett. 120, 103201 (2018).

[45] R. Ta¨ıeb, R. Dum, J. I. Cirac, P. Marte, and P. Zoller, "Cooling and localization of atoms in laser-induced potential wells," Phys. Rev. A 49, 4876-4887 (1994).

[46] Vladyslav V. Ivanov and Subhadeep Gupta, "Laser-driven Sisyphus cooling in an optical dipole trap," Phys. Rev. A 84, 063417 (2011).

[47] Rudolf Grimm, Matthias Weidemu¨ller, and Yurii B. Ovchinnikov, "Optical Dipole Traps for Neutral Atoms," Adv. Atom. Mol. Opt. Phys. 42, 95-170 (2000).

[48] Hidetoshi Katori, Tetsuya Ido, and Makoto Kuwata-Gonokami, "Optimal Design of Dipole Potentials for Efficient Loading of Sr Atoms," J. Phys. Soc. Japan 68, 2479-2482 (1999).

[49] Thomas H. Loftus, Tetsuya Ido, Martin M. Boyd, An-drew D. Ludlow, and Jun Ye, "Narrow line cooling and momentum-space crystals," Phys. Rev. A 70, 063413 (2004).

[50] Kevin M. Jones, Eite Tiesinga, Paul D. Lett, and Paul S. Julienne, "Ultracold photoassociation spec-troscopy: Long-range molecules and atomic scattering," Rev. Mod. Phys. 78, 483-535 (2006).

[51] J. Ye, H. J. Kimble, and H. Katori, "Quantum State Engineering and Precision Metrology Using State-Insensitive Light Traps," Science 320, 1734-1738 (2008).

[52] D. Leibfried, R. Blatt, C. Monroe, and D. Wineland, "Quantum dynamics of single trapped ions," Rev. Mod. Phys. 75, 281-324 (2003).

[53] Huidong Kim, Hyok Sang Han, and D. Cho, "Magic Po-larization for Optical Trapping of Atoms without Stark-Induced Dephasing," Phys. Rev. Lett. 111, 243004 (2013).

[54] Till Rosenband, David D. Grimes, and Kang-Kuen Ni, "Elliptical polarization for molecular Stark shift compensation in deep optical traps," Opt. Express 26, 19821 (2018).

[55] L. R. Hunter, W. A. Walker, and D. S. Weiss, "Observation of an atomic Stark *E* electric-quadrupole interference," Phys. Rev. Lett. 56, 823-826 (1986).

[56] Brian J. Lester, Niclas Luick, Adam M. Kaufman, Collin M. Reynolds, and Cindy A. Regal, "Rapid Production of Uniformly Filled Arrays of Neutral Atoms," Phys. Rev. Lett. 115, 073003 (2015).

[57] B Zimmermann, T Mu¨ller, J Meineke, T Esslinger, and H Moritz, "High-resolution imaging of ultracold fermions in microscopically tailored optical potentials," New J. Phys. 13, 043007 (2011).

[58] C. S. Adams and E. Riis, "Laser cooling and trapping of neutral atoms," Prog. Quantum Electron. 21, 1-79 (1997).

[59] C. Tuchendler, A. M. Lance, A. Browaeys, Y. R. P. Sortais, and P. Grangier, "Energy distribution and cooling of a single atom in an optical tweezer," Phys. Rev. A 78, 033425 (2008).

[60] F. Diedrich, J. C. Bergquist, Wayne M. Itano, and D. J. Wineland, "Laser Cooling to the Zero-Point Energy of Motion," Phys. Rev. Lett. 62, 403-406 (1989).

[61] C. Monroe, D. M. Meekhof, B. E. King, S. R. Jefferts, W. M. Itano, D. J. Wineland, and P. Gould, "Resolved-Sideband Raman Cooling of a Bound Atom to the 3D Zero-Point Energy," Phys. Rev. Lett. 75, 4011-4014 (1995).

[62] K. Aikawa, A. Frisch, M. Mark, S. Baier, A. Rietzler, R. Grimm, and F. Ferlaino, "Bose-Einstein Condensa-tion of Erbium," Phys. Rev. Lett. 108, 210401 (2012).

[63] Mingwu Lu, Nathaniel Q. Burdick, Seo Ho Youn, and Benjamin L. Lev, "Strongly Dipolar Bose-Einstein Condensate of Dysprosium," Phys. Rev. Lett. 107, 190401 (2011).

[64] D. E. Chang, Jun Ye, and M. D. Lukin, "Controlling dipole-dipole frequency shifts in a lattice-based optical atomic clock," Phys. Rev. A 69, 023810 (2004).

[65] M. Schioppo, R. C. Brown, W. F. McGrew, N. Hinkley, R. J. Fasano, K. Beloy, T. H. Yoon, G. Milani, D. Nicolodi, J. A. Sherman, N. B. Phillips, C. W. Oates, and A. D. Ludlow, "Ultrastable optical clock with two cold-atom ensembles," Nat. Photonics 11, 48-52 (2017).

[66] L. I. R. Gil, R. Mukherjee, E. M. Bridge, M. P. A. Jones, and T. Pohl, "Spin Squeezing in a Rydberg Lattice Clock," Phys. Rev. Lett. 112, 103601 (2014).

[67] A. Arias, G. Lochead, S. Helmrich, and S. Whit-lock, "Realization of a Rydberg-dressed atomic clock," (2018), arXiv:1810.04151.

[68] Matthew A. Norcia, Julia R. K. Cline, Juan A. Muniz, John M. Robinson, Ross B. Hutson, Akihisa Goban, G. Edward Marti, Jun Ye, and James K. Thompson, "Frequency Measurements of Superradiance from the Strontium Clock Transition," Phys. Rev. X 8, 021036 (2018).

[69] Miguel A Cazalilla and Ana Maria Rey, "Ultracold Fermi gases with emergent SU(N) symmetry," Reports Prog. Phys. 77, 124401 (2014).

[70] L. Riegger, N. Darkwah Oppong, M. Hofer, D. R. Fer-nandes, I. Bloch, and S. F¨olling, "Localized Magnetic Moments with Tunable Spin Exchange in a Gas of Ul-tracold Fermions," Phys. Rev. Lett. 120, 143601 (2018).

[71] Michael Foss-Feig, Michael Hermele, and Ana Maria Rey, "Probing the Kondo lattice model with alkaline-earth-metal atoms," Phys. Rev. A 81, 051603 (2010).

[72] Andrew J. Daley, Martin M. Boyd, Jun Ye, and Pe-ter Zoller, "Quantum Computing with Alkaline-Earth-Metal Atoms," Phys. Rev. Lett. 101, 170504 (2008).

[73] A. V. Gorshkov, A. M. Rey, A. J. Daley, M. M. Boyd, J. Ye, P. Zoller, and M. D. Lukin, "Alkaline-Earth-Metal Atoms as Few-Qubit Quantum Registers," Phys. Rev. Lett. 102, 110503 (2009).

[74] A. J. Daley, J. Ye, and P. Zoller, "State-dependent lat-tices for quantum computing with alkaline-earth-metal atoms," Eur. Phys. J. D 65, 207-217 (2011).

[75] Andrew J. Daley, "Quantum computing and quantum-simulation with group-II atoms," Quantum Inf. Process. 10, 865-884 (2011).

[76] G. Pagano, F. Scazza, and M. Foss-Feig, "Fast and scalable quantum information processing with two-electron atoms in optical tweezer arrays," arXiv:1808.02503 (2018).

[77] Michael Foss-Feig, Michael Hermele, Victor Gurarie, and Ana Maria Rey, "Heavy fermions in an optical lattice," Phys. Rev. A 82, 053624 (2010).

[78] C L Vaillant, M P A Jones, and R M Potvliege, "Long-range RydbergRydberg interactions in calcium, strontium and ytterbium," J. Phys. B At. Mol. Opt. Phys. 45, 135004 (2012).

[79] R Mukherjee, J Millen, R Nath, M P A Jones, and T Pohl, "Many-body physics with alkaline-earth Ry-dberg lattices," J. Phys. B At. Mol. Opt. Phys. 44, 184010 (2011).

[80] G. Lochead, D. Boddy, D. P. Sadler, C. S. Adams, and M. P. A. Jones, "Number-resolved imaging of excited-state atoms using a scanning autoionization micro-scope," Phys. Rev. A 87, 053409 (2013).

[81] B. J. DeSalvo, J. A. Aman, C. Gaul, T. Pohl, S. Yoshida, J. Burgd¨orfer, K. R. A. Hazzard, F. B. Dunning, and T. C. Killian, "Rydberg-blockade effects in Autler-Townes spectra of ultracold strontium," Phys. Rev. A 93, 022709 (2016).

[82] C. Gaul, B. J. DeSalvo, J. A. Aman, F. B. Dunning, T. C. Killian, and T. Pohl, "Resonant Rydberg Dressing of Alkaline-Earth Atoms via Electromagnetically Induced Transparency," Phys. Rev. Lett. 116, 243001 (2016).

[83] Elizabeth M. Bridge, Niamh C. Keegan, Alistair D. Bounds, Danielle Boddy, Daniel P. Sadler, and Matthew P. A. Jones, "Tunable cw UV laser with <35 kHz absolute frequency instability for precision spectroscopy of Sr Rydberg states," Opt. Express 24, 2281 (2016).

[84] Julian Schmidt, Alexander Lambrecht, Pascal Weckesser, Markus Debatin, Leon Karpa, and Tobias Schaetz, "Optical Trapping of Ion Coulomb Crystals," Phys. Rev. X 8, 021028 (2018).

[85] G. Reinaudi, C. B. Osborn, M. McDonald, S. Kotochigova, and T. Zelevinsky, "Optical Production of Stable Ultracold Sr2 Molecules," Phys. Rev. Lett. 109, 115303 (2012).

[86] L. R. Liu, J. D. Hood, Y. Yu, J. T. Zhang, N. R. Hutzler, T. Rosenband, and K.-K. Ni, "Building one molecule from a reservoir of two atoms," Science 360, 900-903 (2018).

[87] M. A. Norcia, A. W. Young, and A. M. Kaufman, "Mi-croscopic control and detection of ultracold strontium in optical-tweezer arrays," arXiv:1810.06626 (2018).

[88] Daniel Adam Steck, Quantum and Atom Optics (available online at http://steck.us/teaching, 2007).

[89] M. S. Safronova, S. G. Porsev, U. I. Safronova, M. G. Kozlov, and Charles W. Clark, "Blackbody-radiation shift in the Sr optical atomic clock," Phys. Rev. A 87, 012509 (2013).

[90] M. S. Safronova, M. G. Kozlov, W. R. Johnson, and Dansha Jiang, "Development of a configuration-interaction plus all-order method for atomic calculations," Phys. Rev. A 80, 012516 (2009).

[91] S. G. Porsev, M. S. Safronova, and Charles W. Clark, "Relativistic calculations of C 6 and C 8 coefficients for strontium dimers," Phys. Rev. A 90, 052715 (2014).

[92] S. G. Porsev, Yu. G. Rakhlina, and M. G. Kozlov, "Electric-dipole amplitudes, lifetimes, and polarizabilities of the low-lying levels of atomic ytterbium," Phys. Rev. A 60, 2781-2785 (1999).

[93] J Mitroy, M S Safronova, and Charles W Clark, "Theory and applications of atomic and ionic polarizabilities," J. Phys. B At. Mol. Opt. Phys. 43, 202001 (2010).

[94] Masami Yasuda, Tetsuo Kishimoto, Masao Takamoto, and Hidetoshi Katori, "Photoassociation spectroscopy of 88Sr: Reconstruction of the wave function near the last node," Phys. Rev. A 73, 011403 (2006).

[95] Fam Le Kien, Philipp Schneeweiss, and Arno Rauschen-beutel, "Dynamical polarizability of atoms in arbitrary light fields: general theory and application to cesium," Eur. Phys. J. D 67, 92 (2013).

[96] P. Rosenbusch, S. Ghezali, V. A. Dzuba, V. V. Flambaum, K. Beloy, and A. Derevianko, "ac Stark shift of the Cs microwave atomic clock transitions," Phys. Rev. A 79, 013404 (2009).

[97] W. S. Bakr, A. Peng, M. E. Tai, R. Ma, J. Simon, J. I. Gillen, S. Folling, L. Pollet, and M. Greiner, "Probing the Superfluid-to-Mott Insulator Transition at the Single-Atom Level," Science 329, 547-550 (2010).

[98] Jacob F. Sherson, Christof Weitenberg, Manuel Endres, Marc Cheneau, Immanuel Bloch, and Stefan Kuhr, "Single-atom-resolved fluorescence imaging of an atomic Mott insulator," Nature 467, 68-72 (2010).

[99] Andrea Bergschneider, Vincent M. Klinkhamer, Jan Hendrik Becher, Ralf Klemt, Gerhard Zu¨rn, Philipp M. Preiss, and Selim Jochim, "Spin-resolved single-atom imaging of 6Li in free space," Phys. Rev. A 97, 063613 (2018).

[100] Wolfgang Alt, Dominik Schrader, Stefan Kuhr, Martin Mu¨ller, Victor Gomer, and Dieter Meschede, "Single atoms in a standing-wave dipole trap," Phys. Rev. A 67, 033403 (2003).

[101] Klaus Molmer, Yvan Castin, and Jean Dalibard, "Monte Carlo wave-function method in quantum optics," J. Opt. Soc. Am. B 10, 524 (1993).

Example: 2000-Times Repeated Imaging of Strontium Atoms in Clock-Magic Tweezer Arrays Optical lattice clocks of alkaline-earth(-like) atoms (AEAs) have reached record precision [1, 2] for which the exploration of fundamental physics, such as geodesy [3], gravitational waves [3], and even dark matter [5] is now a possibility. Yet, despite the precise optical control of AEAs that has been demonstrated in a low-entropy array [2], the ability to address and detect single atoms is currently lacking. Such single-atom control techniques would provide new avenues for optical clock systems. Specifically, they are required for realizing a myriad of quantum computing protocols for AEAs using clock states [6-10] and could provide the foundation for generating and probing entanglement for quantum-enhanced metrology [11, 12]. Optical tweezer (OT) techniques have matured into a powerful tool for single-atom control, e.g., they provide the versatility required for atom-by-atom assembly of defect-free arrays [13-17] and they automatically position single atoms at distances such that interaction shifts on the clock-transition are expected to be strongly reduced [18]. Further, OT experiments generally have fast experimental repetition rates and, as demonstrated below, enable repeated low-loss clock-state read-out without reloading atoms. Such techniques could provide a pathway for quasi-continuous interleaved clock operation in order to tame the Dick effect [19]. Since state-insensitive 'magic' trapping conditions are required for clock operation [20], tweezers operating at a clock-magic wavelength are highly suited for these directions.

Two-dimensional arrays of AEAs, specifically Sr [21, 22] and Yb [26], in optical tweezers have been demonstrated, including single-atom resolved imaging. Cooling during imaging has been performed on the narrow $^1S_0 \leftrightarrow ^3P_1$ intercombination line (see FIG. 10), see also [27]. To this end, trapping wavelengths have been chosen such that the differential polarizability on this transition is small, enabling motional sidebands to be spectrally resolved in the case of Sr [21, 22], but precluding the possibility of achieving a magic trapping condition for the optical clock transition. Significantly, a more versatile Sisyphus cooling mechanism [28] has been observed for Sr atoms [21, 23], providing a general pathway for cooling on narrow lines with strong polarizability mismatch. This observation combined with descriptions in [24, 25] should allow for tweezer trapping and cooling of AEAs—and more generally atoms with narrow transitions—in a very wide range of wavelengths.

Here, we demonstrate detection and cooling of single $^{88}$Sr atoms in clock-magic optical tweezer arrays of wavelength 813.4 nm [2, 12, 29-32] where the loss during imaging is suppressed by two orders of magnitude compared to work for Sr [21, 22]. Specifically, we find a survival probability of 0.99932(8) and a fidelity of 0.99991(1) for single atom detection, enabling us to perform repeated high-fidelity detection thousands of times. We also observe lifetimes under laser cooling of more than seven minutes.

These values provide a benchmark for simultaneous low-loss and high-fidelity imaging as well as trapping lifetimes for single neutral atoms, including work with alkalis [13-17, 33-35]. We expect this development to be important for improved scalability of atom-by-atom assembly schemes [13-17, 33] and for verifying high-fidelity quantum operations with neutral atoms [34, 36]. For example, the success probability in atom-by-atom assembly is fundamentally limited by $p_s^M$, where $p_s$ is the combined survival probability for two images and hold time for rearrangement, and M is the final array size [14]. Our work improves this fundamental limitation of $p_s^M \sim 0.5$ to $M \gtrsim 1000$, enabling in principle assembly of arrays with thousands of atoms in terms of imaging- and vacuum-limited lifetimes. Finally, we demonstrate single-shot clock-state resolved detection with average fidelity of 0.981(1) and average atom survival probability of 0.996(1), which could be used for repeated clock interrogation without reloading.

Experimental Techniques—

Single atoms are loaded stochastically from a narrow-line magneto-optical trap into an array of tweezers as described in detail in Ref [21]. In contrast with [21], we use 813.4 nm light to generate tweezers (FIG. 10a). While providing a magic-wavelength for the clock transition, this wavelength also closes a previously observed loss channel, providing the basis for the low-loss detection demonstrated here (FIG. 10b) [21, 22]. Further, the imaging scheme is simplified to a single not retro-reflected cooling beam at 689 nm and a retro-reflected imaging beam at 461 nm. Both beams propagate in the plane orthogonal to the tweezer propagation axis. The cooling (imaging) beam is polarized parallel (perpendicular) to the tweezer propagation axis. We modulate the retro-mirror of the imaging beam to wash out interference patterns [14]. The tweezers are linearly polarized and have a depth of $\approx 450$ μK and waist of $\approx 700$ nm. The array of 25 tweezers has a spacing of $\approx 7.4$ μm and is uniformized to within $\approx 2\%$ [21]. Tweezer arrays are generated with a bottom objective, while a second top objective is used to image the fluorescence light on an electron multiplied charge-coupled device (EMCCD) camera.

Cooling during imaging is based on a narrow-line attractive Sisyphus cooling scheme on the 7.4 kHz transition at 689 nm (FIG. 1c), following the original proposals in Refs. [24, 25], which has been observed in continuous beam deceleration [23]. In contrast to the repulsive Sisyphus cooling scheme demonstrated herein by our group [21], the attractive scheme relies on the excited state experiencing a significantly stronger trapping potential than the ground state. For linearly polarized trapping light, this situation is realized for the $m_J = \pm 1$ sublevels of $^3P_1$ in wavelengths ranging from 700 nm to $\approx 900$ nm. (For longer wavelengths, including 1064 nm, repulsive Sisyphus cooling can be used.) This enables us to fine-tune the wavelength to 813.4 nm, which is magic for the clock transition to $^3P_0$, while providing cooling conditions for the transition to $^3P_1$.

Imaging Results—

Our results show simultaneous high-fidelity and low-loss detection of single atoms. First, we observe a histogram of photons collected in 50 ms with clearly resolved count distributions corresponding to cases with no atom and a single atom (FIG. 11a). Taking a second image, after 29 ms hold time under Sisyphus cooling alone, we find a survival probability of 0.99932(8). At the same time, the fidelity of the scheme (defined by the accuracy of distinguishing no atom from a single atom [21] reaches a value of 0.99991(1), demonstrating simultaneous low-loss and high-fidelity imaging. These values are enabled by a lifetime under imaging conditions of more than two minutes (FIG. 11b), while requiring only tens of milliseconds to acquire enough photons. We also find lifetimes under Sisyphus cooling (without 461 nm light) that are longer than seven minutes.

These results enable us to repeatably image single atoms thousands of times. Specifically, we alternate between 50 ms long imaging blocks and 29 ms pure cooling blocks for 2000 times, and collect photons on the EMCCD camera in each imaging block. Recording the survival probability as a function of the number of images N, we find that even after 2000 high-fidelity images, the survival fraction stays above $\approx 0.5$. The decay follows an approximate exponential trend with $p_1^N$, where the single image survival probability is $P_1 \approx 0.9997$, slightly higher than the above quoted value measured with only two images. We note that the success probability in atom-by-atom assembly schemes is also limited by $p_1^{2N}$ as a function of the final array size. (The factor of two appears because two consecutive images with interleaved hold times are needed for successful rearrangement.) Our results indicate that assembly of systems with thousands of atoms could be possible in terms of imaging fidelity, loss probability, and lifetime during the assembly step.

Cooling Results—

These low-loss high-fidelity results are achieved by optimizing the Sisyphus cooling frequency and picking a conservative 461 nm scattering rate of $\approx 41$ kHz as detailed in the Supplemental Material (SM) and FIG. 12(a), 12(b).

In addition, attractive Sisyphus cooling without the 461 nm beam results in a radial temperature below 5 μK (FIG. 12(c), (d)), which we quote as a conservative upper bound based on a release-and-recapture technique [37, 38]. This technique is primarily sensitive to radial temperatures, and is compared to classical Monte-Carlo simulations to extract a temperature. However, comparison to classical simulation would overestimate actual temperatures that are close to or below the energy scale of the radial trapping frequency $$\left(T \lesssim \frac{\hbar \omega}{2k_B}\right),$$

which for us is roughly 2.4 μK. More precise measurement of lower temperatures could be done via resolved sideband spectroscopy, which we leave for further work. An open question in this context is whether cooling to the motional ground state can be achieved in the strongly off-magic cooling configuration used here.

As Sisyphus cooling occurs due to a trapping mismatch between ground and excited state, it is expected that cooling occurs in all directions even for a single radial cooling beam. The low loss we observe during imaging already provides evidence of this mechanism, as fluorescence recoil heating must be mitigated in all directions. Determination of the axial temperature after cooling can be achieved via techniques such as adiabatic rampdown [37, 39] or spectroscopy of thermally-broadened light shifts [21]. Our preliminary results with such techniques are consistent with three-dimensional temperatures similar to our quoted radial temperatures; however, we leave a thorough investigation to future work. We note that we have made no explicit attempt to further cool the axial direction, and that doing so is likely possible by applying a beam in that direction. Finally, we note that the clock-magic condition of our tweezers opens the door to well-resolved sideband thermometry on the clock transition, which would be required to see resolved axial sidebands that are otherwise poorly resolved on the intercombination line at our trapping frequencies.

Clock-State Resolved Detection—

Finally, as an outlook we characterize our ability to perform low-loss state-resolved read-out of the optical clock states $^1S_0=|g\mathcal{H}\rangle$ and $^3P_0=|e\mathcal{H}\rangle$. Our scheme relies on shelving techniques that are routinely used in ion trap experiments to realize low-loss, high-fidelity state-resolved detection [40-42]. They are also prevalent in optical lattice clocks with alkaline-earth atoms, but have not been extended to single-atom-resolved imaging [31, 32]. More generally, low-loss state-resolved detection of single neutral atoms has been realized only recently with alkali atoms [34, 35, 43-45]. Since in this case hyperfine states are used, simultaneous cooling during state-resolved detection is challenging and thus deep traps are required. This will limit scalability, and the approach has so far only been demonstrated in up to five traps [35]. Note that Stern-Gerlach detection of hyperfine spins via spatial separation in a lattice has been performed [34, 44], which provides an alternative route for high-fidelity lossless state-resolved detection.

Our scheme consists of two consecutive images (FIG. 13). In the first image, we aim at detecting atoms in $|g\mathcal{H}\rangle$. To this end, we turn off the 679 nm repump laser such that atoms in $|e\mathcal{H}\rangle$, in principle, do not scatter any photons. Hence, if we find a signal in the first image, we identify the state as $|g\mathcal{H}\rangle$. In the second image, we turn the 679 nm repump laser back on to detect atoms in both $|g\mathcal{H}\rangle$ and $|e\mathcal{H}\rangle$. Thus, if an atom is not detected in the first image but appears in the second image, we can identify it as $|e\mathcal{H}\rangle$. If neither of the images shows a signal, we identify the state as "no-atom".

We find that the inaccuracy of this scheme is dominated by off-resonant scattering of the tweezer light when atoms are shelved in $|e\rangle$ during the first image. Specifically, by pumping atoms into $|e\rangle$ before imaging, we observe that, at our trap depth of $\approx 450$ μK, they decay back to $|g\rangle$ with a time constant of $\tau_p=470(30)$ ms. This leads to events in the first image, where $|e\rangle$ atoms are misidentified as $|g\rangle$ atoms. To minimize the probability of misidentification, the first imaging time should be as short as possible. To reduce the imaging time, we compromise slightly on the survival probability in order to work with higher 461 nm scattering rates in the first image (see SM). Specifically we use t=15 ms at a scattering rate of $\approx 72$ kHz. The second image is performed with the same settings as in FIG. 11.

Additionally, atoms in $|g\rangle$ can be misidentified as $|e\rangle$ if they are pumped to $|e\rangle$ in the first image. This can occur either via the $^1D_2$ leakage channel and subsequent scattering of 707 nm photons, or via off-resonant scattering of the trap light from $^3P_1$ during cooling. We identify this misidentification probability by initializing atoms in $|g\rangle$, and counting how often we identify them as $|e\rangle$ in the state-resolved imaging scheme.

In summary, we place a conservative upper-bound for the probability of misidentifying $|e\rangle$ as $|g\rangle$ by $e^{-t/\tau_p}=0.031(2)$ and we directly measure the probability of misidentifying $|g\rangle$ as $|e\rangle$ yielding 0.008(1). We define the average state detection infidelity for a generic initial state as the mean of these probabilities [34], yielding an average state detection fidelity of 0.981(1). Further, we similarly define the average survival probability of the double imaging scheme in terms of the measured survival probabilities of $|g\rangle$ and $|e\rangle$, for which we obtain 0.996(1).

Our fidelity is comparable to recent measurements with alkali atoms in tweezers [35, 43, 45], yet our survival probability is substantially higher than any tweezer- or lattice-based schemes to our knowledge [34, 35, 43-45]. These results constitute an excellent setting for continuous measurement in an optical clock. However, we emphasize that this investigation was not exhaustive, and we expect that further optimization of these imaging parameters is possible. In general, these values could be further improved by either imaging in shallower tweezers or in tweezers at a wavelength further detuned from higher lying states. For instance, tweezers operating at 1064 nm are a promising possibility, and would be a convenient choice for operating a quantum gas microscope. Further, it is possible to switch between 813.4 nm tweezers/lattices for clock interrogation during which the trap depth can be orders of magnitude lower, and 1064 nm tweezers/lattices for imaging.

In conclusion, we have addressed two major limitations of tweezer arrays for optical clock-based quantum information processing and metrology. By working at the magic wavelength for clock operation, we observe imaging with a fidelity of 0.99991(1) and a survival probability of 0.99932 (8), and lifetimes under cooling of more than seven minutes. By employing a double imaging technique with specific combinations of repump lasers, we study low-loss state-resolved detection and observe an average fidelity of 0.981 (1) with an average survival probability of 0.996(1). This work provides a setting for continuous measurement in an optical clock which can suppress laser fluctuations due to the Dick effect [19, 46]. Clock operation on bosonic isotopes of AEAs such as $^{88}$Sr used in this work has been performed with Sr [47] and Yb [48, 49]. Moreover, the tools developed in this work enable excitation to highly-excited Rydberg states in the $^3S_1$ series via the clock state $^3P_0$. Engineering long-range Rydberg-mediated interactions will facilitate the generation of entanglement between optical clock qubits, which can be used for quantum information processing [50], quantum simulation [51, 52], and quantum-enhanced metrology via spin squeezing [11].

REFERENCES FOR EXAMPLE: 2000-TIMES REPEATED IMAGING OF STRONTIUM ATOMS IN CLOCK-MAGIC TWEEZER ARRAYS

The following references are incorporated by reference herein.
[1] A. D. Ludlow, M. M. Boyd, J. Ye, E. Peik, and P. O. Schmidt, Reviews of Modern Physics 87, 637 (2015).
[2] S. L. Campbell et al., Science 358, 90 (2017).
[3] J. Grotti et al., Nature Physics 14, 437 (2018).
[4] S. Kolkowitz et al., Physical Review D 94, 124043 (2016).
[5] P. Wcis lo et al., Nature Astronomy 1, 0009 (2016).
[6] A. J. Daley, M. M. Boyd, J. Ye, and P. Zoller, Physical Review Letters 101, 170504 (2008).
[7] A. V. Gorshkov et al., Physical Review Letters 102, 110503 (2009).
[8] A. J. Daley, J. Ye, and P. Zoller, The European Physical Journal D 65, 207 (2011).
[9] A. J. Daley, Quantum Information Processing 10, 865 (2011).
[10] G. Pagano, F. Scazza, and M. Foss-Feig, arXiv: 1808.02503 (2018).
[11] L. I. R. Gil, R. Mukherjee, E. M. Bridge, M. P. A. Jones, and T. Pohl, Physical Review Letters 112, 103601 (2014).
[12] M. A. Norcia et al., Physical Review X 8, 021036 (2018).
[13] D. Barredo, S. de Leseleuc, V. Lienhard, T. Lahaye, and A. Browaeys, Science 354, 1021 (2016).
[14] M. Endres et al., Science 354, 1024 (2016).

[15] H. Kim, Y. Park, K. Kim, H.-S. Sim, and J. Ahn, Physical Review Letters 120, 180502 (2018).
[16] A. Kumar, T.-Y. Wu, F. Giraldo, and D. S. Weiss, Nature 561, 83 (2018).
[17] C. Robens et al., Physical Review Letters 118, 065302 (2017).
[18] D. E. Chang, J. Ye, and M. D. Lukin, Physical Review A 69, 023810 (2004).
[19] M. Schioppo et al., Nature Photonics 11, 48 (2017).
[20] J. Ye, H. J. Kimble, and H. Katori, Science 320, 1734 (2008).
[21] A. Cooper et al., arXiv:1810.06537 (2018).
[22] M. A. Norcia, A. W. Young, and A. M. Kaufman, arXiv:1810.06626 (2018).
[23] C.-C. Chen, S. Bennetts, R. G. Escudero, F. Schreck, and B. Pasquiou, arXiv:1810.07157 (2018).
[24] R. Ta eb, R. Dum, J. I. Cirac, P. Marte, and P. Zoller, Physical Review A 49, 4876 (1994).
[25] V. V. Ivanov and S. Gupta, Physical Review A 84, 063417 (2011).
[26] S. Saskin, J. Wilson, B. Grinkemeyer, and J. Thompson, arXiv:1810.10517 (2018).
[27] R. Yamamoto, J. Kobayashi, T. Kuno, K. Kato, and Y. Takahashi, New Journal of Physics 18, 023016 (2016).
[28] D. J. Wineland, J. Dalibard, and C. Cohen-Tannoudji, Journal of the Optical Society of America B 9, 32 (1992).
[29] H. Katori, M. Takamoto, V. G. Pal'chikov, and V. D. Ovsiannikov, Physical Review Letters 91, 173005 (2003).
[30] M. Takamoto and H. Katori, Physical Review Letters 91, 223001 (2003).
[31] M. Takamoto, F.-L. Hong, R. Higashi, and H. Katori, Nature 435, 321 (2005).
[32] M. M. Boyd et al., Science 314, 1430 (2006).
[33] S. Kuhr, National Science Review 3, 170 (2016).
[34] T.-Y. Wu, A. Kumar, F. G. Mejia, and D. S. Weiss, arXiv:1809.09197 (2018).
[35] M. Kwon, M. F. Ebert, T. G. Walker, and M. Sa man, Physical Review Letters 119, 180504 (2017).
[36] H. Levine et al., (2018), 1806.04682.
[37] C. Tuchendler, A. M. Lance, A. Browaeys, Y. R. P. Sortais, and P. Grangier, Physical Review A 78, 033425 (2008).
[38] J. D. Thompson, T. G. Tiecke, A. S. Zibrov, V. Vuletic, and M. D. Lukin, Physical Review Letters 110, 133001 (2013), 1209.3028.
[39] W. Alt et al., Physical Review A 67, 033403 (2003).
[40] D. Leibfried, R. Blatt, C. Monroe, and D. Wineland, Reviews of Modern Physics 75, 281 (2003).
[41] A. H. Myerson et al., Physical Review Letters 100, 200502 (2008).
[42] T. P. Harty et al., Physical Review Letters 113, 220501 (2014).
[43] A. Fuhrmanek, R. Bourgain, Y. R. P. Sortais, and A. Browaeys, Physical Review Letters 106, 133003 (2011).
[44] M. Boll et al., Science 353, 1257 (2016).
[45] M. Martinez-Dorantes et al., Physical Review Letters 119, 180503 (2017).
[46] J. Lodewyck, P. G. Westergaard, and P. Lemonde, Physical Review A 79, 061401 (2009).
[47] T. Akatsuka, M. Takamoto, and H. Katori, Physical Review A 81, 023402 (2010).
[48] A. Taichenachev et al., Physical Review Letters 96, 083001 (2006).
[49] Z. Barber et al., Physical Review Letters 96, 083002 (2006).
[50] M. Saman, T. G. Walker, and K. Mlmer, Reviews of Modern Physics 82, 2313 (2010).
[51] H. Labuhn et al., Nature 534, 667 (2016).

Figure 1:
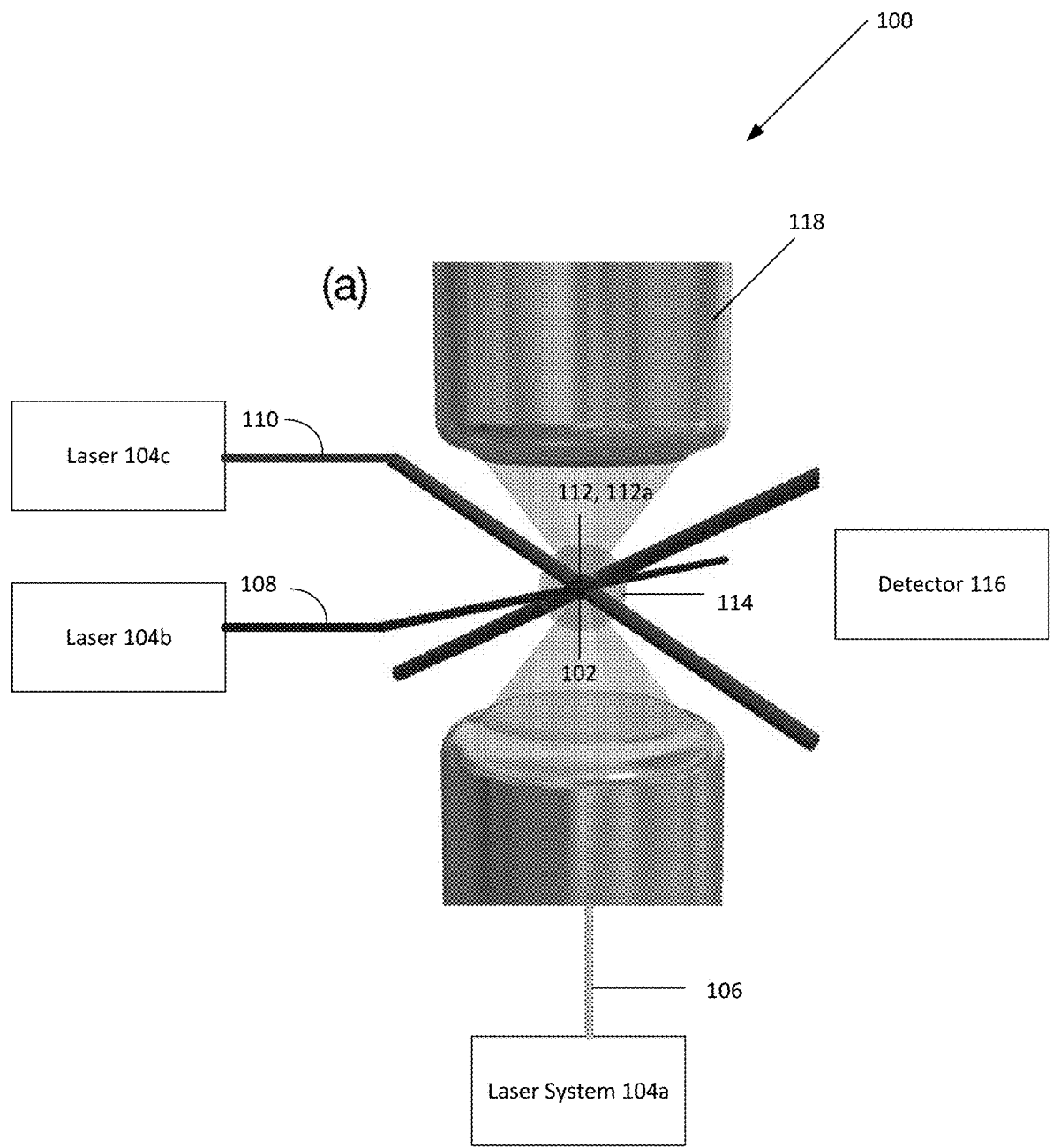
FIG. 1: Tweezer trapping of Strontium. (a-b) A single strontium atom is trapped in an optical tweezer (propagating upward along the $\hat{Z}$ direction) created by focusing a 515.2 nm laser beam through a microscope objective with NA=0.5 (bottom objective). The atom is imaged by scattering photons on the broad blue transition (461 nm) from a transverse imaging beam, while simultaneously being cooled on the narrow red transition (689 nm) with three red MOT beams (one red beam, overlapped with the imaging beam, is not shown). Fluorescence photons are collected with the bottom objective, while the top objective is mainly used for monitoring the tweezer light. (c) The applied narrow-line cooling mechanisms, sideband and Sisyphus cooling, depend crucially on the relative trapping potential between ground and three excited sub-levels of $^3P_1$. In a linearly polarized tweezer, these sub-levels can be labeled with angular momentum projection quantum numbers $m_j=-1,0,1$. In elliptical light, rotational symmetry is broken and the sub-levels are generally not angular momentum eigenstates anymore. Hence, we label these states with a different notation: $|\phi_C\rangle$, $|\phi_A\rangle$, $|\phi_B\rangle$ (from left to right). Two of the states shift as a function of ellipticity (dashed compared to solid lines). (d) Differential trap depth (proportional to differential polarizability) of the three sublevels of $^3P_1$ as a function of tweezer ellipticity angle γ, measured with excitation-depletion spectroscopy (App. 2 and Sec. 5). The tweezer polarization is given by $\vec{\epsilon}(\gamma)=\cos(\gamma)\hat{x}+i\sin(\gamma)\hat{y}$. The solid lines are a fit to the eigenvalues of the AC Stark Hamiltonian (App. 2). At the magic ellipticity angle γ=±24°, the differential polarizability between $^1S_0$ and $^3P_1|\phi_A\rangle$ vanishes (dashed-dotted line). The other two sublevels experience a weaker trapping potential (positive differential trap depths) for all γ.
Figure 1:
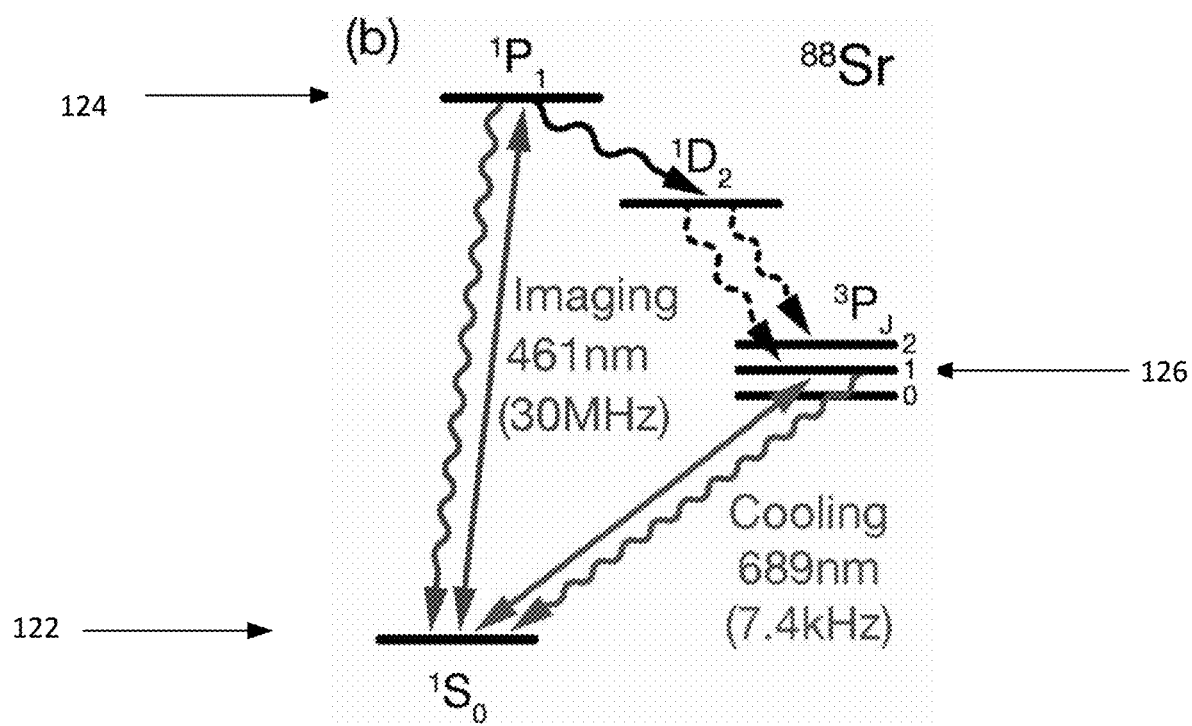
Figure 1:
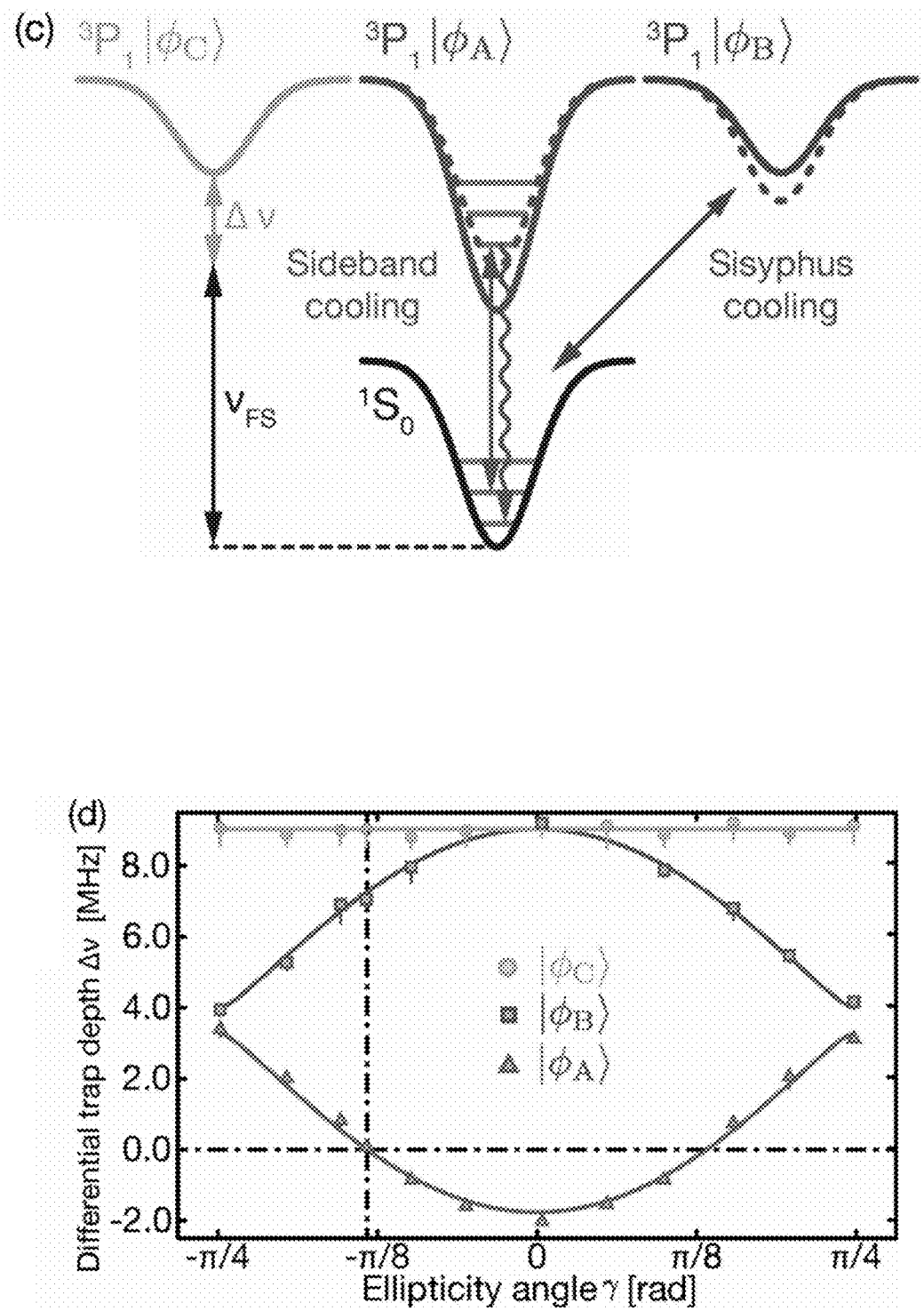

Part B. Apparatus for Quantum Metrology and Locking a Laser to Atomic Transitions Example Structure FIG. 1 and FIG. 10 illustrate an apparatus, comprising a laser emitting one or more first laser beams generating an array of (e.g., optical) traps each including a trapping potential; a plurality of atoms, wherein each of the trapping potentials trap a single one of the atoms, and one or more second laser beams irradiating the atoms so as to generate fluorescence; a detector detecting the presence or absence of the fluorescence and outputting one or more signals in response thereto; one or more third laser beams irradiating the atoms so as to cool each of the atoms; one or more fourth laser beams (e.g., clock lasers) tuned to excite a clock transition between the first energy level and the fourth energy level; a computer/processor generating an error signal using the signals; and a modulator modulating the fourth laser beam with the error corrected frequencies so as to excite the clock transition between the first level and the fourth level using the fourth laser beams having the one or more error corrected frequencies.

Each of the atoms have levels including a first energy level; a second energy level having an energy higher than the first energy level; a third energy level; and a fourth energy level higher than the first energy level and lower than the third energy level.

The second laser beam has a frequency and a polarization tuned to excite a first (e.g., optical) transition between the first energy level and the second energy level so that the fluorescence comprises spontaneous emission from the second energy level back to the first energy level (imaging with single atom resolution so as to identify atoms in each trap).

Detection Mechanism

The detector detects the presence or absence of the fluorescence so as to generate a signal representing a presence or absence of each of the atoms in the ground state (electron in first level) or in a clock state (an electron in the fourth level), imaging each atom individually.

The detector detecting the signals at plurality of times:

(1) after the atoms are prepared in the ground state, so that absence of the fluorescence indicates the atom does not occupy the trap (first signal);

(2) after excitation from the first energy level to the second energy level using the clock laser red detuned from the clock transition, so that presence of the fluorescence indicates the atom is in an excited state wherein an electron is in the first energy level (second signal);

(3) after the atoms are prepared in the ground state after step (2), so that absence of the fluorescence indicates the atom does not occupy the trap (third signal);

(4) after excitation from the first level to the second level using the clock laser blue detuned from the clock transition, so that presence of the fluorescence indicates the atom is in the excited state wherein an electron is in the first energy level (fourth signal).

Error Correction

The computer/processor generating an error signal using the signals, comprising determining which of the traps are occupied; and for each of the occupied traps:

(1) assigning a first error if the signal after the red detuning is higher than the signal after the blue detuning, indicating the frequency of the fourth laser beam should be increased to excite the clock transition, (2) assigning a second error if the signal after the red detuning is lower than the signal after the blue detuning, indicating the frequency of the fourth laser beam should be decreased to excite the clock transition, and (3) assigning a zero error if the signals after the red and blue detunings are the same, indicating the frequency of the fourth laser beam does not need to be corrected.

(4) converting the error signals to one or more error corrected frequencies.

In another example, the computer/processor generates an error signal using the signals, comprising determining which of the traps are occupied; and for each of the occupied traps:
(1) determines a first occupation number of the atom in the excited state wherein an electron is in the first energy level after excitation with the red detuning, and
(2) determines a second occupation number of the atom in the excited state wherein an electron is in the first level after excitation with the blue detuning,
(3) determines an error signal for each of the traps comprising a difference between the first occupation number and the second occupation number in each of the traps;
(4) converts the error signals to one or more error corrected frequencies.

As described herein, the modulator modulates the fourth laser beam with the error corrected frequencies so as to excite the clock transition between the first level and the fourth level using the fourth laser beams having the one or more error corrected frequencies.

In one or more examples, the computer averages the error signals from temporally and/or over each of the traps to obtain an average error signal used to generate the error corrected frequency comprising an average frequency.

In one or more examples, an error signal is generated for each atom in the trap using imaging of each of the atoms, so that the frequency of the fourth laser beam exciting the clock transition is corrected for each atom.

In one or more examples, the apparatus generates an average error signal comprising an average of the error signals for each atom, so that the frequency of the fourth laser beam exciting the clock transition is generated from the average error signal.

In one or more examples, the apparatus comprises spatially resolved sensor/diagnostic. In one or more examples, the trap comprises (e.g., optical) tweezers or an optical lattice or a laser trap.

Example: An Atomic Array Optical Clock with Single-Atom Readout

Optical clocks—based on interrogation of ultra-narrow optical transitions in ions or neutral atoms—have surpassed traditional microwave clocks in both relative frequency stability and accuracy [1, 2, 3, 4]. They enable new experiments for geodesy [5, 2], fundamental physics [6, 7], and quantum many-body physics [8], in addition to a prospective redefinition of the SI second [9]. In parallel, single-atom detection and control techniques have propelled quantum simulation and computing applications based on trapped atomic arrays; in particular, ion traps [10], optical lattices [11], and optical tweezers [12, 13]. Integrating such techniques into an optical clock would provide atom-by-atom error evaluation, feedback, and thermometry [14]; facilitate quantum metrology applications, such as quantum-enhanced clocks [15, 16] and clock networks [17]; and enable novel quantum computation, simulation, and communication architectures that require optical clock state control combined with single atom trapping [18, 19, 20]. As for current optical clock platforms, ion clocks already incorporate single-particle detection and control [21], but they typically operate with only a single ion [22]. Conversely, optical lattice clocks (OLCs) [1, 2, 4] interrogate thousands of atoms to improve short-term stability, but single-atom detection remains an outstanding challenge. An ideal clock system, in this context, would thus merge the benefits of ion and lattice clocks; namely, a large array of isolated atoms that can be read out and controlled individually.

In this example, as a major advance in this direction, we present an atomic array optical clock with single-atom resolved readout of ≈40 individually trapped neutral atoms. We make use of a magic wavelength 81-site tweezer array stochastically filled with single strontium-88 ($^{88}$Sr) atoms [23] that are simultaneously probed on their individual optical clock transitions for frequency stabilization [24, 25]. With single-atom and single-site resolution, we define an error signal from an arbitrary subset of tweezers which we use to measure site-resolved frequency shifts and systematic errors. Further, atom-by-atom feedback control and statistical analysis enables us to isolate atom number dependent contributions to clock stability. We find a fractional instability in the low $10^{-15}$ regime at one-second integration time through self-comparison, limited by the frequency noise of our portable local oscillator and comparable to OLCs using similar laser systems [26].

This new approach also results in suppressed interaction shifts and short dead time—features important for accuracy [1] and stability [27, 28, 4], respectively. The larger interatomic spacing strongly reduces dipolar [29] and hopping-induced [30] interactions as compared to three-dimensional (3d) OLCs [25, 28], which, similarly to tweezers, provide immunity to on-site collisions [31]. This essential lack of interaction effects enables detailed modeling with a newly developed ab initio Monte Carlo (MC) simulation [32], which directly incorporates laser noise, projective readout, finite temperature, and feedback dynamics, resulting in higher predictive power compared to traditionally used analytical methods [1]. Finally, repetitive interrogation [23], similar to that used in ion experiments, provides a short dead time of ≈100 ms between clock interrogation blocks (considerably shorter than in 3d OLCs). We also note the recent, complementary results of Ref [33] that show seconds-long coherence in a tweezer array filled with ≈4 $^{88}$Sr atoms.

The basic functional principle is as follows. We generate a tweezer array with linear polarization and 2.5 μm site-to-site spacing in an ultra-high vacuum glass cell using an acousto-optic deflector (AOD) and a high-resolution imaging system (FIG. 15A) [23]. The tweezer array wavelength is tuned to a magic trapping configuration close to 813.4 nm, as described below. We load the array from a cold atomic cloud and subsequently induce light-assisted collisions to eliminate higher trap occupancies [34, 23]. As a result, ≈40 of the tweezers are stochastically filled with a single atom. We use the narrow-line Sisyphus cooling scheme [23] to cool the atoms to an average transverse motional occupation number of 0.66, measured with clock sideband spectroscopy [32]. The atoms are then interrogated twice on the clock transition, once below (A) and once above (B) resonance, to obtain an error signal quantifying the frequency offset from the resonance center (FIGS. 1B, C). We use this error signal to feedback to a frequency shifter in order to stabilize the frequency of the interrogation laser—acting as a local oscillator—to the atomic clock transition. Since our imaging scheme has a survival fraction of >0.998 [23], we perform multiple feedback cycles before reloading the array, each composed of a series of cooling, interrogation, and readout blocks (FIG. 15D).

For state-resolved readout with single-shot, single-atom resolution, we use a detection scheme composed of two high-resolution images for each of the A and B interrogation blocks (FIG. 15E) [23]. A first image determines if a tweezer is occupied, followed by clock interrogation. A second image, after interrogation, determines if the atom has remained in the ground state $|g\rangle$. This yields an instance of an error signal for all tweezers that are occupied at the beginning of both interrogation blocks, while unoccupied tweezers are discounted. For occupied tweezers, we record the $|g\rangle$ occupation numbers $s_{A,j}=\{0,1\}$ and $s_{B,j}=\{0,1\}$ in the images after interrogation with A and B, respectively, where j is the tweezer index. The difference $e_j=s_{A,j}-s_{B,j}$ defines a single-tweezer error variable taking on three possible values $e_j=\{-1,0,+1\}$ indicating interrogation below, on, or above resonance, respectively. Note that the average of $e_1$ over many interrogations, $\langle e_j \rangle$, is simply an estimator for the difference in transition probability between blocks A and B.

For feedback to the clock laser, $e_j$ is averaged over all occupied sites in a single AB interrogation cycle, yielding an array-averaged error $$\bar{e} = \frac{1}{N_A}\sum_j e_j,$$

where the sum runs over all occupied tweezers and $N_A$ is the number of present atoms. We add $\bar{e}$ times a multiplicative factor to the frequency shifter, with the magnitude of this factor optimized to minimize in-loop noise.

We begin by describing results for in-loop detection sequences. Here, feedback is applied to the clock laser (as described before) and probe blocks, for which the interrogation frequency is varied, are added after each feedback cycle. Using a single probe block with an interrogation time of 110 ms (corresponding to a π-pulse on resonance) shows a nearly Fourier-limited line-shape with full-width at half-maximum of ≈7 Hz (FIG. 1B). We also use these parameters for the feedback interrogation blocks, with the A and B interrogation frequencies spaced by a total of 7.6 Hz. Using the same in-loop detection sequence, we can also directly reveal the shape of the error signal by using two subsequent probe blocks spaced by this frequency difference and scanning a common frequency offset (FIG. 15C). The experimental results are in agreement with MC simulations, which have systematic error denoted as a shaded area throughout, stemming from uncertainty in the noise properties of the interrogation laser [32].

Importantly, these data also exist on the level of individual tweezers, both in terms of averages and statistical fluctuations. As a first example, we show a tweezer-resolved measurement of the repetition-averaged error signal $\langle e_j \rangle$ for all 81 traps (FIG. 16A) as a function of frequency offset. Fitting the zero-crossings of $\langle e_j \rangle$ enables us to detect differences in resonance frequency with sub-Hz resolution (FIG. 16B). The results show a small gradient across the array due to the use of an AOD: tweezers are spaced by 500 kHz in optical frequency, resulting in an approximately linear variation of the clock transition frequency. This effect could be avoided by using a spatial light modulator for tweezer array generation [35]. We note that the total frequency variation is smaller than the width of our interrogation signal. Such "sub-bandwidth" gradients can still lead to noise through stochastic occupation of sites with slightly different frequencies; in our case, we predict an effect at the $10^{-17}$ level. We propose a method to eliminate this type of noise in future clock iterations with a local feedback correction factor in Ref [32].

Before moving on, we note that $e_j$ is a random variable with a ternary probability distribution (FIG. 2C) defined for each tweezer. The results in FIG. 16A are the mean of this distribution as a function of frequency offset. In addition to such averages, having a fully site-resolved signal enables valuable statistical analysis. As an example, we extract the variance of $\bar{e}$, $\sigma_{\bar{e}}^2$, for an in-loop probe sequence where the probe blocks are centered around resonance. Varying the number of atoms taken into account (via post-selection) shows a $1/N_A$ scaling with a pre-factor dominated by quantum projection noise (QPN) [1] on top of an offset stemming mainly from laser noise (FIG. 2D). A more detailed analysis reveals that, for our atom number, the relative noise contribution from QPN to $\sigma_{\bar{e}}$ is only ≈26% [32]. A similar conclusion can be drawn on a qualitative level by evaluating correlations between tweezer resolved errors from odd and even sites, which show a strong common mode contribution indicative of sizable laser noise (FIG. 16E).

We now turn to an interleaved self-comparison [36, 37], which we use for stability evaluation and systematic studies. The self-comparison consists of having two feedback loops running in parallel, where feedback is given in an alternating fashion to update two independent AOM frequencies $f_1$ and $f_2$ (FIG. 17A). This is used for a lock-in type evaluation of clock frequency changes with varying parameters. As a specific example, we operate the clock with our usual interrogation trap depth $U_1$ during blocks for feedback to $f_1$ and with a different trap depth $U_2$ during blocks for feedback to $f_2$. The average frequency difference $f_2-f_1$ now reveals a shift of the clock operation frequency dependent on $U_2$ (FIG. 17B). For optimal clock operation, we find an "operationally magic" condition that minimizes sensitivity to trap depth fluctuations [38, 39, 40] by performing two-lock comparisons for different wavelengths (FIG. 17B) [32]. We note that this condition exists only on a tweezer-average level.

In this context, an important question is how such lock-in techniques can be extended to reveal site-resolved systematic errors as a function of a changing external parameter. To this end we combine the tweezer resolved error signal $\langle e_j \rangle$ with interleaved self-comparison (FIG. 17C). Converting $\langle e_j \rangle$ to frequencies (using measured error functions, such as in FIG. 16A) yields frequency estimators $\delta f_{1,j}$ and $\delta f_{2,j}$ for each tweezer during $f_1$ and $f_2$ feedback blocks, respectively. These estimators correspond to the relative resonance frequency of each tweezer with respect to the center frequency of the individual locks. Plotting the quantity $\delta f_{2,j}-\delta f_{1,j}+f_2-f_1$ then shows the absolute frequency change of each tweezer as a function of trap depth (FIG. 17C).

We use the same self-comparison sequence to evaluate the fractional clock instability by operating both locks with identical conditions (FIG. 18A). This approach follows previous clock studies, where true comparison to a second, fully independent clock system was not available [36, 37]. We plot the Allan deviation $\sigma_y$ [41] of $y=(f_2-f_1)/(v_0\sqrt{2})$ in FIG. 4A, where $v_0$ is the clock transition frequency and the $\sqrt{2}$ factor is introduced to take into account the addition of noise from two identical sources. The results show a $1/\sqrt{\tau}$ behavior after a lock onset time, where $\tau$ is the averaging time in seconds. Fitting this behavior yields $\sigma_y=2.5\times10^{-15}/\sqrt{\tau}$, in excellent agreement with MC simulations (FIG. 4A).

We further use our simulations to predict $(1.9-2.2) \times 10^{-15}/\sqrt{\tau}$ for single clock operation [32].

Self-comparison evaluates how fast averaging can be performed for systematic studies—such as the one shown in FIG. 17—and reveals the impact of various noise sources on short-term stability; however, by design, this technique suppresses slow drifts that are common to the $f_1$ and $f_2$ interrogation blocks. We performed a separate stability analysis by locking $f_1$ to the left half of the array and $f_2$ to the right half of the array [28], a method which is sensitive to slow drifts of gradients, and found no long-term drift of gradients to within our sensitivity [32].

Generically, clock stability improves with increasing atom number as $1/\sqrt{N_A}$ through a reduction in readout-noise as long as atoms are uncorrelated. However, in the presence of laser noise—which is common mode to all atoms—a limit to stability exists even for an infinite number of atoms [1]. Intriguingly, we can directly extract such contributions by performing a series of self-comparisons where we adjust the atom number one-by-one (FIG. 17B). To this end, we restrict the feedback operation to a subset of atoms in the center of the array with desired size, ignoring the remainder. We are able to achieve stable locking conditions for $N_A \geq 3$ with typical feedback parameters. We evaluate the Allan variance at one second as a function of $N_A$ and fit the results with a function $\sigma_y^2 = \sigma_\infty^2 + \sigma_{N_A}^2$, where $\sigma_{N_A}$ scales as $1/\sqrt{N_A}$. We find $\sigma_{N_A} = 6.7 \times 10^{-15}/\sqrt{N_A \tau}$ and $\sigma_\infty = 2.3 \times 10^{-15}$, the latter being an estimator for the limit of our clock set by laser noise, in agreement with MC simulation.

Our results essentially merge single-particle readout and control techniques for neutral atom arrays with optical clocks based on ultra-narrow spectroscopy. Such atomic array optical clocks (AOCs) could approach the sub-$10^{-16}/\sqrt{\tau}$ level stability of OLCs [28, 27, 4] by increasing interrogation time and atom number. Reaching several hundreds of atoms is realistic with an upgrade to two-dimensional arrays, while Ref [33] already demonstrated seconds-long interrogation. A further increase in atom number is possible by using a secondary array for readout, created with a non-magic wavelength for which higher power lasers exist [42, 34]. We also envision a system where tweezers are used to "implant" atoms, in a structured fashion, into an optical lattice for interrogation and are subsequently used to provide confinement for single-atom readout. Further, the lower dead time of AOCs should help to reduce laser noise contributions to clock stability compared to 3d OLCs [28], and even zero dead time operation [27, 28] in a single machine is conceivable by adding local interrogation.

Concerning systematics, AOCs provide fully site-resolved evaluation combined with an essential mitigation of interaction shifts, while being ready-made for implementing local thermometry using Rydberg states [14] in order to more precisely determine black-body induced shifts [1]. In addition, AOCs offer an advanced toolset for generation and detection of entanglement to reach beyond standard quantum limit operation—either through cavities [16] or Rydberg excitation [15]—and for implementing quantum clock networks [17]. Further, the demonstrated techniques provide a pathway for quantum computing and communication with neutral alkaline-earth-like atoms [18, 8, 20]. Finally, features of atomic array clocks, such as experimental simplicity, short dead time, and three dimensional confinement, make these systems attractive candidates for robust portable clock systems and space-based missions.

Example: Supplementary Materials for Example Atomic Array Optical Clock with Single-Atom Readout 1. Experimental Details 1.1 Experimental System Our strontium apparatus is described in detail in Refs. [23, 34]. Strontium-88 atoms from an atomic beam oven are slowed and cooled to a few microkelvin temperature by a 3d magneto-optical trap operating first on the broad dipole-allowed $^1S_0 \leftrightarrow ^1P_1$ transition at 461 nm and then on the narrow spin-forbidden $^1S_0 \leftrightarrow ^3P_1$ transition at 689 nm. Strontium atoms are filled into a 1 d array of 81 optical tweezers at $\lambda_T = 813.4$ nm, which is the magic wavelength for the doubly-forbidden $^1S_0 \leftrightarrow ^3P_0$ optical clock transition. The tweezers have Gaussian waist radii of 800(50) nm and an array spacing of 2.5 μm. During filling, cooling, and imaging (state detection), the trap depth is 2447(306)$E_r$. Here $E_r$ is the tweezer photon recoil energy, given by $E_r = h^2/(2 m \lambda_T^2)$, where h is Planck's constant and m is the mass of $^{88}$Sr. The tweezer depth is determined from the measured waist and the radial trapping frequency found from sideband measurements on the clock transition (discussed in more detail in Sec. 1.7). After parity projection, each tweezer has a 0.5 probability of containing a single atom, or otherwise being empty. Thus, the total number of atoms $N_A$ after each filling cycle of the experiment follows a binomial distribution with mean number of atoms $\bar{N}_A = 40.5$.

1.2 Example Clock Laser System

The clock laser in this example is based on a modified portable clock laser system (Stable Laser Systems) composed of an external cavity diode laser (Moglabs) stabilized to an isolated, high-finesse optical cavity using the Pound-Drever-Hall scheme and electronic feedback to the laser diode current and piezoelectric transducer. The optical cavity is a 50 mm cubic cavity [43] made of ultra-low expansion glass maintained at the zero-crossing temperature of 40.53° C. with mirror substrates made of fused silica with a finesse of F>300,000 at 698 nm. The clock laser light passes through a first AOM in double-pass configuration, injects an anti-reflection coated laser diode (Sacher Lasertechnik GmbH, SAL-0705-020), passes through a second AOM, and goes through a 10 m long fiber to the main experiment with a maximum output optical power of 20 mW. The first AOM is used for shifting and stabilizing the frequency of the clock laser, whereas the second AOM is used for intensity-noise and fiber-noise cancellation. The clock laser light has a Gaussian waist radius of 600 μm along the tweezer array. This large width is chosen to minimize gradients in clock intensity across the array arising from slight beam angle misalignments.

1.3 Example Bosonic Clock Transition

Optical excitation of the $^1S_0 \leftrightarrow ^3P_0$ clock transmission in a bosonic alkaline-earth-like atom is facilitated by applying a bias magnetic field B [24]. This field creates a small admixture of $^3P_1$ into $^3P_0$, and results in a Rabi frequency of $\Omega_R/2\pi = \alpha\sqrt{I}|B|$, where I is the intensity of the clock probe beam and a is the coupling constant. For $^{88}$Sr, $\alpha = 198$ Hz/T(mW/cm$^2$)$^{1/2}$ [24]. The probe beam induces an AC Stark shift $\Delta\nu_P = kI$, where $k = -18$ mHz/(mW/cm$^2$) for $^{88}$Sr [24]. The magnetic field gives rise to a second-order Zeeman shift $\Delta V_B = \beta B^2$, where $\beta = -23.3$ MHz/T$^2$ for $^{88}$Sr [24]. We choose B=0.9 mT, for which $\Delta V_B \approx -19$ Hz, and we choose I≈2000 mW/cm$^2$, for which $\Delta v_P \approx -36$ Hz.

1.4 Example Interrogation Sequence

We confirm the presence of atoms in each tweezer using fluorescence imaging for 30 ms on the 461 nm transition while cooling on the 689 nm transition and repumping atoms out of the metastable $^3P_{0,2}$ states. This imaging procedure initializes the atoms in the $^1S_0$ electronic ground state |g⟩. We then further cool the atoms for 10 ms using attractive Sisyphus cooling [23] on the 689 nm transition and adiabatically ramp down to a trap depth of 245(31)$E_r$ for 4 ms. We apply a weak bias magnetic field of B=0.9 mT along the transverse direction of the tweezer array to enable direct optical excitation of the doubly-forbidden clock transition at 698 nm [24, 44]. After interrogating the clock transition for 110 ms (FIG. 18), we adiabatically ramp the trap depth back up to 2447(306)$E_r$ to detect the population of atoms in |g⟩ using fluorescence imaging for 30 ms without repumping on the $^3P_0 \leftrightarrow ^3S_1$ transition. This interrogation sequence is repeated a number of times before the array is refilled with atoms.

1.5 Example Clock State Detection Fidelity

Based on the approach demonstrated in Ref [23], we analyze the fidelity of detecting atoms in the $^1S_0$ (|g⟩) and $^3P_0$ (|e⟩) states under these imaging conditions. We diagnose our state-detection fidelity with two consecutive images. In the first image, we detect atoms in |g⟩ by turning off the $^3P_0 \leftrightarrow ^3S_1$ repump laser such that atoms in |e⟩ in principle remain in |e⟩ and do not scatter photons [23]. Hence, if we find a signal in the first image, we identify the state as |g⟩. In the second image, we turn the $^3P_0 \leftrightarrow ^3S_1$ repump laser back on to detect atoms in both |g⟩ and |e⟩. Thus, if an atom is not detected in the first image but appears in the second image we can identify it as |e⟩. If neither of the images shows a signal we identify the state as "no-atom".

The inaccuracy of this scheme is dominated by off-resonant scattering of the tweezer light when atoms are shelved in |e⟩ during the first image. By pumping atoms into |e⟩ before imaging, we observe that they decay back to |g⟩ with a time constant of $\tau_p$=370(4) ms at our imaging trap depth of 2447(306)$E_r$. This leads to events in the first image where |e⟩ atoms are misidentified as |g⟩ atoms. Additionally, atoms in |g⟩ can be misidentified as |e⟩ if they are pumped to |e⟩ in the first image. We measure this misidentification probability by initializing atoms in |g⟩ and counting how often we identify them as |e⟩. Using this method, we place a lower bound for the probability of correctly identifying |e⟩ as $f_e \equiv e^{-t/\tau^p}=0.922(1)$ and we directly measure the probability of correctly identifying |g⟩ as $f_g$=0.977 (2). These values are shown in FIG. 1B as dashed lines.

1.6 Example Stabilization to the Atomic Signal

The clock laser is actively stabilized to the atomic signal using a digital control system. The frequency deviation of the clock laser from the atomic transition is estimated from a two-point measurement of the Rabi spectroscopy signal at $\delta_0/2\pi=\pm3.8$ Hz for an interrogation time of 110 ms, which corresponds to an experimentally measured lineshape with a full-width at half-maximum of 7 Hz. $\bar{e}$ is converted into a frequency correction by multiplying it by a factor of $\kappa$=3 Hz. We choose $\kappa$ to be the largest value possible before the variance of the error signal in an in-loop probe sequence begins to grow. Feedback is performed by adding the frequency correction to the frequency of the RF synthesizer (Moglabs ARF421) driving the first AOM along the clock beam path.

1.7 Example Sideband Thermometry on the Clock Transition

We perform sideband thermometry on the clock transition (FIG. 19) using the same beam used to interrogate the atoms for clock operation. Using a standard technique of taking the ratio of the integrated area under the first red and blue sidebands [45], we obtain 0.66 along the direction of the interrogation beam, oriented along one of the tight radial axes of our tweezers. From the sideband separation, we measure a trap frequency of $\omega \approx 2\pi \times 24.5$ kHz. These values are measured after cooling on the narrow $^1S_0 \leftrightarrow ^3P_1$ transition for 10 ms [23] in a trap of depth 2447(306)$E_r$ and adiabatically ramping down to our clock interrogation depth of 245(31)$E_r$.

We note that the clock transition is sufficiently narrow to observe sub-kHz inhomogeneities of trap frequencies between tweezers. This precision afforded by the clock transition allows for detailed knowledge about inhomogeneities in the array, and we envision using it for fine corrections and uniformization of an array in the future. However, for the purpose of thermometry, we broaden the clock line to a degree that these inhomogeneities are unresolved on an array-averaged level so we may obtain a spectrum that can be easily fit and integrated. Specifically, we use a much higher magnetic field of ≈75 mT to obtain a carrier Rabi frequency≈360 Hz at the same optical intensity.

1.8 Example Evaluation of Allan Deviations

Repeated interrogation introduces a bimodal distribution in the time between feedback events due to the periodic refilling of the array. To account for this variation, we approximate that all feedbacks are equally spaced in time with $\Delta t \approx 835$ ms. This introduces a slight error $\Delta \tau \approx 100$ ms for all r, though this error is inconsequential for fitting the long time Allan deviation behavior. We fit all Allan deviations from $\tau$=10 s to $\tau$=100 s, using $\sigma_y = A/\sqrt{\tau}$, with free parameter $A = \sigma_y (\tau = 1 \text{ s})$.

1.9 Example Statistical Properties of the Error Signal

1.9.A Example Probability Distribution Function

In the absence of additional noise and given $N_A$ atoms, the probability of finding $N_g$ atoms in the ground state after a single clock interrogation block is given by the binomial distribution $P_B(N_g; N_A, p)$, where p is the probability of detecting an atom in its ground state following clock interrogation. The probability of measuring a given error signal $\bar{e} = \Delta N_g / N_A$ is thus given by the probability of measuring the difference atom number $\Delta N_g = N_g^A - N_g^B$, where $N_g^A$ ($N_g^B$) is the number of atoms detected in the ground state after the A (B) interrogation blocks. It can be shown that the probability distribution for $\Delta N_g$ is given by the convolution of two binomial distributions, $P_*(\Delta N_g; N_A, p_A, p_B) = \Sigma_N P_B(N; N_A, p_B) P_B(N - \Delta N_g; N_A, p_A)$. This discrete distribution has support on $\{-N_A, -N_A+1, \ldots, N_A\}$ with $2N_A+1$ non-zero values. Thus, the probability distribution for $\bar{e}$ is given by $P(\bar{e}; N_A, p_A, p_B) = P_*(\bar{e} N_A; N_A, p_A, p_B)$. In the absence of statistical correlation between the A and B interrogation blocks, this distribution has a mean $\mu_{\bar{e}}=(p_B-p_A)$ and a variance $\sigma_{\bar{e}}^2=(p_A(1-p_A)+p_B(1-p_B))/N_A$.

1.9.B Example Treatment of Additional Noise

In the presence of noise, such as laser noise or finite temperature, the excitation probability $P_A$ and $P_B$ fluctuates from repetition to repetition. These fluctuations can be accounted for by introducing a joint probability density function $\pi(p_A,p_B)$, so that $$P(\bar{e}; N_A) = \int dp_A dp_B \pi(p_A, p_B) P(\bar{e}; N_A, p_A, p_B) \quad (1)$$

$$= \langle P(\bar{e}; N_A, p_A, p_B) \rangle, \quad (2)$$

where $\mathcal{H} \cdot \rangle$ denotes statistical averaging over $\pi(p_A,p_B)$. Assuming the mean of $P(\bar{e}, N_A)$ to be zero, which is equivalent to $\mathcal{H} p_A \rangle = \mathcal{H} p_B \rangle \equiv \mathcal{H} p \rangle$, and the variance of $p_A$ and $p_B$ to be equal, $\sigma_{p_A}^2 = \sigma_{p_B}^2 \equiv \sigma_p^2$, it can be shown that the variance of $P(\bar{e}, N_A)$ is given by $$\sigma_{\bar{e}}^2 = 2(\langle p \rangle(1-\langle p \rangle)-\sigma_p^2)/N_A + 2(\sigma_p^2 - C), \quad (3)$$

where C is a correlation function between $p_A$ and $p_B$ defined as $C = \langle p_A p_B \rangle - \langle p_A \rangle \langle p_B \rangle$.

1.9.C Example Further Experimental Data

We can directly extract the correlation function C through the results of images (2) and (4) for valid tweezers (FIG. 1E). We explicitly confirm that C is independent of the number of atoms used per AB interrogation cycle and extract C=−0.025. The anti-correlation is an indication of laser noise. Note that, in contrast to C, $\sigma_p^2$ is not directly experimentally accessible as it is masked by QPN. The fit to the variance of the error signal (FIG. 2D) yields $\sigma_{\bar{e}}^2 = 0.379/N_A + 0.169$. We can thus use the fitted offset of 0.169 combined with the knowledge of C to extract $\sigma_p^2 = 0.059$. We can alternatively use the fitted coefficient of the $1/N_A$ term of 0.379 with the measured $\langle p \rangle = 0.41$ to extract $\sigma_p^2 = 0.052$. To determine the contribution from QPN versus other noise sources in the standard deviation of the error signal, we take $\sigma_{\bar{e},QPN} = \sqrt{2\langle p \rangle(1-\langle p \rangle)/N_A}/\sigma_{\bar{e}}$, which for $N_A = 40.5$ yields $\sigma_{\bar{e},QPN} = 0.26$, as quoted in the main text.

2. Example Exploitation of Single-Site Resolved Signals

Example 2.1 Atom Number Dependent Stability

To study the performance of our clock as a function of atom number, we can choose to use only part of our full array for clock operation (FIG. 4B). We preferentially choose atoms near the center of the array to minimize errors due to gradients in the array e.g. from the AOD. Due to the stochastic nature of array filling, we generally use different tweezers during each filling cycle such as to always compute a signal from a fixed number of atoms. For high target atom numbers, this sometimes results in not enough atoms in the array, leading to a small error bar in the number of atoms.

Example 2.2. Clock Comparison Between Two Halves of the Array

We use the ability to lock to a subset of occupied traps to perform stability analysis that is sensitive to slow drifts of gradients across the array (such as from external fields or spatial variations in trap homogeneity). In this case, we lock $f_1$ to traps 1-40 and lock $f_2$ to traps 42-81, such that noise sources which vary across the array will show a divergence in the Allan deviation at long enough times. As shown in FIG. 20, we perform this analysis for times approaching $\tau=10^4$ s and down to the $\sigma_y=1\times10^{-16}$ level, and observe no violation of the $\sigma_y \propto 1/\sqrt{\tau}$ behavior. Thus, we conclude that such temporal variations in gradients are not a resolvable systematic for our current experiment. However, this analysis will prove useful when using an upgraded system for which stability at the $\sigma_y=10^{-17}$ level or lower becomes problematic. In principle, the lock could be done on a single trap position at a time, which would allow trap-by-trap systematics to be analyzed.

3. Example In Situ Error Correction

Single-site resolution offers the opportunity both to analyze single-atom signals, as discussed in the main text, and to modify such signals before using them for feedback. As an example, the AOD introduces a spatial gradient in trap frequencies across the array, leading to a spatial variation in zero-crossings of the error signal (as shown in FIG. 2B) and subsequently leading to an increase in the Allan deviation at the $\sigma_y \approx 10^{-17}$ level due to stochastic trap loading. While this effect is not currently significant in our experiment, it and other array inhomogeneities may be visible to future experiments with increased stability.

Therefore, we propose that this problem can be corrected (for inhomogeneities within the probe bandwidth) by adjusting the error signal $e_j$ of each tweezer by a correction factor before calculating the array-averaged $\bar{e}$ that will produce feedback for the local oscillator. For instance, consider the modification $$\bar{e}_f = \frac{1}{N_A} \sum_j \zeta_j e_j - f_{0,j},$$

where $\bar{e}_f$ is the tweezer-averaged error in Hz, $\zeta_j$ is a tweezer-resolved conversion factor such as could be obtained from FIG. 2A, and $f_{0,j}$ is the tweezer-resolved zero-crossing of the error signal. This new formulation mitigates inhomogeneity without any physical change to the array. While physically enforcing array uniformity is ideal, this is a tool which can simplify the complexity of correcting experimental systematics.

4. Example Monte Carlo Simulation

4.1 Example Operation

We compare the performance of our clock to Monte Carlo (MC) simulations. The simulations include the effects of laser frequency noise, dead time during loading and between interrogations, quantum projection noise, finite temperature, stochastic filling of tweezers, and experimental imperfections such as state-detection infidelity and atom loss.

Rabi interrogation is simulated by time evolving an initial state $|g\rangle$ with the time-dependent Hamiltonian $$\hat{H}(t) = \frac{\hbar}{2}(\Omega \sigma_x + (\delta(t) \pm \delta_o)\sigma_z),$$

where $\Omega$ is the Rabi frequency, $\delta_0$ is an interrogation offset, and (t) is the instantaneous frequency noise defined such that $$\delta(t) = \frac{d\phi(t)}{dt},$$

where $\phi(t)$ is me optical phase in the rotating frame. The frequency noise $\delta(t)$ for each Rabi interrogation is sampled from a pre-generated noise trace (Sec. 4.2, 4.3) with a discrete timestep of 10 ms. Dead time between interrogations and between array refilling is simulated by sampling from time-separated intervals of this noise trace. Stochastic filling is implemented by sampling the number of atoms $N_A$ from a binomial distribution on each filling cycle, and atom loss is implemented by probabilistically reducing $N_A$ between interrogations.

To simulate finite temperature, a motional quantum number n is assigned to each of the $N_A$ atoms before each interrogation, where n is sampled from a 1d thermal distribution using our experimentally measured $\tilde{n}\approx 0.66$ (Sec. 1.7). Here, n represents the motional quantum number along the axis of the interrogating clock beam. For each of the unique values of n that were sampled, a separate Hamiltonian evolution is carried out with a modified Rabi frequency given by $$\Omega_n = \Omega e^{-\frac{\eta^2}{2}} L_n(\eta^2), \quad [46]$$

where $$\eta = \frac{2\pi}{\lambda_{clock}}\sqrt{\frac{\hbar}{2m\omega}}$$

is the Lamb-Dicke parameter, $L_n$ is the n-th order Laguerre polynomial, and $\Omega$ is the bare Rabi frequency valid in the limit of infinitely tight confinement.

At the end of each interrogation, excitation probabilities $p_e(n)=|\mathcal{H}\,e|\psi_n\rangle|^2$ are computed from the final states for each n. State-detection infidelity is simulated by defining adjusted excitation probabilities $\tilde{p}_e(n) \equiv f_e p_e(n)+(1-f_g)(1-p_e(n))$, where $f_g$ and $f_e$ are the ground and excited state detection fidelities (Sec. 1.5), respectively. To simulate readout of the j-th atom on the i-th interrogation, a Bernoulli trial with probability $\tilde{p}_e(n_j)$ is performed, producing a binary readout value $s_{j,i}$. An error signal $$\bar{e} = \frac{1}{N_A}\sum_j (s_{j,i-1} - s_{j,i})$$

is produced every two interrogation cycles by alternating the sign of $\delta_0$ on alternating interrogation cycles. This error signal produces a control signal (using the same gain factor as used in experiment) which is summed with the generated noise trace for the next interrogation cycle, closing the feedback loop.

4.2 Example Frequency Noise Model

The power spectral density of the frequency noise of our clock laser is modeled by the sum of contributions from random walk frequency modulation (RWFM) noise ($f^{-2}$), flicker frequency modulation (FFM) noise ($f^{-1}$), and white frequency modulation (WFM) noise ($f^0$), such that $S_\nu(f) = \alpha f^{-2}+\beta f^{-1}+\gamma f^0$. We obtain these parameters through an estimation of the thermal noise of our reference cavity and a fit of a partially specified frequency noise power spectral density obtained via beating our laser with a reference laser (FIG. 21). Due to remaining large uncertainty in the white noise floor of our laser, we define a worst- and best-case noise model. The range between these models is the dominant source of uncertainty in our Monte Carlo simulations.

FFM noise results from thermal mechanical fluctuations of the reference cavity [48, 49]. By estimating the noise contribution from the ultra-low expansion spacer, fused silica mirrors, and their reflective coating, we estimate a fractional frequency instability of $\sigma_y=1.6\times 10^{-15}$ at 1 s, which corresponds to a frequency noise power spectral density of $\beta f^{-1}=0.34$ Hz$^2$/Hz at f=1 Hz.

As a worst case noise model, we assume a cross-over frequency from FFM to WFM noise at 1 Hz (FIG. 21), such that $\gamma=\beta f^{-1}=0.34$ Hz$^2$/Hz, and we estimate a frequency noise power spectral density of $\alpha f^{-2}=0.05$ Hz$^2$/Hz at 1 Hz for RWFM noise. As a best case noise model, assuming no cross-over from FFM to WFM noise (such that $\gamma=0.00$ Hz$^2$/Hz) we estimate a frequency noise power spectral density for RWFM noise of $\alpha f^{-2}=0.08$ Hz$^2$/Hz at f=1 Hz.

5 Example Tweezer-Induced Light Shifts

Several previous studies have analyzed the polarizability and hyperpolarizability of alkaline-earth-like atoms, including $^{88}$Sr, in magic wavelength optical lattices [38, 39, 40, 53]. In their analyses, these studies include the effect of finite atom temperature by Taylor expanding the lattice potential in powers of $\sqrt{I}$ (I is the lattice intensity) in the vicinity of the magic wavelength [53]. We repeat this derivation for an optical tweezer instead of an optical lattice.

The Gaussian tweezer intensity (assumed to have azimuthal symmetry) is given by $I(\rho, z)=I_0(w_0/w(z))^2 e^{-2\rho^2/w(z)^2}$, where $w_0$ is the beam waist, $I_0=2P_0/\pi w_0^2$ is the maximum intensity, $P_0$ is the beam power, $w(z)=w_0\sqrt{1+(z/z_R)^2}$, and $Z_R=\pi w_0^2/\lambda_T$ is the Rayleigh range. The trapping potential is determined from this intensity $I(\rho, z)$ by the electric dipole polarizability $\alpha^{E1}$, the electric quadrupole and magnetic dipole polarizabilities $\alpha^{qm}=\alpha^{E2}+\alpha^{M1}$, and the hyperpolarizability effect $\beta I^2$.

By considering a harmonic approximation in the x- and y-directions as well as harmonic and anharmonic terms in the z-direction, we arrive at the following expression for the differential light shift of the clock transition in an optical tweezer, where $\rho=\sqrt{x^2+y^2}$ and $n_\rho(=n_x+n_y)$ and $n_z$ are vibrational quantum number along the radial and axial directions, respectively:

$$h\nu_{LS} = -\left[\left(\frac{\partial}{\partial \nu}\tilde{\alpha}^{E1}\right)\delta_L + \left(\frac{w_0}{z_R}\right)^2\left(n_\rho+\frac{1}{2}\right)^2\tilde{\beta} + \right. \quad (4)$$

$$\sqrt{2}\left(\frac{w_0}{z_R}\right)^3\left(n_z+\frac{1}{2}\right)\left(n_\rho+\frac{1}{2}\right)\tilde{\beta} + \frac{3}{8}\left(\frac{w_0}{z_R}\right)^4\left(n_z^2+n_z+\frac{1}{2}\right)\tilde{\beta}\bigg]u +$$

$$\left[2\sqrt{2}\left(\frac{w_0}{z_R}\right)\left(n_\rho+\frac{1}{2}\right)+\left(\frac{w_0}{z_R}\right)^2\left(n_z+\frac{1}{2}\right)\right]\times$$

$$\left[\left(\frac{\partial}{\partial \nu}\tilde{\alpha}^{E1}\right)\delta_L + \tilde{\alpha}^{qm}\right]u^{1/2} +$$

$$\left[2\sqrt{2}\left(\frac{w_0}{z_R}\right)\left(n_\rho+\frac{1}{2}\right)+\left(\frac{w_0}{z_R}\right)^2\left(n_z+\frac{1}{2}\right)\right]\tilde{\beta}u^{3/2} - \tilde{\beta}u^2,$$

where $\tilde{\alpha}^{E1} = \Delta\alpha^{E1}(E_R/\alpha^{E1})$, $\Delta\alpha^{E1} = \alpha_e^{E1} - \alpha_g^{E1}$ is the differential E1 polarizability; $\tilde{\alpha}^{qm} = \Delta\alpha^{qm}(E_R/\alpha^{E1})$, where $\Delta\alpha^{qm}$ is the differential E2 and M1 polarizability; $\tilde{\beta} = \Delta\beta(E_R/\alpha^{E1})^2$, where $\Delta\beta$ is the differential hyperpolarizability; $u = I/(E_R/\alpha^{E1})$ is the tweezer depth.

We use this formula to predict the light shifts studied in the main text (FIG. 3). As we find the results to be mostly insensitive to temperature for low temperatures, we assume zero temperature for simplicity. We allow a single fit parameter, which is an overall frequency shift due to uncertainty in the optical frequency of the trapping light. The other factors are taken from previous studies, as summarized in Table S1.

Light shifts of a $^{88}$Sr clock. The fits and predictions based on Eq. 3 use the following values from previous studies.

| Quantity | Symbol | Unit | Value | Reference |
|---|---|---|---|---|
| Magic trapping frequency | $\nu_T$ | MHz | 368554732(11) | [39] |
| Hyperpolarizability difference | $\frac{1}{h}\tilde{\beta}$ | μHz | 0.45(10) | [50] |
| Slope of $\tilde{\alpha}^{E1}$ | $\frac{1}{h}\frac{\partial \tilde{\alpha}^{E1}}{\partial \nu}$ | | $19.3 \times 10^{-12}$ | [39] |
| Electric dipole polarizability | $\tilde{\alpha}^{E1}$ | kHz/(kW/cm$^2$) | 46.5976(13) | [51] |
| Differential electric quadrupole and magnetic dipole polarizabilities | $\frac{1}{h}\tilde{\alpha}^{qm}$ | mHz | 0.0(3) | [52] |

REFERENCES FOR PART B (ATOMIC CLOCK)

The following references are incorporated by reference herein.
[1] A. D. Ludlow, M. M. Boyd, J. Ye, E. Peik, and P. O. Schmidt, Reviews of Modern Physics 87, 637 (2015).
[2] W. F. McGrew et al., Nature 564, 87 (2018).
[3] S. M. Brewer et al., Physical Review Letters 123, 033201 (2019).
[4] E. Oelker et al., Nature Photonics (2019).
[5] J. Grotti et al., Nature Physics 14, 437 (2018).
[6] S. Blatt et al., Physical Review Letters 100, 140801 (2008).
[7] T. Pruttivarasin et al., Nature 517, 592 (2015).
[8] F. Scazza et al., Nature Physics 10, 779 (2014).
[9] W. F. McGrew et al., Optica 6, 448 (2019).
[10] K. Kim et al., Nature 465, 590 (2010).
[11] C. Gross and I. Bloch, Science 357, 995 (2017).
[12] H. Bernien et al., Nature 551, 579 (2017).
[13] V. Lienhard et al., Physical Review X 8, 021070 (2018).
[14] V. D. Ovsiannikov, A. Derevianko, and K. Gibble, Physical Review Letters 107, 093003 (2011).
[15] L. I. R. Gil, R. Mukherjee, E. M. Bridge, M. P. A. Jones, and T. Pohl, Physical Review Letters 112, 103601 (2014).
[16] B. Braverman et al., Physical Review Letters 122, 223203 (2019).
[17] R. Kaubruegger et al., arXiv:1908.08343 (2019).
[18] B. Koczor, S. Endo, T. Jones, Y. Matsuzaki, and S. C. Benjamin, arXiv:1908.08904 (2019).
[19] P. Komar et al., Nature Physics 10, 582 (2014).
[20] A. J. Daley, M. M. Boyd, J. Ye, and P. Zoller, Physical Review Letters 101, 170504 (2008).
[21] G. Pagano, F. Scazza, and M. Foss-Feig, Advanced Quantum Technologies 2, 1800067 (2019).
[22] J. P. Covey et al., Physical Review Applied 11, 034044 (2019).
[23] N. Huntemann et al., Physical Review Letters 108, 090801 (2012).
[24] T. R. Tan et al., Physical Review Letters 123, 063201 (2019).
[25] J. P. Covey, I. S. Madjarov, A. Cooper, and M. Endres, Physical Review Letters 122, 173201 (2019).
[26] A. Taichenachev et al., Physical Review Letters 96, 083001 (2006).
[27] T. Akatsuka, M. Takamoto, and H. Katori, Physical Review A 81, 023402 (2010).
[28] S. B. Koller et al., Physical Review Letters 118, 073601 (2017).
[29] M. A. Norcia et al., arXiv:1904.10934 (2019).
[30] G. J. Dick, Proceedings of the 19th Annual Precise Time and Time Interval Systems and Applications, 133 (1987).
[31] M. D. Swallows et al., Science 331, 1043 (2011).
[32] S. L. Campbell et al., Science 358, 90 (2017).
[33] D. E. Chang, J. Ye, and M. D. Lukin, Physical Review A 69, 023810 (2004).
[34] R. B. Hutson et al., arXiv:1903.02498 (2019).
[35] A. Cooper et al., Physical Review X 8, 041055 (2018).
[36] F. Nogrette et al., Physical Review X 4, 021034 (2014).
[37] T. Nicholson et al., Nature Communications 6, 6896 (2015).
[38] A. Al-Masoudi, S. D orscher, S. H afner, U. Sterr, and C. Lisdat, Physical Review A 92, 063814 (2015).
[39] R. C. Brown et al., Physical Review Letters 119, 253001 (2017).
[40] S. Origlia et al., Physical Review A 98, 053443 (2018).
[41] N. Nemitz, A. A. Jrgensen, R. Yanagimoto, F. Bregolin, and H. Katori, Physical Review A 99, 033424 (2019).
[42] F. Riehle, Frequency Standards (Wiley, 2003).
[43] M. Schioppo et al., Nature Photonics 11, 48 (2017).
[44] M. A. Norcia, A. W. Young, and A. M. Kaufman, Physical Review X 8, 041054 (2018).
[45] M. A. Norcia, arXiv:1908.11442 (2019).
[46] S. Webster and P. Gill, Optics Letters 36, 3572 (2011).
[47] Z. Barber et al., Physical Review Letters 96, 083002 (2006).
[48] C. Han et al., Scientific Reports 8, 7927 (2018).
[49] D. J. Wineland and W. M. Itano, Physical Review A 20, 1521 (1979).
[50] S. de Leseleuc, D. Barredo, V. Lienhard, A. Browaeys, and T. Lahaye, Physical Review A 97, 053803 (2018).
[51] K. Numata, A. Kemery, and J. Camp, Physical Review Letters 93, 250602 (2004).
[52] Y. Y. Jiang et al., Nature Photonics 5, 158 (2011).

[53] H. Katori, V. D. Ovsiannikov, S. I. Marmo, and V. G. Palchikov, Physical Review A 91, 052503 (2015).
[54] T. Middelmann, S. Falke, C. Lisdat, and U. Sterr, Physical Review Letters 109, 263004 (2012).
[55] R. Le Targat et al., Nature Communications 4, 2109 (2013).
[56] P. G. Westergaard et al., Physical Review Letters 106, 210801 (2011)/

Process Steps

Method of Trapping Atoms

FIG. 22 is a flowchart illustrating a method of trapping atoms. The method comprises the following steps.

Block 2200 represents trapping one or more atoms individually, each of the atoms trapped in a different trapping potential or trap.

Block 2202 represents imaging the one or more atoms individually. In one or more examples, the imaging reads out occupancy of each of the atoms in the ground state without destroying (depopulating) a clock state (because the cooling does not affect the clock state (1-3 transition detuned from 1-4).

Block 2204 represents cooling the atoms, wherein each of the atoms are cooled to prevent loss (of each of the atoms from their respective trap) caused by the imaging. In one or more examples, the cooling counteracts a plurality of heating mechanisms.

1. In one example, the method of trapping atoms, comprises individually trapping one or more atoms, each of the atoms trapped in a different trapping potential or trap; individually imaging each of the atoms; and individually cooling each of the atoms, wherein each of the atoms are cooled to prevent loss (of each of the atoms from their respective trap) caused by the imaging.

2. In one embodiment of example 1, the cooling counteracts a plurality of heating mechanisms.

3. In another embodiment of examples 1 or 2, imaging reads out occupancy of the atoms in a ground state without destroying (or depopulating) a clock state because the cooling does not affect the clock state.

Method of Making an Apparatus, e.g., for Trapping, Detecting, and/or Controlling an State of One or More Atoms.

Figure 23:
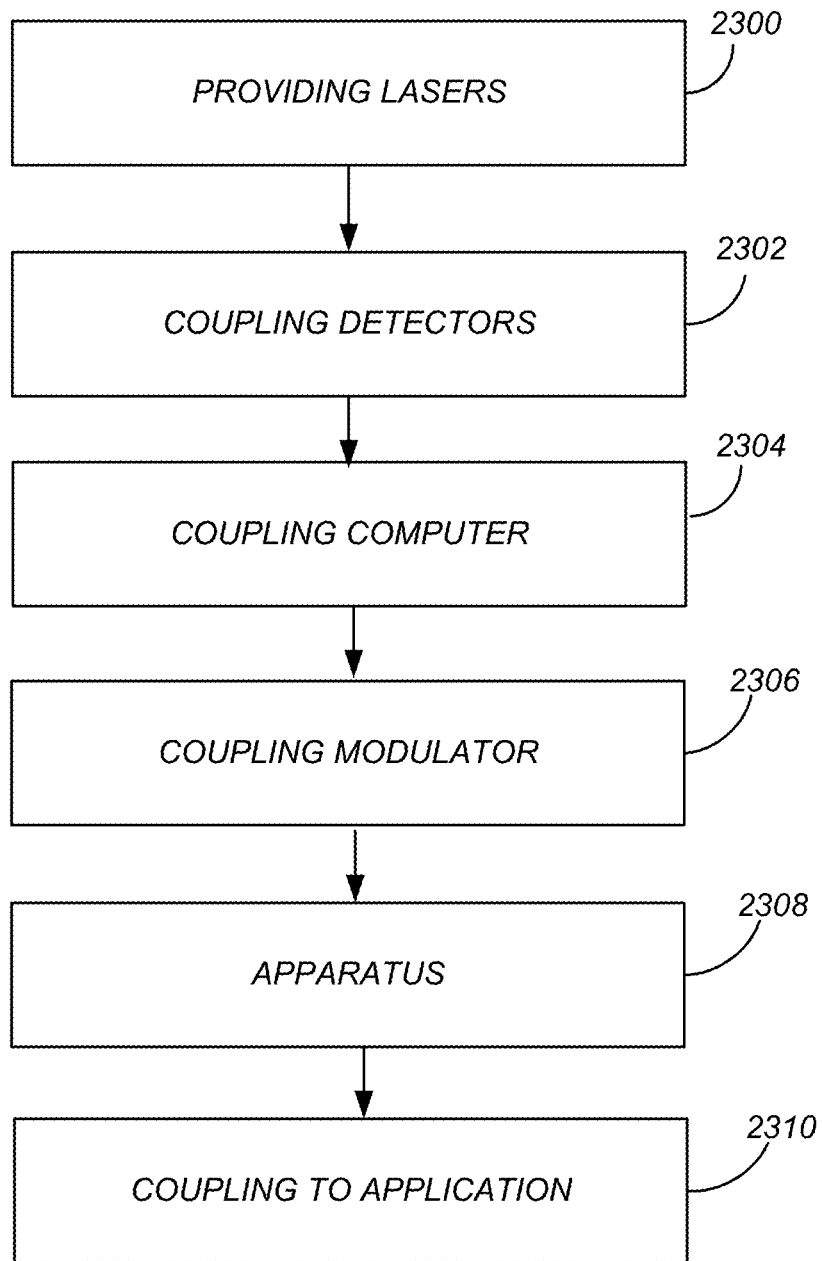

FIG. 23 is a flowchart illustrating a method for making an apparatus.

Block 2300 represents providing one or more lasers.

The one or more lasers emitting one or more first laser beams generating one or more trapping potentials, each of the trapping potentials trapping a single one of the atoms having a first energy level, a second energy level, and a third energy level, and optionally a fourth energy level.

The one or more lasers emit one or more second laser beams irradiating the one or more atoms so as to generate fluorescence from each of the atoms, wherein the second laser beams have a frequency and a polarization tuned to excite a first (e.g., optical) transition between the first energy level and the second energy level so that the fluorescence comprises spontaneous emission from the second energy level back to the first energy level.

The one or more lasers emit one or more third laser beams irradiating the one or more atoms so as to cool each of the atoms.

Block 2302 represents operatively connecting (e.g., electromagnetically coupling or connecting) one or more detectors receiving the fluorescence so as to generate an image of each of the atoms from the fluorescence.

Block 2304 represents optionally operatively coupling a computer to the detector and/or the one or more lasers.

Block 2306 represents optionally coupling a modulator to the one or more lasers and/or the computer.

Block 2308 represents the end result, an apparatus. In one or more examples, the laser beams comprise electromagnetic radiation having a variety of wavelengths. In one or more examples, an atomic clock comprises the apparatus.

Block 2310 represents optionally coupling the apparatus to an application.

Examples include, but are not limited to, the following:

1. An apparatus for trapping, imaging, and cooling one or more atoms, comprising:

one or more lasers emitting one or more first laser beams, one or more second laser beams, and one or more third laser beams;

one or more atoms, wherein:

the one or more first laser beams generate one or more traps each comprising a trapping potential, each of the trapping potentials trapping a single one of the atoms, and each of the atoms have three energy levels including:

a first energy level;

a second energy level having an energy higher than the first energy level; and a third energy level;

the one or more second laser beams irradiate the one or more atoms so as to generate fluorescence from each of the atoms, and the one or more second laser beams have a frequency and a polarization tuned to excite a first transition between the first energy level and the second energy level so that the fluorescence comprises spontaneous emission from the second energy level back to the first energy level;

the one or more third laser beams irradiate the one or more atoms so as to cool each of the atoms; and a detector receiving the fluorescence so as to generate an image of each of the atoms from the fluorescence.

2. The apparatus of example 1, comprising:

a first objective focusing the first laser beams at one or more foci so as to generate each of the trapping potentials at each of the foci.

3. The apparatus of example 1, wherein:

the atoms comprise alkaline earth atoms or alkaline earth like atoms, in a ground state, the atoms each comprise two valence electrons in the first energy level comprising an s shell, forming a spin singlet state, in a first excited state, the atoms each comprise 1 valence electron in the first energy level comprising an s shell and 1 valence electron in the second energy level comprising a p shell, forming a spin singlet state, and in a second excited state, the atoms each comprise 1 valence electron in the first energy level comprising an s shell and 1 valence electron in the third energy level comprising a p shell, forming one of three spin triplet states.

4. The apparatus of example 1, wherein the one or more third laser beams have a wavelength tuned to induce a second transition between the first energy level and the third energy level, so as to laser cool the atoms by transferring the atoms into a lower energy motional state.

5. The apparatus of example 4, wherein the laser cooling comprises Sisyphus cooling or resolved sideband cooling.

6. The apparatus of claim 4, wherein:

the one or more third laser beams do not provide a magic trapping condition associated with the second transition, so that the trapping potential experienced by the atom in a ground state (wherein electrons are in the first energy level) is different from the trapping potential experienced by the atom in an excited state wherein at least one of the electrons is transferred to the third energy level, and the atom is cooled using Sisyphus cooling.

7. The apparatus of example 6, wherein:

the trapping potential for the atom in the ground state is higher than the trapping potential for the atom in the excited state, the one or more third laser beams are blue detuned and have a frequency greater than a transition frequency for exciting the second transition of the atom in free space (non-trapped atom), and the cooling is repulsive Sisyphus cooling.

8. The apparatus of example 6, wherein:

the trapping potential for the atom in the ground state (electrons in the first level) is lower than the trapping potential for the atom in the excited state wherein one of the electrons is in the third level, the one or more third laser beams are red detuned and have a frequency less than a transition frequency for exciting the second transition of the atom in free space (non-trapped atom), and the cooling is attractive Sisyphus cooling.

9. The apparatus of example 4, wherein:

(1) the one or more third laser beams are tuned to provide a magic trapping condition associated with the second transition, so that the trapping potential experienced by the atom in the ground state (wherein electrons are in the first level) is the same as the trapping potential experienced by the atom in the excited state wherein at least one of the electrons is transferred to the third energy level, (2) the atoms further include a first set of motional energy levels indexed with an integer n for an electron in the first energy level and a second set of motional energy levels indexed with an integer m for an electron in the third energy level, the third laser beam exciting the atom from the nth state in the first energy level to the $m^{th}=(n-1)^{th}$ state in the third energy level, so that the atom decays by emitting spontaneous emission from the $m^{th}$ state to $(n-1)^{th}$ state in the first energy level, (3) the step (2) is repeated (the third laser beam irradiating the atom) until the atom is in the $n=0^{th}$ motional state in the first energy level.

10. The apparatus of example 1, further comprising an array of the first laser beams forming tweezers and/or array of the third laser beams (cooling beams) and/or array of the second laser beams (imaging beams), each of the tweezers trapping one of the atoms, each of the cooling beams cooling one of the atoms, and each of the imaging beams imaging one of the atoms.

11. The apparatus of example 1, wherein the third laser beams include:

a laser beam propagating perpendicular to the first laser beam so as to cool the atom in a radial direction, and a fifth laser beam propagating parallel to the first laser beam so as to cool the atom in a longitudinal direction.

12. The apparatus of example 1, wherein:

each of the atoms have a fourth energy level higher than the first energy level and lower than the third energy level;

the one or more first laser beams are tuned to have a wavelength that is magic for the first energy level and the fourth energy level but not for the third energy level, and the cooling using the one or more third laser beams is Sisyphus cooling.

13. The apparatus of example 12, wherein the fourth energy level is a clock state and transitions from the first energy level to the fourth energy level are used to create qubits in a quantum computing configuration, and the image obtained using the fluorescence is used to read out a state of the qubit and determine occupancy of each of the traps.

14. The apparatus of any of the preceding examples, wherein:

each of the atoms have a fifth energy level higher than the first energy level and lower than the second energy level; wherein an electron transfers to the fifth energy level after a transition from the first energy level to the second energy level; and the first laser beam has a frequency such that the atom comprising an electron in the fifth energy level experiences the trapping potential so that the atom can transfer the electron to the third energy level experiencing an anti trapping potential wherein the atom will transfer out of the trap or the trapping potential.

15. The apparatus of example 1, wherein the one or more second laser beams repeatedly image the one or more atoms showing that each of the atoms remain in their respective trapping potentials after at least 2000 imaging steps.

16. The apparatus of any of the preceding examples, wherein the one or more second laser beams and the one or more third laser beams perform the imaging and cooling simultaneously or alternately, and the cooling ensures that atoms are not lost from the optical trap by the imaging process.

20. An apparatus, comprising:

one or more lasers emitting one or more first laser beams, one or more second laser beams, one or more third laser beams, and one or more fourth laser beams;

a plurality of atoms, wherein:

the one or more first laser beams generate an array of electromagnetic traps each including a trapping potential, each of the trapping potentials trapping a single one of the atoms, and each of the atoms have levels including:

a first energy level;

a second energy level having an energy higher than the first energy level;

a third energy level;

a fourth energy level having an energy higher than the first energy level and an energy lower than the third energy level; and the one or more second laser beams irradiate the atoms so as to generate fluorescence, and the one or more second laser beams having have a frequency and a polarization tuned to excite a first transition between the first energy level and the second energy level so that the fluorescence comprises spontaneous emission from the second energy level back to the first energy level;

the one or more third laser beams irradiate the atoms so as to cool each of the atoms;

the one or more fourth laser beams (clock laser beams) are tuned to excite a clock transition between the first energy level and the fourth energy level;

a detector detecting the presence or absence of the fluorescence so as to generate a signal representing a presence or absence of each of the atoms in the ground state (electrons in first level) or in a clock state (at least one of the electrons in the fourth level), the detector imaging each of the atoms individually;

the detector detecting the signals at plurality of times:

(5) after the atoms are prepared in the ground state, so that absence of the fluorescence indicates the atom does not occupy the trap (first signal);

(6) after excitation from the first energy level to the second energy level using the one or more fourth laser beams red detuned from the clock transition, so that presence of the fluorescence indicates the atom is in an excited state wherein at least one of the electrons is in the first energy level (second signal);

(7) after the atoms are prepared in the ground state after step (2), so that absence of the fluorescence indicates the atom does not occupy its respective trap (third signal);

(8) after excitation from the first level to the second level using the one or more fourth laser beams blue detuned from the clock transition, so that presence of the fluorescence indicates the atom is in the excited state wherein at least one of the electrons is in the first energy level (fourth signal); and a computer/processor generating an error signal using the signals, comprising:

determining which of the traps are occupied; and for each of the occupied traps:

determining a first occupation number of the atom in the excited state wherein an electron is in the first energy level after excitation with the one or more fourth laser beams having the red detuning, and determining a second occupation number of the atom in the excited state wherein an electron is in the first level after excitation with the one or more fourth laser beams having the blue detuning, determining an error signal for each of the traps comprising a difference between the first occupation number and the second occupation number in each of the traps;

converting the error signals to one or more error corrected frequencies; and one or more modulators modulating the one or more fourth laser beams with the error corrected frequencies so as to excite the clock transition between the first energy level and the fourth energy level using the one or more fourth laser beams having the one or more error corrected frequencies.

21. The apparatus of example 20, wherein the computer averages the error signals temporally and/or over each of the traps to obtain an average error signal used to generate the error corrected frequency comprising an average frequency.

22. An apparatus, comprising:

one or more lasers emitting one or more first laser beams, one or more second laser beams, one or more third laser beams, and one or more fourth laser beams;

a plurality of atoms, wherein:

the one or more first laser beams generate an array of traps each including a trapping potential, each of the trapping potentials trapping a single one of the atoms, and each of the atoms have levels including:

a first energy level;

a second energy level having an energy higher than the first energy level;

a third energy level;

a fourth energy level higher than the first energy level and lower than the third energy level; and the one or more second laser beams irradiate the atoms so as to generate fluorescence, and the second laser beam have a frequency and a polarization tuned to excite a first transition between the first energy level and the second energy level so that the fluorescence comprises spontaneous emission from the second energy level back to the first energy level that images with single atom resolution so as to identify one of the atoms in each trap, and the one or more third laser beams irradiate the atoms so as to cool each of the atoms; and the one or more fourth laser beams (clock laser beams) are tuned to excite a clock transition between the first energy level and the fourth energy level;

a detector detecting the presence or absence of the fluorescence so as to generate a signal representing a presence or absence of each of the atoms in the ground state (wherein electrons are in the first energy level) or in a clock state (wherein one of the electrons is in the fourth energy level), the detectors imaging each atom individually;

the detector detecting the signals at plurality of times:

(1) after the atoms are prepared in the ground state, so that absence of the fluorescence indicates the atom does not occupy the trap (first signal);

(2) after excitation from the first energy level to the second energy level using the one or more fourth laser beams red detuned from the clock transition, so that presence of the fluorescence indicates the atom is in an excited state wherein at least one of the electrons is in the first energy level (second signal);

(3) after the atoms are prepared in the ground state after step (2), so that absence of the fluorescence indicates the atom does not occupy its respective trap (third signal);

(4) after excitation from the first level to the second level using the one or more fourth laser beams blue detuned from the clock transition, so that presence of the fluorescence indicates the atom is in the excited state wherein one of the electrons is in the first energy level (fourth signal); and a computer/processor generating an error signal using the signals, comprising:

determining which of the traps are occupied; and for each of the occupied traps:

assigning a first error if the signal after the irradiation with the one or more fourth laser beams having the red detuning is higher than the signal after the irradiation with the one or more fourth laser beams having the blue detuning, indicating the frequency of the one or more fourth laser beams should be increased to resonantly excite the clock transition, assigning a second error if the signal after the irradiation with the one or more fourth laser beams having the red detuning is lower than the signal after the irradiation with the one or more fourth laser beams having the blue detuning, indicating the frequency of the one or more fourth laser beams should be decreased to resonantly excite the clock transition, assigning a zero error if the signals after the irradiation with the one or more fourth laser beams having the red detunings and the blue detunings are the same, indicating the frequency of the one or more fourth laser beams does not need to be corrected;

converting the error signals to one or more error corrected frequencies; and a modulator modulating the one or more fourth laser beams with the error corrected frequencies so as to resonantly excite the clock transition between the first energy level and the fourth energy level using the one or more fourth laser beams having the one or more error corrected frequencies.

23. The apparatus of examples 22, wherein an error signal is generated for each atom in its respective trap using imaging of each of the atoms, so that the frequency of the fourth laser beam exciting the clock transition is corrected for each atom.

24. The apparatus of example 23, further comprising generating an average error signal comprising an average of the error signals for each atom, so that the frequency of the fourth laser beam exciting the clock transition is generated from the average error signal.

25. A spatially resolved sensor comprising the apparatus of examples 22.

26. The apparatus of example 22, wherein the traps comprise tweezers or an optical lattice or a laser trap.

27. The apparatus of example 1, wherein the laser beams comprise electromagnetic radiation having a variety of wavelengths.

28. An atomic clock comprising the apparatus of example 1.

Method of Making an Apparatus According to a Second Embodiment

FIG. 24 illustrates a method of making an apparatus

Block 2400 represents obtaining an array of physical systems (e.g, but not limited to, one or more impurities in solid state, atoms, electrons, or superconductors) each having a two energy levels that can be coupled by coherent radiation.

Block 2402 represents operationally connecting an oscillator or source of coherent radiation so as to excite/couple the transitions (e.g., electrically, electromagnetically, or magnetically coupling/connecting an output of the oscillator to the transition). In one example, the output comprises laser radiation and the oscillator is a laser.

Block 2404 represents operationally connecting (electrically, electromagnetically, or magnetically coupling/connecting) a detector measuring the excitation probability of each physical system in the array (wherein the excitation probability determines how well the coherent radiation is exciting or driving the transitions or coupling the two energy levels). In one or more examples, the detector comprises a camera measuring absorption of laser radiation emitted from the laser.

Block 2406 represents coupling a computer to the detector. The computer converts the excitation probability to a detuning between a frequency of the coherent radiation and resonance frequency of the transition.

Block 2408 represents coupling a modulator to the oscillator or the source of coherent radiation, the modulator providing feedback comprising the detuning, to the coherent radiation, oscillator, or source of the electromagnetic radiation so that the frequency of the coherent radiation is tuned to the resonance frequency for each of the physical systems in the array, e.g., so that the oscillator is stabilized to transition.

Block 2410 represents the end result, an apparatus as illustrated in FIG. 25, comprising the array of physical systems (e.g., one or more impurities in solid state, atoms, electrons, superconductors) each having a two energy levels; the source of the coherent radiation (e.g., coherent electromagnetic radiation) exciting the transitions or coupling the two energy levels; the detector measuring the excitation probability of each physical system in the array; the computer converting the excitation probability to a detuning between a frequency of the coherent radiation and the resonance frequency of the transition; and the modulator providing the feedback comprising the detuning.

In one or more examples, a sensor comprises the apparatus (e.g., a gravity sensor).

Block 2412 represents a method of operating the apparatus, comprising varying an environment (e.g., a magnetic field environment, a polarization environment or field, a power, temperature) of the array of physical systems; and measuring the change in frequency of the coherent radiation (e.g., from a laser) so as to quantify the changing environment or the change in frequency against perturbation of the environment.

Method of Determining a Response of Trapped Atoms or a Physical System

FIG. 26 is a flowchart illustrating a computer implemented method. The method comprises the following steps.

Block 2600 represents numerically simulating the dynamics of a plurality of atoms whose evolution is described by the interaction between a laser field and the plurality atoms trapped in an array (trapped atoms), each of the atoms comprising at least two energy levels and wherein the interaction comprises a transition between the two energy levels excited by the laser field, comprising:

obtaining a noise spectrum of the laser field;

performing a numerical calculation of an error signal representing a detuning between a frequency of the laser field and a resonant frequency required to resonantly excite the transition, comprising solving Schrodinger's equation describing the trapped atoms interacting with the laser field; and calculating a response of the trapped atoms to the laser field as a function of time, wherein the response includes dynamics of the trapped atoms interacting with the laser field whose frequency is fluctuating in time.

Block 2602 represents using the response in an application (e.g., in a sensor application). In one example, the method comprises using the response to stabilize the frequency of coherent radiation (comprising the laser field) to the resonant frequency of the transition.

Examples of a computer implemented method include, but are not limited to, the following.

1. A computer implemented method, comprising:

numerically simulating the dynamics of a plurality of atoms whose evolution is described by the interaction between a laser field and the plurality atoms trapped in an array (trapped atoms), each of the atoms comprising at least two energy levels and wherein the interaction comprises a transition between the two energy levels excited by the laser field, comprising:

obtaining a noise spectrum of the laser field;

performing a numerical calculation of an error signal representing a detuning between a frequency of the laser field and a resonant frequency required to resonantly excite the transition, comprising solving Schrodinger's equation describing the trapped atoms interacting with the laser field; and calculating a response of the trapped atoms to the laser field as a function of time, wherein the response includes dynamics of the trapped atoms interacting with the laser field whose frequency is fluctuating in time.

2. The method of embodiment 1, further comprising using the response to stabilize the frequency of coherent radiation (comprising the laser field) to the resonant frequency of the transition.

Advantages and Improvements

Trapping and Imaging Embodiments

Embodiments of the present invention described herein comprise a novel system for imaging and cooling individual alkaline earth atoms trapped in optical tweezers. The inventive system has been demonstrated by imaging and cooling individual strontium atoms in one- and two-dimensional arrays of up to 121 tweezers. The system is useful for preparing ensembles of individual alkaline-earth atoms for a broad array of applications in quantum science and technology.

Embodiments of the present invention can be applied to the fields of quantum simulation, quantum metrology, and quantum computing with atoms, more specifically alkaline earth atoms. Alkaline earth atoms are used in the world's most precise clocks and might be used for quantum computing. Quantum computing is among the most important technologies currently being pursued. The purpose of quantum computing is to use quantum-mechanical objects such as atoms to process information with an improvement in performance over classical computers.

Embodiments of the systems described herein include a ultra-high vacuum system in which alkaline earth atoms are trapped, cooled, and imaged using a combination of multiple laser beams. Individual alkaline earth atoms are captured into multiple optical tweezers formed by focusing multiple laser beams through a microscope objective. Multiple laser beams are created by sending a single laser beam through a crystal that is modulated with a microwave field. Individual alkaline earth atoms are imaged by collecting light emitted by the atoms with a microscope objective and a sensitive camera. Individual alkaline earth atoms are cooled by using the mechanisms of Sisyphus cooling and resolved sideband cooling.

The improvements over existing methods include the imaging of single alkaline earth atoms, the precise determination of atomic parameters including magic wavelengths and branching ratios, the demonstration of a technique for tuning the trapping potential using elliptical polarization, the creation of two-dimensional arrays of tweezers, and the demonstration of two mechanisms for cooling atoms: Sisyphus cooling and resolved sideband cooling. We further demonstrate repetitive low-loss high-fidelity state-resolved detection of single atoms at a magic wavelength for the optical clock transition.

Embodiments described herein can be utilized to enable a quantum computer. The invention enables the first important step of preparing the state of a quantum system before manipulating its quantum state using quantum operations. Trapping alkaline earth atoms in arrays of tweezers enables preparing quantum systems with a large number of basic constituents (qubits) whose position can be varied in space and time. Imaging single atoms provide information about their position, which can be used to identify missing atoms and replace them with atoms from a reservoir. Cooling single atoms during imaging, using Sisyphus cooling, compensates for heating and prevent the loss of atoms, which enables taking multiple images of the quantum system without destroying it. Cooling single atoms after imaging, using resolved sideband cooling, reduces the temperature of the atoms, so that their movement is reduced during quantum operations, which can thus be implemented with greater accuracy. Tuning the trapping potential using elliptical polarization enables achieving magic trapping conditions, which are necessary for suppressing sources of inefficiency during quantum operations.

Quantum Metrology Applications

Optical clocks based on interrogation of ultra-narrow optical transitions in ions or neutral atoms have surpassed traditional microwave clocks in both relative frequency stability and accuracy. Ion clocks already incorporate single-particle detection and control, but they typically operate with only a single ion. Optical lattice clocks (OLCs) interrogate thousands of atoms to improve short-term stability, but single-atom detection remains an outstanding challenge.

Embodiments of the present invention establish a third optical clock platform, the atomic array optical clock (AOC), merging many of the benefits of ion and lattice clocks; namely, a large array of isolated atoms that can be read out and controlled individually. Exemplary platforms described herein combine a set of highly desirable features: essential lack of interaction shifts, short dead time, multi-atom operation with single-atom resolution, and relative experimental simplicity.

In particular, embodiments of the present invention apply single-atom trapping and readout of single atoms in tweezers arrays to the problem of ultra-narrow optical spectroscopy for stabilizing a local oscillator, e.g., stabilize a laser to the atomic transition of an ensemble of alkaline-earth atoms trapped in an array of optical tweezers. It merges ultra-high precision interrogation of clock state of neutral alkaline-earth-like atoms with techniques for the detection and control of individual atoms.

Besides describing the operation of an AOC, which employs single-atom readout in an array of variable size, embodiments of the present invention further describe a novel Monte Carlo computer simulation that fully incorporates feedback dynamics, readout noise, finite temperature, and laser noise, providing a more modern and predictive framework for clock modeling and analysis compared to previously used analytical methods.

Embodiments of the present invention will have a long-lasting impact in at least four separate directions: 1) Advancing stationary and portable optical clock systems by achieving the highest levels of stability and accuracy while maintaining robustness and experimental simplicity; 2) Providing a much more advanced platform for controlling and detecting metrological quantum-enhancement through entanglement; 3) Laying the experimental foundation for realizing a host of quantum computing, simulation, and networking proposals based on controlling individual alkaline-earth-like atoms; 4) Initiating widespread usage of the Monte Carlo modeling method developed here, not only for AOCs, but also for other clock platforms. Each of these advances have can be implemented in commercial products, e.g., portable optical clocks with quantum-enhanced performance for geodesy measurements, and benchmarked simulation packages for characterization and optimal control of optical clocks.

Processing Environment

FIG. 27 illustrates an exemplary system 2700 comprising a computer 2702 used to implement processing elements needed to perform computing and control functions described herein. Computer 2702 may be a user/client computer, server computer, or may be a database computer and may include peripherals.

The computer 2702 comprises a hardware processor 2704A and/or a special purpose (hardware) processor 2704B (hereinafter alternatively collectively referred to as processor) and a memory 2706, such as random access memory (RAM). Generally, the computer 2702 operates under control of an operating system 2708 stored in the memory 2706, and interfaces with the user/other computers to accept inputs and commands (e.g., analog or digital signals) and to present results through an input/output (I/O) module 2780 or devices. In one or more examples, I/O module comprises a display, graphics user interface (GUI), a keyboard, a printer 2728 and/or a pointing/cursor control device (e.g., mouse). Output/results may be presented on the display or provided to another device for presentation or further processing or action. An image may be provided through a GUI module 2718, for example. Although the GUI module 2718 is depicted as a separate module, the instructions performing the GUI functions can be resident or distributed in the operating system 2708, the computer program 2710, or implemented with special purpose memory and processors.

In one or more embodiments, computer 2702 may be coupled to, or may comprise, a portable device 2732 (e.g., cellular/mobile device, smartphone, or laptop, multi-touch, tablet device, or other internet enabled device) executing on various platforms and operating systems.

In one embodiment, the computer 2702 operates by the hardware processor 2704A performing instructions defined by the computer program 2712 under control of the operating system 2708. The computer program application 2712 accesses and manipulates data stored in the memory 2706 of the computer 2702. The computer program 2712 and/or the operating system 2708 may be stored in the memory 2706 and may interface with the user and/or other devices to accept input and commands and, based on such input and commands and the instructions defined by the computer program 2712 and operating system 2708, to provide output and results.

Some or all of the operations performed by the computer 2702 according to the computer program 2712 instructions may be implemented in a special purpose processor 2704B. In this embodiment, some or all of the computer program 2712 instructions may be implemented via firmware instructions stored in a read only memory (ROM), a programmable read only memory (PROM) or flash memory within the special purpose processor 2704B or in memory 2706. The special purpose processor 2704B may also be hardwired through circuit design to perform some or all of the operations to implement the present invention. Further, the special purpose processor 2704B may be a hybrid processor, which includes dedicated circuitry for performing a subset of functions, and other circuits for performing more general functions such as responding to computer program 2712 instructions. In one embodiment, the special purpose processor 2704B is an application specific integrated circuit (ASIC).

The computer 2702 may also implement a compiler 2714 that allows an application or computer program 2712 written in a programming language such as C, C++, Assembly, SQL, PYTHON, PROLOG, MATLAB, RUBY, RAILS, HASKELL, or other language to be translated into processor 2704 readable code. Alternatively, the compiler 2714 may be an interpreter that executes instructions/source code directly, translates source code into an intermediate representation that is executed, or that executes stored precompiled code. Such source code may be written in a variety of programming languages such as JAVA, JAVASCRIPT, PERL, BASIC, etc. After completion, the application or computer program 2712 accesses and manipulates data accepted from I/O devices and stored in the memory 2706 of the computer 2702 using the relationships and logic that were generated using the compiler 2714.

The computer 2702 also optionally comprises an external communication device such as a modem, satellite link, Ethernet card, or other device for accepting input from, and providing output to, other computers 2702.

In one embodiment, instructions implementing the operating system 2708, the computer program 2712, and the compiler 2714 are tangibly embodied in a non-transitory computer-readable medium, e.g., data storage device 2721, which could include one or more fixed or removable data storage devices, such as a zip drive, floppy disc drive, hard drive, CD-ROM drive, tape drive, etc. Further, the operating system 2708 and the computer program 2712 are comprised of computer program 2712 instructions which, when accessed, read and executed by the computer 2702, cause the computer 2702 to perform the steps necessary to implement and/or use the present invention or to load the program of instructions into a memory 2706, thus creating a special purpose data structure causing the computer 2702 to operate as a specially programmed computer executing the method steps described herein. Computer program 2712 and/or operating instructions may also be tangibly embodied in memory 2706 and/or data communications devices 2730, thereby making a computer program product or article of manufacture according to the invention. As such, the terms "article of manufacture," "program storage device," and "computer program product," as used herein, are intended to encompass a computer program accessible from any computer readable device or media. In one embodiment, the special purpose processor 2704B is an application specific integrated circuit (ASIC). Further examples include, but are not limited to, the computer 2702 coupled to, or comprising, a personal computer (e.g., desktop computer (e.g., HP Compaq™), portable or media viewing/listening device (e.g., cellular/mobile device/phone, laptop, tablet, personal digital assistant, etc.) or integrated circuit, chip, or field programmable gate array (FPGA). In yet another embodiment, the computer 2702 may comprise a multi-touch device, gaming system, or other internet enabled device executing on various platforms and operating systems. In one or more examples, computer 2702 or processor 2704B comprises a controller or control platform.

Those skilled in the art will recognize many modifications may be made to this configuration without departing from the scope of the present disclosure. For example, those skilled in the art will recognize that any combination of the above components, or any number of different components, peripherals, and other devices, may be used.

CONCLUSION

This concludes the description of the preferred embodiment of the present invention. The foregoing description of one or more embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. An apparatus for trapping, imaging, and cooling one or more atoms, comprising:
one or more lasers emitting one or more first laser beams, one or more second laser beams, and one or more third laser beams;
one or more atoms, wherein:
the one or more first laser beams generate one or more traps each comprising a trapping potential, each of the trapping potentials trapping a single one of the atoms, and
each of the atoms have three energy levels including:
a first energy level;
a second energy level having an energy higher than the first energy level; and
a third energy level;
the one or more second laser beams irradiate the one or more atoms so as to generate fluorescence from each of the atoms, and the one or more second laser beams have a frequency and a polarization tuned to excite a first transition between the first energy level and the second energy level so that the fluorescence comprises spontaneous emission from the second energy level back to the first energy level;
the one or more third laser beams irradiate the one or more atoms so as to cool each of the atoms; and a detector receiving the fluorescence so as to generate an image of each of the atoms from the fluorescence.

2. The apparatus of claim 1, comprising:
a first objective focusing the first laser beams at one or more foci so as to generate each of the trapping potentials at each of the foci.

3. The apparatus of claim 1, wherein:
the atoms comprise alkaline earth atoms or alkaline earth like atoms,
in a ground state, the atoms each comprise two valence electrons in the first energy level comprising an s shell, forming a spin singlet state,
in a first excited state, the atoms each comprise 1 valence electron in the first energy level comprising an s shell and 1 valence electron in the second energy level comprising a p shell, forming a spin singlet state, and
in a second excited state, the atoms each comprise 1 valence electron in the first energy level comprising an s shell and 1 valence electron in the third energy level comprising a p shell, forming one of three spin triplet states.

4. The apparatus of claim 1, wherein the one or more third laser beams have a wavelength tuned to induce a second transition between the first energy level and the third energy level, so as to laser cool the atoms by transferring the atoms into a lower energy motional state.

5. The apparatus of claim 4, wherein the laser cooling comprises Sisyphus cooling or resolved sideband cooling.

6. The apparatus of claim 4, wherein:
the one or more third laser beams do not provide a magic trapping condition associated with the second transition, so that the trapping potential experienced by the atom in a ground state (wherein electrons are in the first energy level) is different from the trapping potential experienced by the atom in an excited state wherein at least one of the electrons is transferred to the third energy level, and
the atom is cooled using Sisyphus cooling.

7. The apparatus of claim 6, wherein:
the trapping potential for the atom in the ground state is higher than the trapping potential for the atom in the excited state,
the one or more third laser beams are blue detuned and have a frequency greater than a transition frequency for exciting the second transition of the atom in free space (non-trapped atom), and
the cooling is repulsive Sisyphus cooling.

8. The apparatus of claim 6, wherein:
the trapping potential for the atom in the ground state (electrons in the first level) is lower than the trapping potential for the atom in the excited state wherein one of the electrons is in the third level,
the one or more third laser beams are red detuned and have a frequency less than a transition frequency for exciting the second transition of the atom in free space (non-trapped atom), and
the cooling is attractive Sisyphus cooling.

9. The apparatus of claim 4, wherein:
(1) the one or more third laser beams are tuned to provide a magic trapping condition associated with the second transition, so that the trapping potential experienced by the atom in the ground state (wherein electrons are in the first level) is the same as the trapping potential experienced by the atom in the excited state wherein at least one of the electrons is transferred to the third energy level, (2) the atoms further include a first set of motional energy levels indexed with an integer n for an electron in the first energy level and a second set of motional energy levels indexed with an integer m for an electron in the third energy level, the third laser beam exciting the atom from the nth state in the first energy level to the $m^{th}=(n-1)^{th}$ state in the third energy level, so that the atom decays by emitting spontaneous emission from the $m^{th}$ state to $(n-1)^{th}$ state in the first energy level, (3) the step (2) is repeated (the third laser beam irradiating the atom) until the atom is in the $n=0^{th}$ motional state in the first energy level.

10. The apparatus of claim 1, further comprising an array of the first laser beams forming tweezers and/or array of the third laser beams (cooling beams) and/or array of the second laser beams (imaging beams), each of the tweezers trapping one of the atoms, each of the cooling beams cooling one of the atoms, and each of the imaging beams imaging one of the atoms.

11. The apparatus of claim 1, wherein the third laser beams include:
a laser beam propagating perpendicular to the first laser beam so as to cool the atom in a radial direction, and
a fifth laser beam propagating parallel to the first laser beam so as to cool the atom in a longitudinal direction.

12. The apparatus of claim 1, wherein:
each of the atoms have a fourth energy level higher than the first energy level and lower than the third energy level;
the one or more first laser beams are tuned to have a wavelength that is magic for the first energy level and the fourth energy level but not for the third energy level, and
the cooling using the one or more third laser beams is Sisyphus cooling.

13. The apparatus of claim 12, wherein the fourth energy level is a clock state and transitions from the first energy level to the fourth energy level are used to create qubits in a quantum computing configuration, and
the image obtained using the fluorescence is used to read out a state of the qubit and determine occupancy of each of the traps.

14. The apparatus of claim 12, wherein:
each of the atoms have a fifth energy level higher than the first energy level and lower than the second energy level; wherein an electron transfers to the fifth energy level after a transition from the first energy level to the second energy level; and
the first laser beam has a frequency such that the atom comprising an electron in the fifth energy level experiences the trapping potential so that the atom can transfer the electron to the third energy level experiencing an anti trapping potential wherein the atom will transfer out of the trap or the trapping potential.

15. The apparatus of claim 1, wherein the one or more second laser beams repeatedly image the one or more atoms showing that each of the atoms remain in their respective trapping potentials after at least 2000 imaging steps.

16. The apparatus of claim 1, further comprising:
the one or more lasers emitting one or more fourth laser beams;
the one or more first laser beams generating an array of electromagnetic traps each including a trapping potential, each of the trapping potentials trapping a single one of the atoms, and each of the atoms have levels including a fourth energy level having an energy higher than the first energy level and an energy lower than the third energy level; and the one or more fourth laser beams (clock laser beams) tuned to excite a clock transition between the first energy level and the fourth energy level;

a detector detecting the presence or absence of the fluorescence so as to generate a signal representing a presence or absence of each of the atoms in the ground state (electrons in first level) or in a clock state (at least one of the electrons in the fourth level), the detector imaging each of the atoms individually;

the detector detecting the signals at plurality of times:

(1) after the atoms are prepared in the ground state, so that absence of the fluorescence indicates the atom does not occupy the trap (first signal);

(2) after excitation from the first energy level to the second energy level using the one or more fourth laser beams red detuned from the clock transition, so that presence of the fluorescence indicates the atom is in an excited state wherein at least one of the electrons is in the first energy level (second signal);

(3) after the atoms are prepared in the ground state after step (2), so that absence of the fluorescence indicates the atom does not occupy its respective trap (third signal);

(4) after excitation from the first level to the second level using the one or more fourth laser beams blue detuned from the clock transition, so that presence of the fluorescence indicates the atom is in the excited state wherein at least one of the electrons is in the first energy level (fourth signal); and a computer/processor generating an error signal using the signals, comprising:
  determining which of the traps are occupied; and
  for each of the occupied traps:
    determining a first occupation number of the atom in the excited state wherein an electron is in the first energy level after excitation with the one or more fourth laser beams having the red detuning, and
    determining a second occupation number of the atom in the excited state wherein an electron is in the first level after excitation with the one or more fourth laser beams having the blue detuning,
    determining an error signal for each of the traps comprising a difference between the first occupation number and the second occupation number in each of the traps;
    converting the error signals to one or more error corrected frequencies; and
one or more modulators modulating the one or more fourth laser beams with the error corrected frequencies so as to excite the clock transition between the first energy level and the fourth energy level using the one or more fourth laser beams having the one or more error corrected frequencies.

17. An apparatus, comprising:
one or more lasers emitting one or more first laser beams, one or more second laser beams, one or more third laser beams, and one or more fourth laser beams;
a plurality of atoms, wherein:
the one or more first laser beams generate an array of traps each including a trapping potential, each of the trapping potentials trapping a single one of the atoms, and each of the atoms have levels including:
a first energy level;
a second energy level having an energy higher than the first energy level;
a third energy level;
a fourth energy level higher than the first energy level and lower than the third energy level; and the one or more second laser beams irradiate the atoms so as to generate fluorescence, and the second laser beam have a frequency and a polarization tuned to excite a first transition between the first energy level and the second energy level so that the fluorescence comprises spontaneous emission from the second energy level back to the first energy level that images with single atom resolution so as to identify one of the atoms in each trap, and the one or more third laser beams irradiate the atoms so as to cool each of the atoms; and the one or more fourth laser beams (clock laser beams) are tuned to excite a clock transition between the first energy level and the fourth energy level;

a detector detecting the presence or absence of the fluorescence so as to generate a signal representing a presence or absence of each of the atoms in the ground state (wherein electrons are in the first energy level) or in a clock state (wherein one of the electrons is in the fourth energy level), the detectors imaging each atom individually;

the detector detecting the signals at plurality of times:

(1) after the atoms are prepared in the ground state, so that absence of the fluorescence indicates the atom does not occupy the trap (first signal);

(2) after excitation from the first energy level to the second energy level using the one or more fourth laser beams red detuned from the clock transition, so that presence of the fluorescence indicates the atom is in an excited state wherein at least one of the electrons is in the first energy level (second signal);

(3) after the atoms are prepared in the ground state after step (2), so that absence of the fluorescence indicates the atom does not occupy its respective trap (third signal);

(4) after excitation from the first level to the second level using the one or more fourth laser beams blue detuned from the clock transition, so that presence of the fluorescence indicates the atom is in the excited state wherein one of the electrons is in the first energy level (fourth signal); and a computer/processor generating an error signal using the signals, comprising:
  determining which of the traps are occupied; and
  for each of the occupied traps:
assigning a first error if the signal after the irradiation with the one or more fourth laser beams having the red detuning is higher than the signal after the irradiation with the one or more fourth laser beams having the blue detuning, indicating the frequency of the one or more fourth laser beams should be increased to resonantly excite the clock transition, assigning a second error if the signal after the irradiation with the one or more fourth laser beams having the red detuning is lower than the signal after the irradiation with the one or more fourth laser beams having the blue detuning, indicating the frequency of the one or more fourth laser beams should be decreased to resonantly excite the clock transition, assigning a zero error if the signals after the irradiation with the one or more fourth laser beams having the red detunings and the blue detunings are the same, indicating the frequency of the one or more fourth laser beams does not need to be corrected;

converting the error signals to one or more error corrected frequencies; and a modulator modulating the one or more fourth laser beams with the error corrected frequencies so as to resonantly excite the clock transition between the first energy level and the fourth energy level using the one or more fourth laser beams having the one or more error corrected frequencies.

18. The apparatus of claim 17, wherein:

the computer averages the error signals temporally and/or over each of the traps to obtain an average error signal used to generate the error corrected frequency comprising an average frequency, or one of the error signals is generated for each atom in its respective trap using imaging of each of the atoms, so that the frequency of the fourth laser beam exciting the clock transition is corrected for each atom, or an average error signal comprising an average of the error signals for each atom is generated, so that the frequency of the fourth laser beam exciting the clock transition is generated from the average error signal.

19. A method of trapping atoms, comprising:

(a) individually trapping one or more atoms, each of the atoms trapped in a different trapping potential or trap;

(b) individually imaging each of the atoms; and (c) individually cooling each of the atoms, wherein each of the atoms are cooled to prevent loss (of each of the atoms from their respective trap) caused by the imaging.

20. The method of claim 19, wherein:

the cooling counteracts a plurality of heating mechanisms, and the imaging reads out occupancy of the atoms in a ground state without destroying (or depopulating) a clock state because the cooling does not affect the clock state.

\* \* \* \* \*